United States Patent [19]

Crane, Jr. et al.

[11] Patent Number: 5,541,449
[45] Date of Patent: Jul. 30, 1996

[54] SEMICONDUCTOR CHIP CARRIER AFFORDING A HIGH-DENSITY EXTERNAL INTERFACE

[75] Inventors: Stanford W. Crane, Jr., Boca Raton; Maria M. Portuondo, Delray Beach, both of Fla.

[73] Assignee: The Panda Project, Boca Raton, Fla.

[21] Appl. No.: 208,691

[22] Filed: Mar. 11, 1994

[51] Int. Cl.⁶ .................. H01L 23/049; H01L 23/055; H01L 23/498; H01L 23/48
[52] U.S. Cl. .................. 257/697; 257/692; 257/773; 257/774; 439/65; 439/68; 439/278; 439/692
[58] Field of Search .................. 257/685, 686, 257/697, 774, 777, 778, 773; 174/52.4, 262; 439/65, 68, 74, 75, 76, 83, 278, 279, 692

[56] References Cited

U.S. PATENT DOCUMENTS

| | | | |
|---|---|---|---|
| 3,337,838 | 8/1967 | Damiano et al. | 339/217 |
| 3,366,915 | 1/1968 | Miller | 339/49 |
| 3,444,506 | 5/1969 | Wedekind | 339/99 |
| 3,848,221 | 11/1974 | Lee, Jr. | 339/74 R |
| 4,572,604 | 2/1986 | Ammon et al. | 339/176 MP |
| 4,616,406 | 10/1986 | Brown | 257/697 |
| 4,654,472 | 3/1987 | Goldfarb | 174/52 R |
| 4,655,526 | 4/1987 | Shaffer | 339/74 R |
| 4,698,663 | 10/1987 | Sugimoto et al. | 257/697 |
| 4,734,042 | 3/1988 | Martens et al. | 439/62 |
| 4,897,055 | 1/1990 | Jurista et al. | 439/924 |
| 4,943,846 | 7/1990 | Shirling | 257/697 |
| 4,959,750 | 9/1990 | Cnyrim et al. | 361/401 |
| 4,975,066 | 12/1990 | Sucheski et al. | 439/63 |
| 4,997,376 | 3/1991 | Buck et al. | 439/59 |
| 5,015,207 | 5/1991 | Koepke | 439/886 |
| 5,037,311 | 8/1991 | Frankeny et al. | 439/66 |

(List continued on next page.)

FOREIGN PATENT DOCUMENTS

| | | |
|---|---|---|
| 0321212A1 | 6/1989 | European Pat. Off. . |
| 0405454A2 | 1/1991 | European Pat. Off. . |
| 3737819A1 | 5/1988 | Germany . |
| 1129608 | 10/1968 | United Kingdom . |
| WO94/13034 | 6/1994 | WIPO . |
| WO94/27345 | 11/1994 | WIPO . |

OTHER PUBLICATIONS

AMP Product Guide, Printed Circuited Board Connectors 3, pp. 3008, 3067–3068, 3102–3103, 3122–3123.
George D. Gregoire, "3–Dimensional Circuitry Solves Fine Pitch SMT Device Assembly Problem," Connection Technology.
Dimensional Circuits Corporation, "Dimensional Circuits Corp. Awarded Two U.S. Patents." D.C.C. News, Apr. 5, 1994.

(List continued on next page.)

Primary Examiner—Rolf Hille
Assistant Examiner—David B. Hardy
Attorney, Agent, or Firm—Morgan, Lewis and Bockius LLP

[57] ABSTRACT

A semiconductor die carrier may include an insulative substrate; an array of groups of multiple electrically conductive contacts arranged in rows and columns on the insulative substrate, wherein the groups from adjacent rows are staggered as are the groups from adjacent columns, and a portion of each group overlaps into an adjacent row or an adjacent column of the groups of the array; a semiconductor die; and structure for providing electrical connection between the semiconductor die and the conductive contacts. A semiconductor die carrier may also include an insulative substrate; a plurality of leads each having an external portion extending out of the semiconductor die carrier from a lower surface of the insulative substrate and an internal portion located within the semiconductor die carrier at an upper surface of the insulative substrate; a semiconductor die; and a layer of conductive material in contact with conductive portions of the semiconductor die and also in contact with the internal portions of the leads.

26 Claims, 75 Drawing Sheets

U.S. PATENT DOCUMENTS

| | | | |
|---|---|---|---|
| 5,071,363 | 12/1991 | Reylek et al. | 439/291 |
| 5,081,563 | 1/1992 | Feng et al. | 361/414 |
| 5,117,069 | 5/1992 | Higgins, III | 174/261 |
| 5,123,164 | 6/1992 | Shaheen et al. | 29/852 |
| 5,137,456 | 8/1992 | Desai et al. | 439/66 |
| 5,281,151 | 1/1994 | Arima et al. | 439/68 |
| 5,309,024 | 5/1994 | Hirano | 257/697 |
| 5,326,936 | 7/1994 | Taniuchi et al. | 174/260 |
| 5,330,372 | 7/1994 | Pope et al. | 439/692 |
| 5,334,279 | 8/1994 | Gregoire | 156/630 |
| 5,342,999 | 8/1994 | Frei et al. | 174/266 |
| 5,351,393 | 10/1994 | Gregoire | 29/835 |
| 5,371,404 | 12/1994 | Juskey et al. | 257/778 |
| 5,376,825 | 12/1994 | Tukamoto et al. | 257/686 |
| 5,390,412 | 2/1995 | Gregoire | 29/848 |

OTHER PUBLICATIONS

George D. Gregoire, "Very Fine Line Recessed Circuitry—A New PCB Fabrication Process".

R. R. Tummala et al., "Microelectronics Packaging Handbook," Van Nostrand Reinhold, 1989, pp. 38–43, 398–403, 779–791, 853–859, and 900–905.

"Packaging," Intel Corporation, 1993, pp. 2–36, 2–96, 2–96, 2–100, 3–2, 3–24, and 3–25.

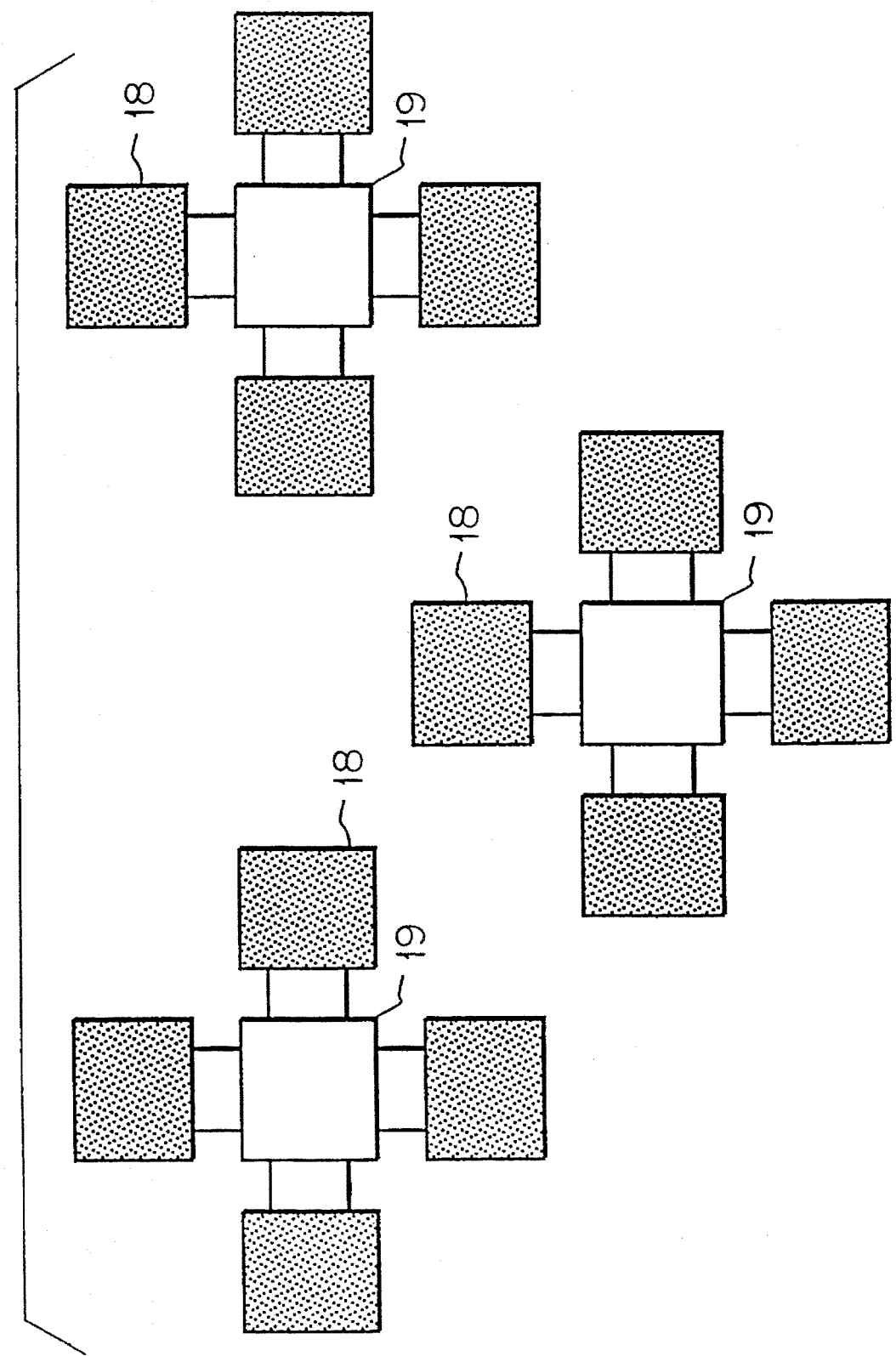

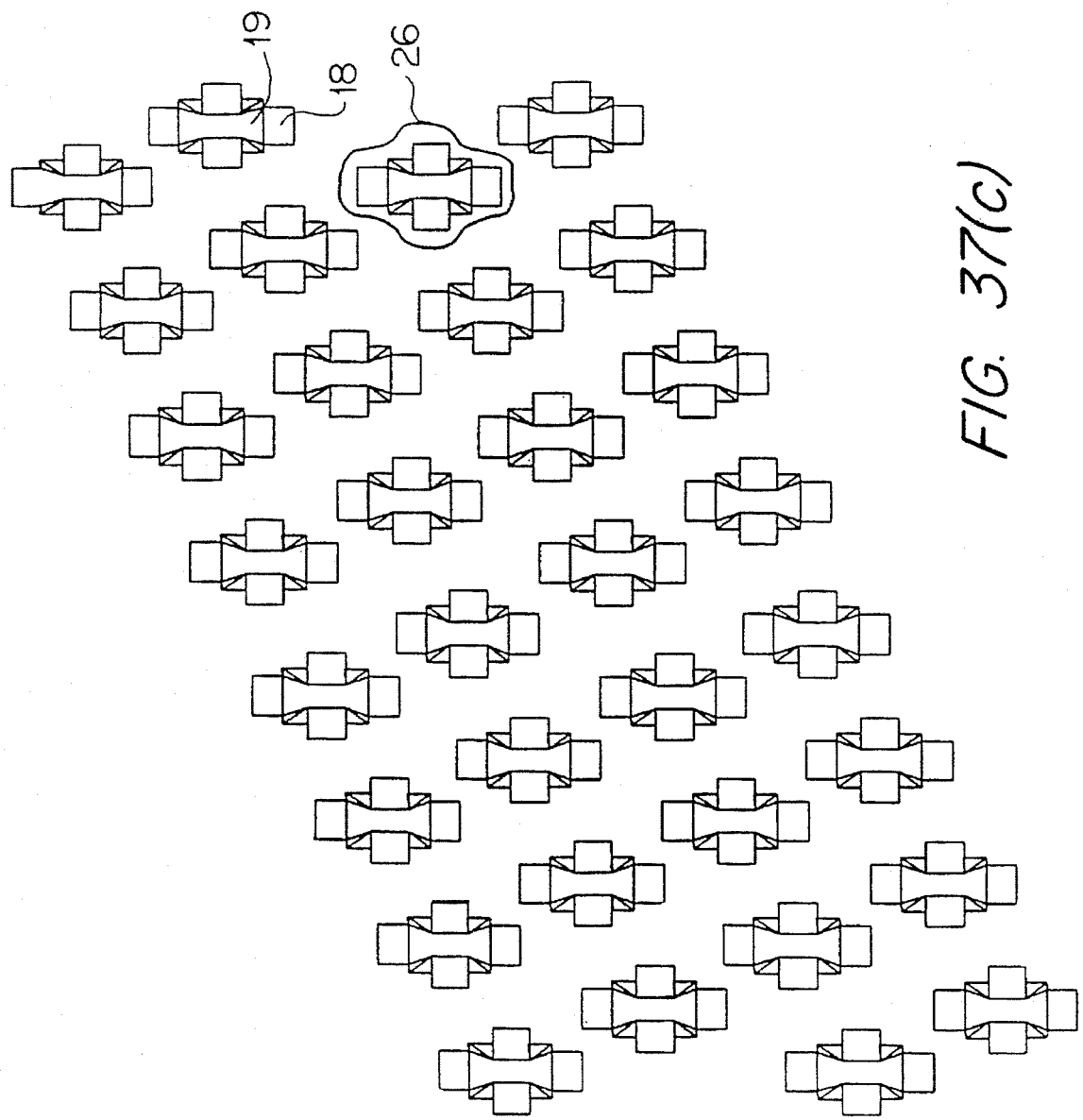

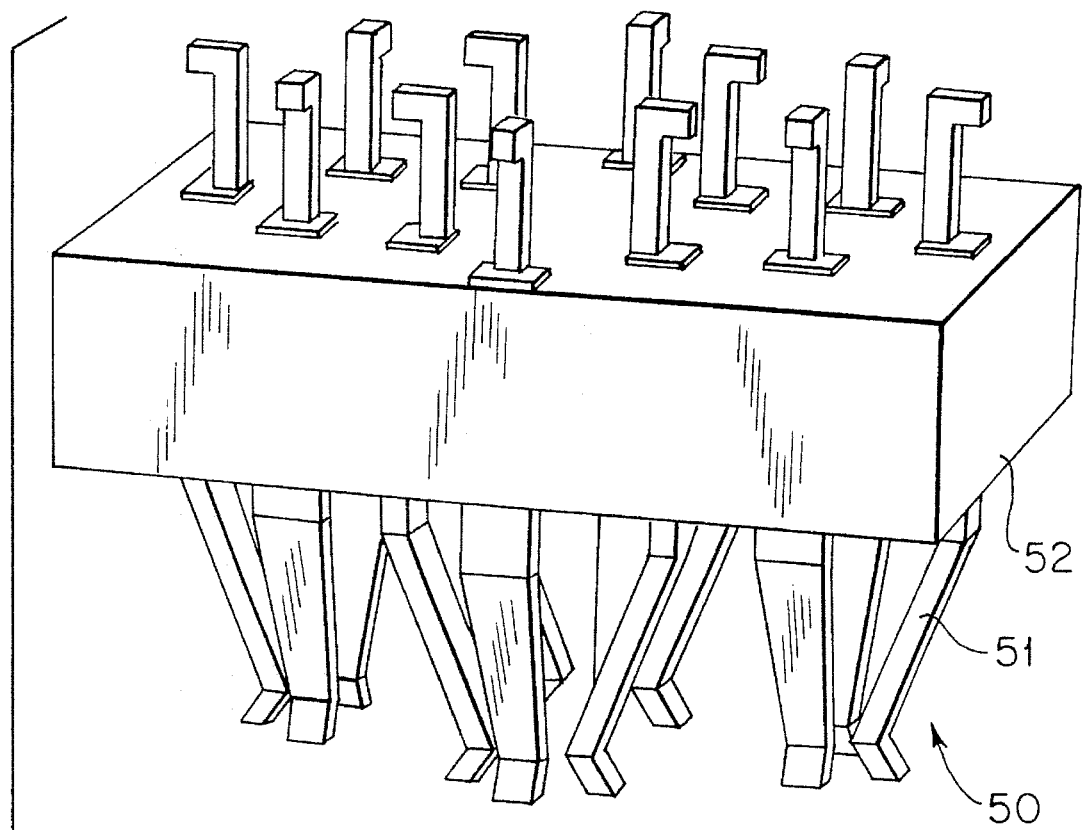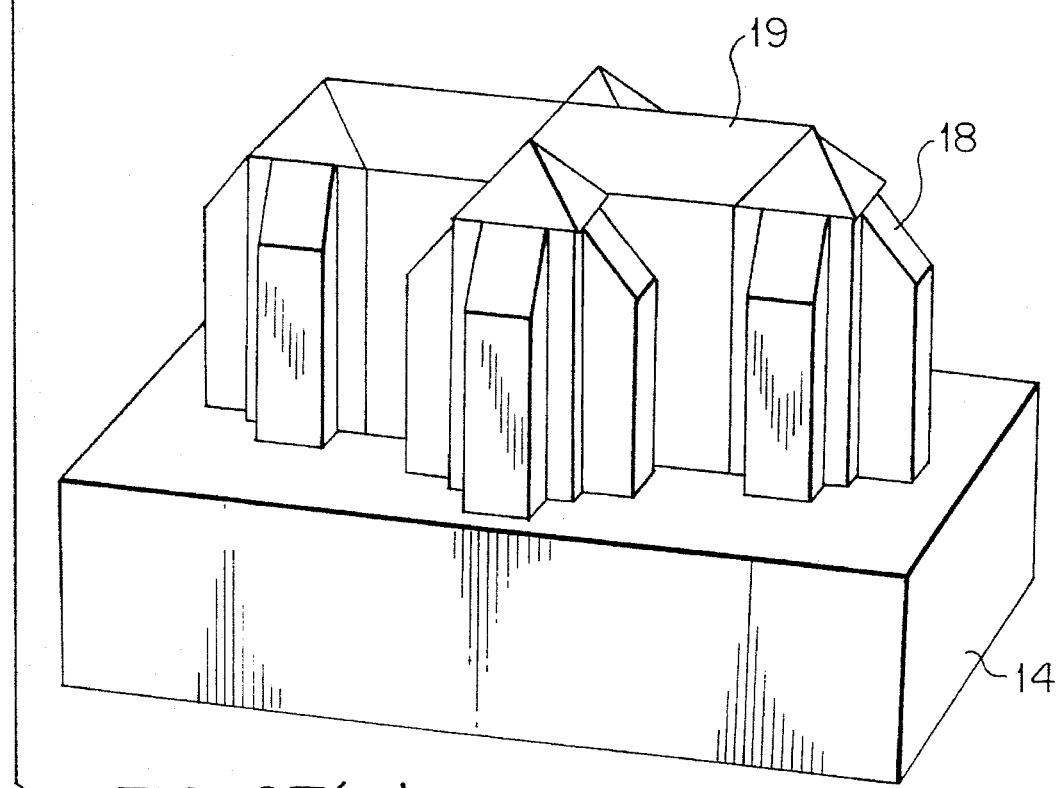
FIG. 67(a)

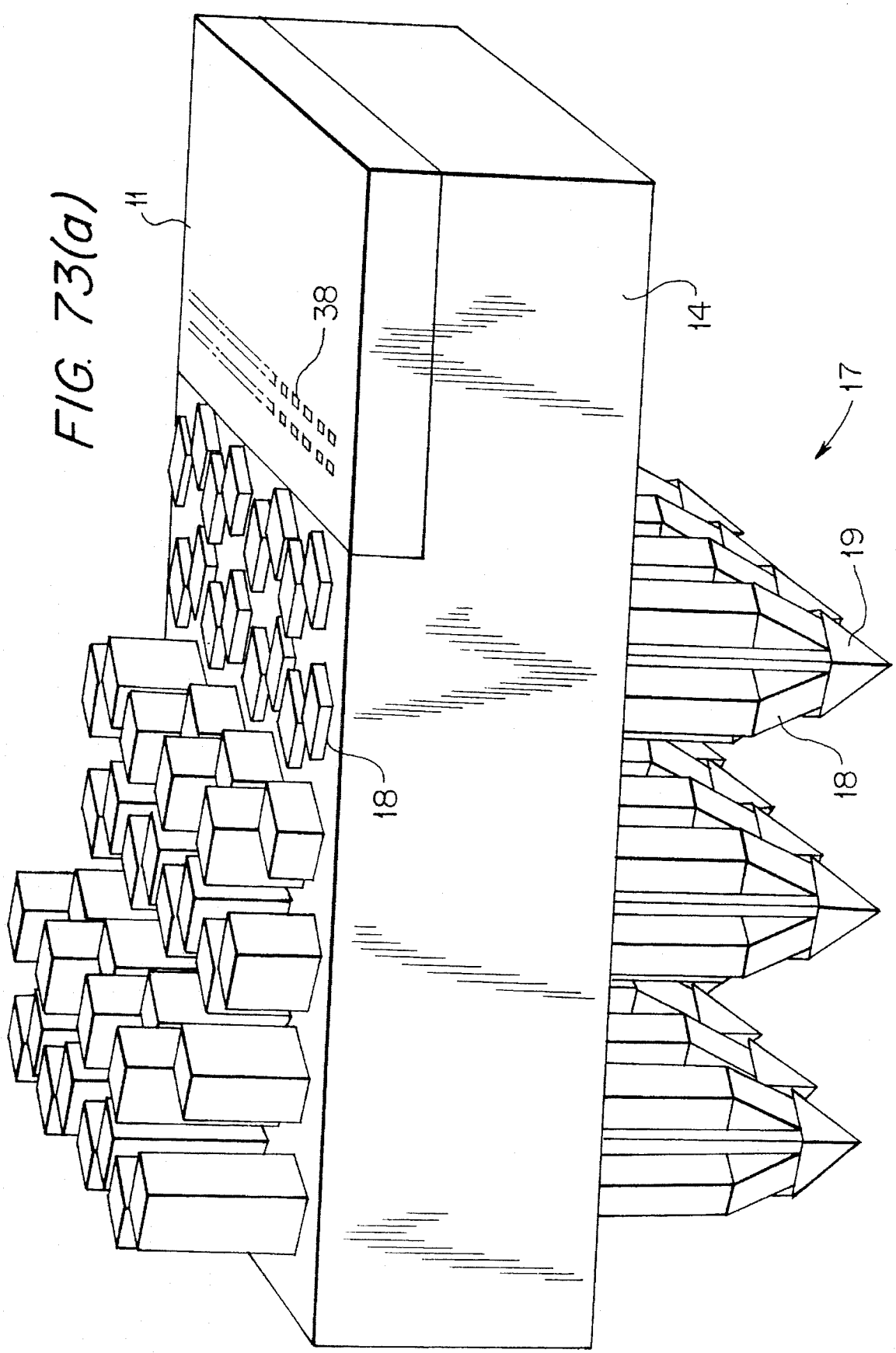

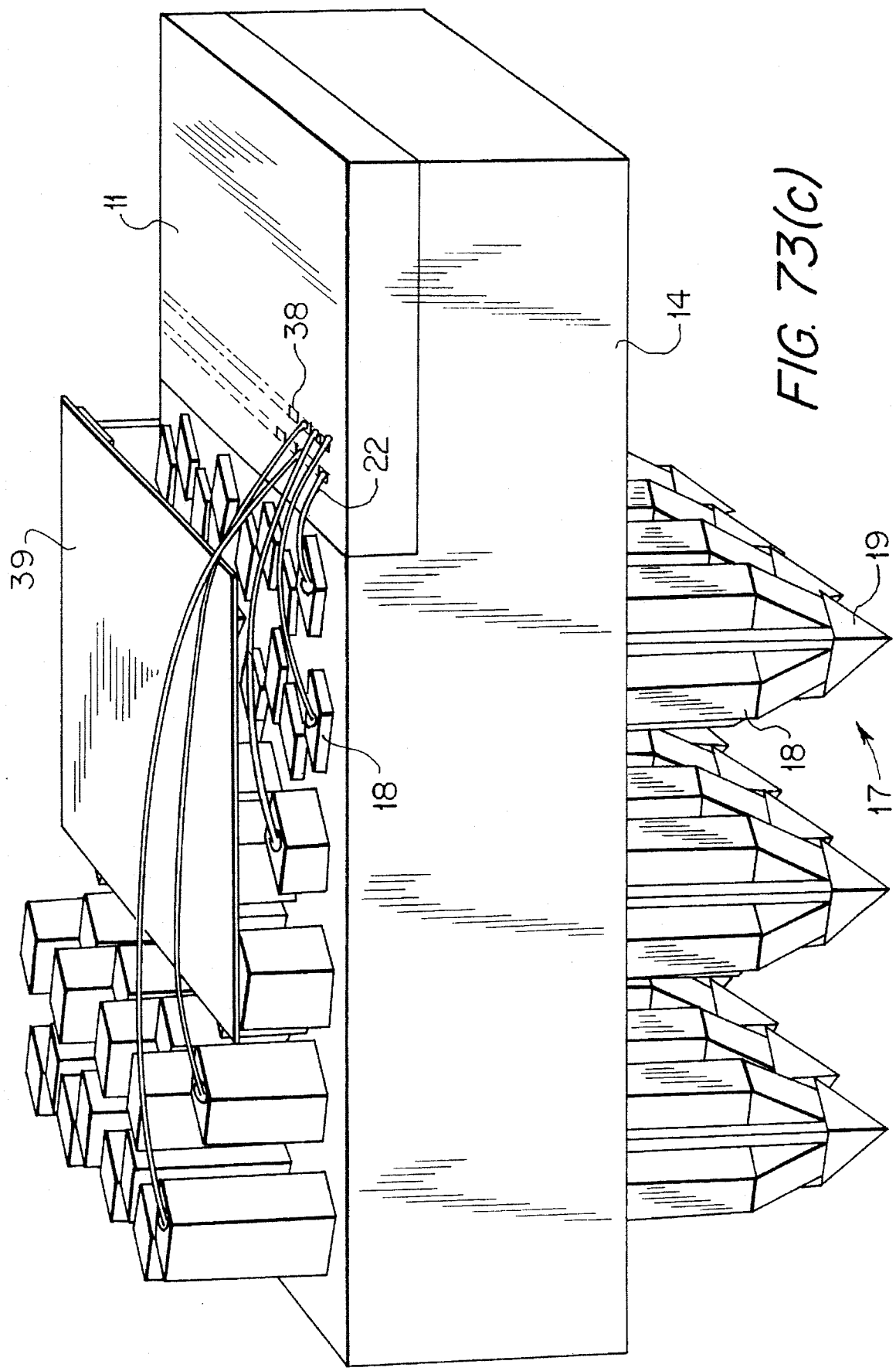

SEMICONDUCTOR CHIP CARRIER AFFORDING A HIGH-DENSITY EXTERNAL INTERFACE

BACKGROUND OF THE INVENTION

1. Field of the Invention

The present invention relates to a semiconductor chip or die carrier having a reduced size, and methods for making and using the semiconductor die carrier. In particular, the present invention relates to a semiconductor die carrier affording an external interface having a high-density of electrically conductive contacts concentrated within a very small area.

2. Description of the Related Art

Semiconductor packages typically contain a semiconductor die having bonding pads formed thereon, a plurality of leads connected to the bonding pads of the semiconductor die, and insulative packaging material, such as ceramic or plastic, formed around the semiconductor die and inner portions of the leads. Such a semiconductor package allows the transmission of electrical signals between the semiconductor die and an interface surface, such as a printed circuit board (PCB), via the bonding pads of the semiconductor die, an electrically conductive path between the bonding pads and the leads, the leads themselves, and traces on the interface surface.

In the prior art, various methods are known for providing the electrically conductive path between the semiconductor die and the leads of the semiconductor package. Such methods, commonly referred to as bonding techniques, include C4 (controlled collapse die connection) bonding, wire bonding, and TAB (Tape Automated Bonding).

FIG. 1 is a side view of components of a semiconductor package manufactured in accordance with a conventional C4 bonding technique. With reference to FIG. 1, in C4 bonding, a semiconductor die 101 is selected, and an array of miniature solder balls 102, each for forming a C4 interconnection, is attached to the lower surface of the semiconductor die. The semiconductor die 101 is placed on a multi-layer conductor 103, and then the solder balls are melted to establish permanent C4 interconnections between the die 101 and the multi-layer conductor 103. Leads 105 are attached to the bottom surface of the multi-layer conductor 103 using brazed joints 104 so that electrical signals may be transmitted between the multi-layer conductor and a PCB 106. The PCB 106 includes plated-through-holes (PTHs) 107 within which the leads 105 are mounted and secured, respectively, through use of a solder material 108.

FIG. 2 is a side view of components of a semiconductor package configured in accordance with a conventional wire bonding technique. With reference to FIG. 2, in wire bonding, a semiconductor die 201 having a plurality of bonding pads 202 formed thereon is selected, and one end of a bonding wire 203 is connected to a corresponding bonding pad. The other end of the bonding wire 203 is connected to a package component 204 including insulative material 205 and conductive pads 206 formed thereon. Leads (not shown) extend from the bottom surface of the package component 204 so that electrical signals may be transmitted between the package component and a PCB (not shown).

TAB (Tape Automated Bonding) is similar to the aforementioned wire bonding technique, except that a different type of lead structure is used. More particularly, rather than connecting a semiconductor die to leads such as those discussed above in connection with FIG. 2, the semiconductor die is instead attached to conductive traces printed on a clear plastic substrate.

Conventional semiconductor packages suffer from many deficiencies. Conventional PGA (Pin Grid Array) packages, for example, tend to take up large amounts of circuit board area. For example, at present, the package used for the Intel 486 (trademark) microprocessor, a 168-pin PGA, occupies 1,936 sq. mm of board area. Even greater in area is the Intel PENTIUM (trademark) microprocessor, a 273-pin PGA occupying 2,916 sq. mm of board area. PGA packages generally increase significantly in size as more input/output interconnections are needed, suggesting that future PGA packages for microprocessors will take up even more board area than existing PGA packages.

The manner in which conventional C4 and other bonding technologies are currently being used contributes to the aforementioned area usage problem. In C4 technology, for example, the C4 interconnections provide useful electrical connections, but do not provide an adequate amount of mechanical strength for the types of leads now in use. Moreover, C4 interconnections are not typically applicable for use within pluggable semiconductor packages. Consequently, in PGAs manufactured using conventional C4 bonding technology, the portions of the leads extending externally from the PGA must be spaced apart to a significant extent. Such spacing increases the area of the PCB that will be occupied by the PGA. Moreover, the use of a multi-layer conductor for supporting the semiconductor die within the PGA package also adds to the size and cost of the PGA package. Also, conventional C4 bonding technology can result in problems with individual lead parasitics, inspectability and testing problems, and problems relating to touch-up and repair.

In addition to increasing the size of conventional PGA-type semiconductor packages, the use of leads that are intentionally spread apart to compensate for mechanical insufficiencies and to allow for pluggable and/or non-pluggable mounting, and the use of multi-layer conductors for supporting the semiconductor die within such packages, all contribute to deficiencies associated with conventional PGA-type semiconductor packages. Such deficiencies include a lengthening in the amount of distance that electrical signals must travel within the semiconductor package, which lengthening affects signal propagation times; an increase in the amount of noise imparted to such electrical signals; an elevation in the power requirements for the semiconductor package; and an increase in the complexity of processes required to manufacture the semiconductor package.

Another disadvantage associated with conventional PGA-type semiconductor packages is that such packages, because they frequently are not used with a socket, are commonly mounted on PCBs using conventional PTH technology, thereby necessitating the performance of a soldering step that is not compatible with SMT processing and is not easily reversed. Such PTH mounting can increase the complexity and expense of the manufacturing operation. Also, such PTH mounting is not very suitable for the implementation of repairs in the field. For example, when testing circuit boards for malfunctions and the like in the field, it is often desirable to remove various semiconductor packages to perform tests to see how the board functions in the absence of such packages. PTH mounting often is not suitable for such testing due to the permanence associated with the soldering operation frequently required for PTH mounting. Moreover, solder, because it can make components difficult to replace, can strictly limit upgradability.

The cost of the ceramic packaging material and brazed pin assembly is another disadvantageous characteristic of conventional PGA-type packages. Another disadvantage is that conventional PGA-type packages have low-performance heat sink characteristics. The excessive number of manufacturing processes required to fabricate PGA-type packages is another disadvantage.

From the foregoing, it can be understood that conventional semiconductor packages, such as PGA-type packages, take up large amounts of board space; are frequently not removably pluggable; are not easily tested in the field or during manufacture; and commonly experience greater amounts of noise and have increased power requirements due to the long distances signals must travel within such packages. A most telling characteristic of conventional semiconductor packages is that in all known packages, the space occupied by the entire package is many times greater than the space actually required for the semiconductor die.

As a result of the foregoing limitations, current semiconductor packaging technology is not sufficient to meet the needs of existing and/or future semiconductor and computer technology. Semiconductor packaging technology has already failed to keep pace with semiconductor die technology and, as computer and microprocessor speeds continue to climb, with space efficiency becoming increasingly important, semiconductor packages having even smaller area requirements will be required. The semiconductor packages discussed above fall short of current and contemplated semiconductor packaging requirements.

SUMMARY OF THE INVENTION

Accordingly, it is a goal of the present invention to provide a semiconductor die carrier occupying reduced amounts of board area, allowing more contacts to be added to enhance performance and functionality, and capable of meeting the needs of existing and contemplated semiconductor and computer technology.

Another goal of the present invention is to provide a semiconductor die carrier that can be made either compatible with surface-mount technology (SMT) or pluggable to facilitate testing both in the field and during manufacture.

Yet another goal of the present invention is to provide a semiconductor die carrier having signal paths that are reduced in length to reduce noise and decrease necessary power requirements.

A further goal of the present invention is to provide a semiconductor die carrier having a reduced size to allow a reduction in overall size of the system incorporating the die carrier.

Still another goal of the present invention is to provide an SMT-compatible or pluggable semiconductor die carrier which does not use a multi-layer conductor for supporting the semiconductor die so that a very low profile package may be provided.

It is also a goal of the present invention to provide methods for making and using semiconductor die carriers having characteristics such as those discussed above.

These and other goals are achieved by using a semiconductor die carrier comprising an insulative substrate; an array of groups of multiple electrically conductive contacts arranged in rows and columns on the insulative substrate, wherein the groups from adjacent rows are staggered as are the groups from adjacent columns, and a portion of each group overlaps into an adjacent row or an adjacent column of the groups of the array; a semiconductor die; and means for providing electrical connection between the semiconductor die and the conductive contacts.

Also, a method of manufacturing a semiconductor die carrier may be used, the method comprising the steps of forming an insulative substrate; arranging an array of groups of multiple electrically conductive contacts in rows and columns on the insulative substrate, such that the groups from adjacent rows are staggered as are the groups from adjacent columns, and a portion of each group overlaps into an adjacent row or an adjacent column of the groups of the array; providing a semiconductor die; and electrically connecting the semiconductor die and the conductive contacts.

The aforementioned goals and other goals are also achieved by using a semiconductor die carrier comprising an insulative substrate; a plurality of leads each having an external portion extending out of the semiconductor die carrier from a lower surface of the insulative substrate and an internal portion located within the semiconductor die carrier at an upper surface of the insulative substrate; a semiconductor die positioned above the insulative substrate; and a layer of conductive material in contact with conductive portions of the semiconductor die and also in contact with the internal portions of the leads.

Also, a method of manufacturing a semiconductor die carrier may be used, the method comprising the steps of fabricating or manufacturing an insulative substrate; providing a plurality of leads each having an external portion extending out of the semiconductor die carrier from a lower surface of the insulative substrate and an internal portion located within the semiconductor die carrier at an upper surface of the insulative substrate; positioning a semiconductor die above the insulative substrate; and electrically connecting conductive portions of the semiconductor die and the internal portions of the leads using a layer of conductive material in contact with conductive portions of the semiconductor dies and also in contact with the internal portions of the leads.

It is to be understood that both the foregoing general description and the following detailed description are exemplary and explanatory, and are not restrictive of the invention as claimed. The accompanying drawings, which are incorporated in and constitute a part of the specification, illustrate embodiments of the present invention and, together with the general description, serve to explain the principles of the present invention.

BRIEF DESCRIPTION OF THE DRAWINGS

FIG. 21(*b*) is a view of an arrangement of electrical interconnect components in accordance with the present invention.

FIG. 22 is a view showing electrical interconnect components arranged in a nested configuration.

FIG. 29(*b*) is a view of an arrangement of electrical interconnect components modified to include a space at a center portion thereof.

FIG. 37(*b*) is a view of an arrangement of electrical interconnect components in accordance with the present invention.

FIG. 37(*c*) is a view of an arrangement of electrical interconnect components in accordance with the present invention.

FIG. 37(*d*) is a view of an arrangement of electrical interconnect components in accordance with the present invention.

FIG. 39(*b*) is another perspective view of an embodiment of a semiconductor die carrier in accordance with the present invention housed within a cable environment.

7

Figure 49:
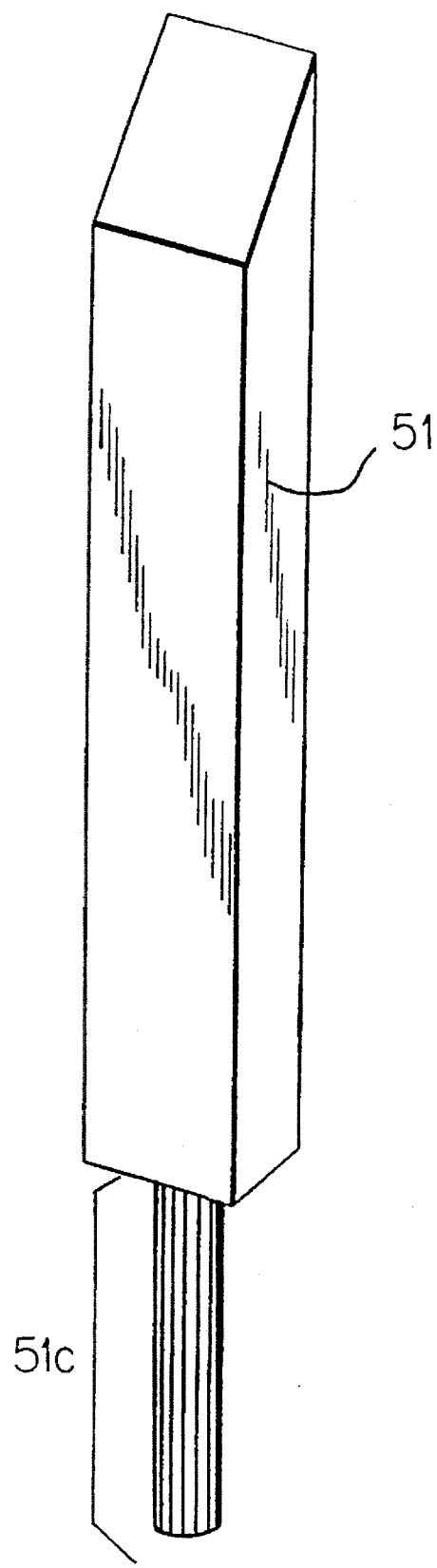

FIG. 49 is a perspective view of a conductive post in accordance with the present invention having a rounded foot portion.

Figure 50:
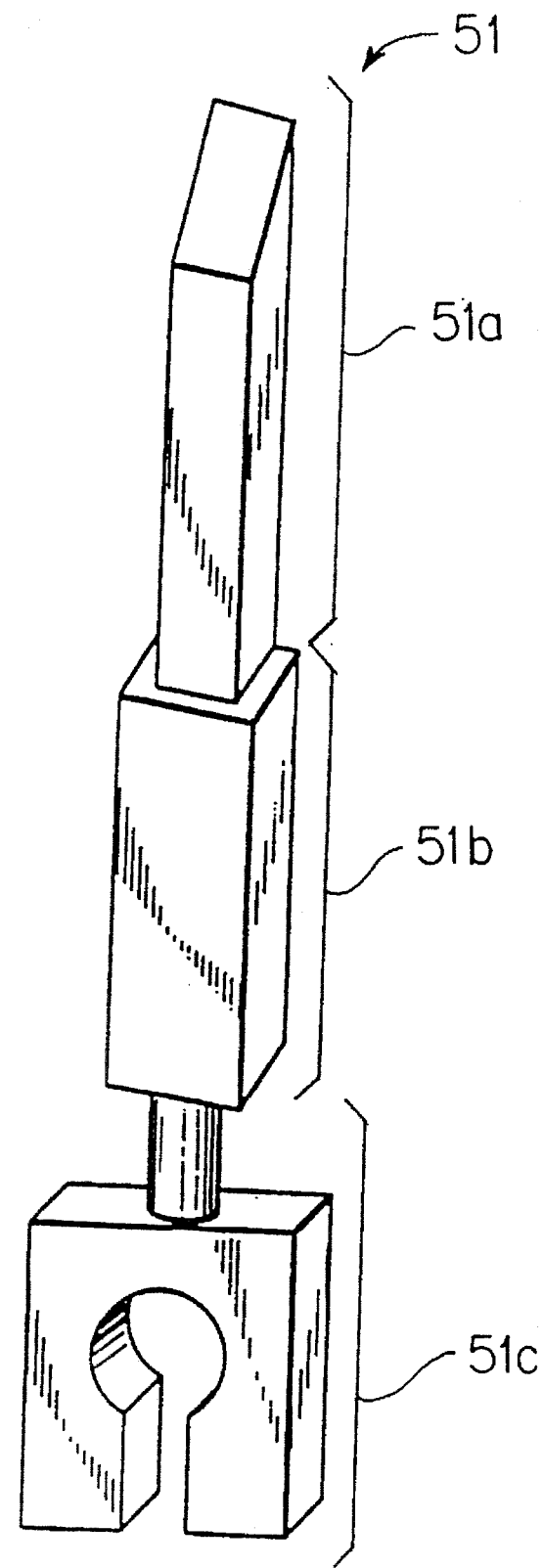

FIG. 50 is a perspective view of a conductive post in accordance with the present invention having a foot portion configured to interface with a round wire or cable.

Figure 51:
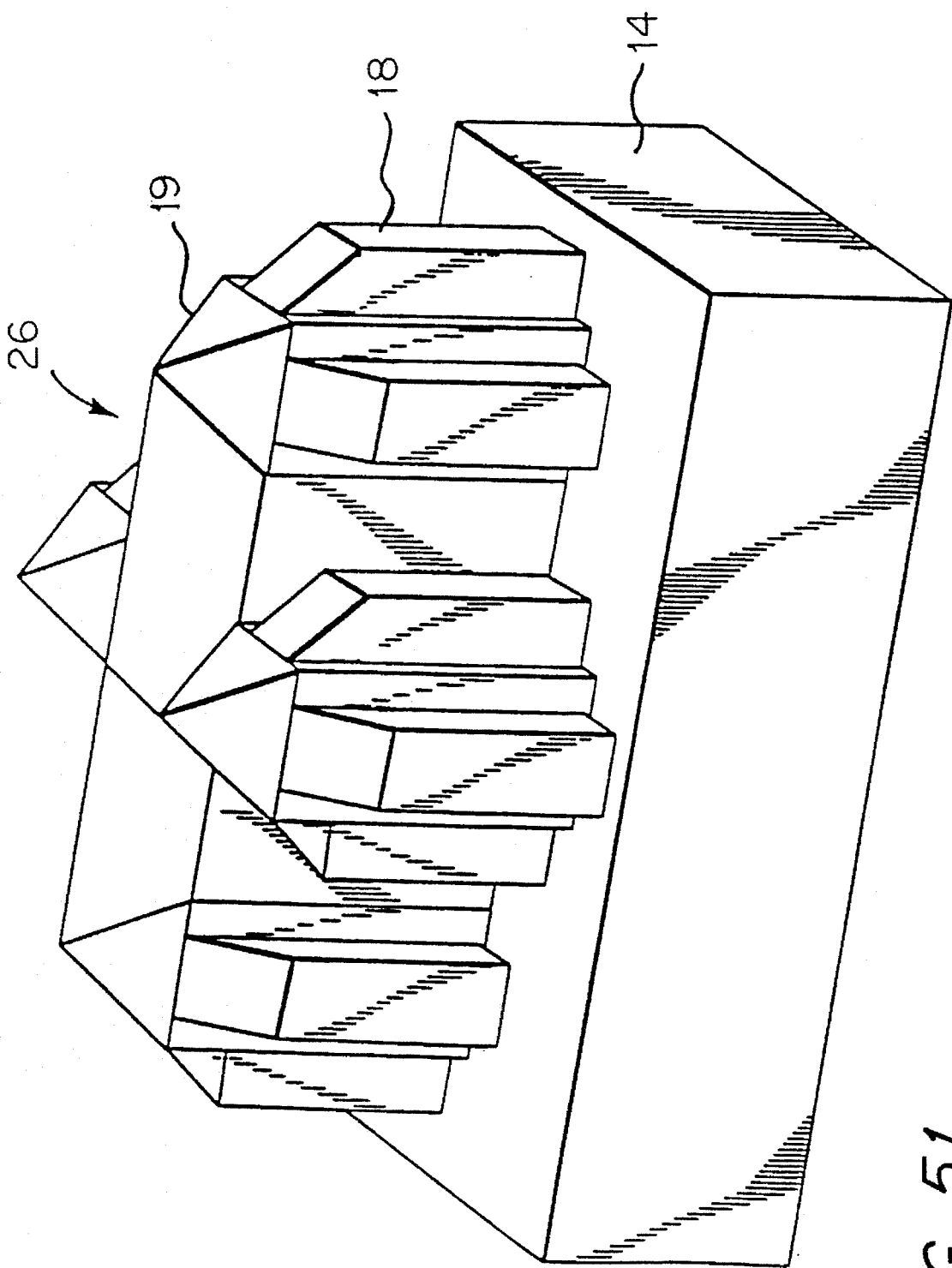

FIG. 51 is a perspective view of a projection-type electrical interconnect component for use with a semiconductor die carrier in accordance with the present invention.

Figure 52:
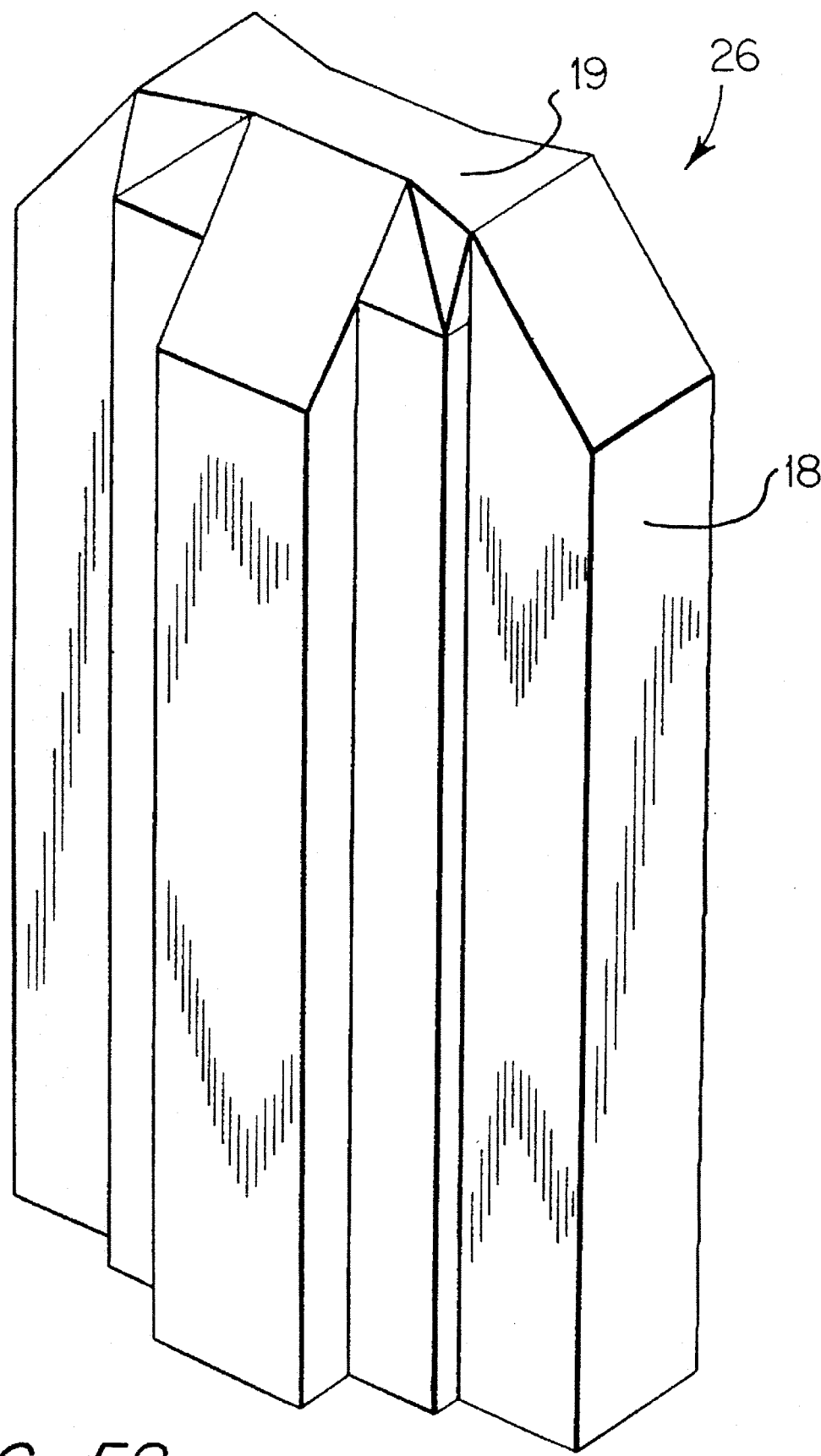

FIG. 52 is a perspective view of a projection-type electrical interconnect component for use with a semiconductor die carrier in accordance with of the present invention.

Figure 53:
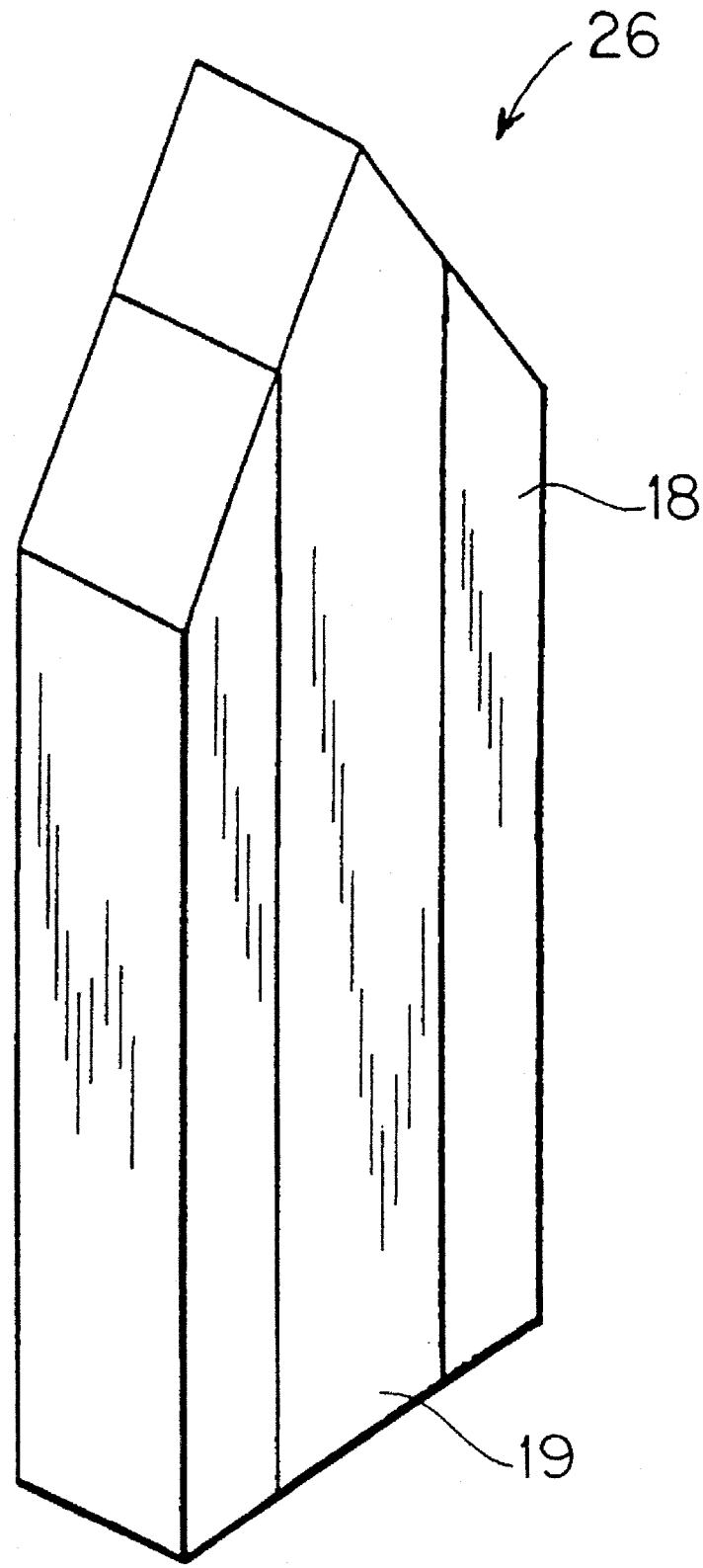

FIG. 53 is a perspective view of a projection-type electrical interconnect component for use with a semiconductor die carrier in accordance with of the present invention.

Figures 54A, 54B:
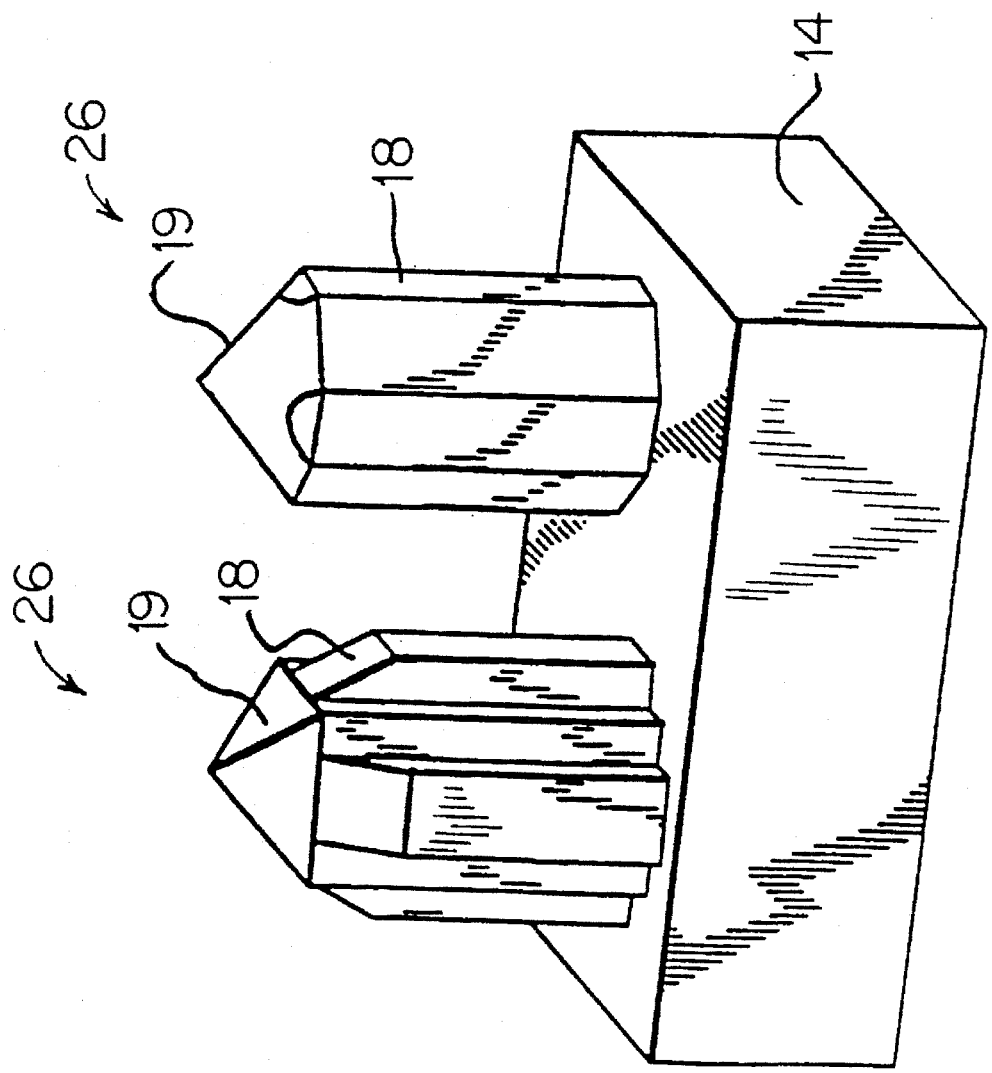

FIG. 54(a) is a perspective view of two different types of projection-type electrical interconnect components.

FIG. 54(b) is a perspective view of a portion of a projection-type electrical interconnect component with the tip portion of the component removed.

Figure 55:
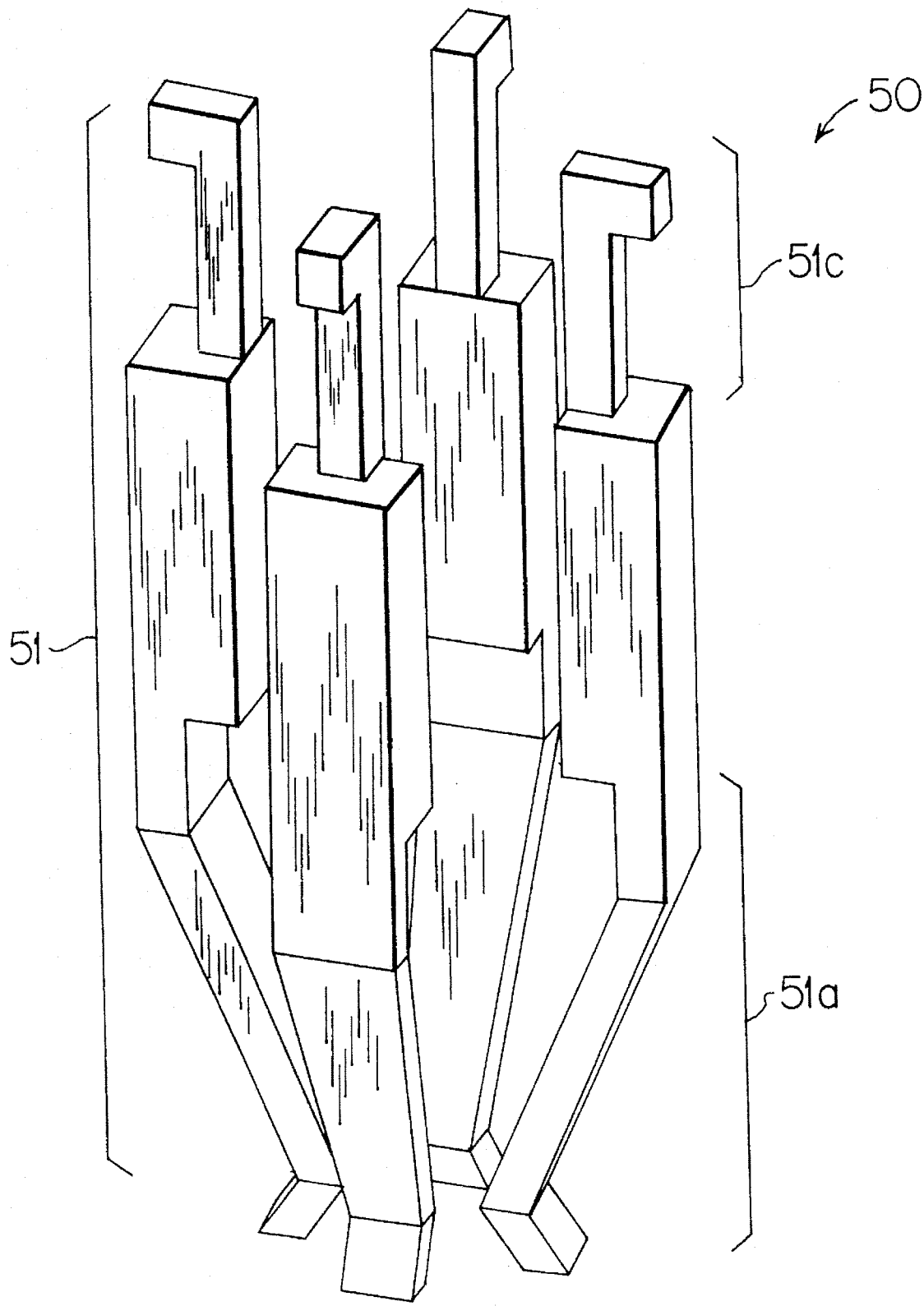

FIG. 55 is a perspective view of a portion of a receiving-type interconnect component in accordance with the present invention.

Figure 56:
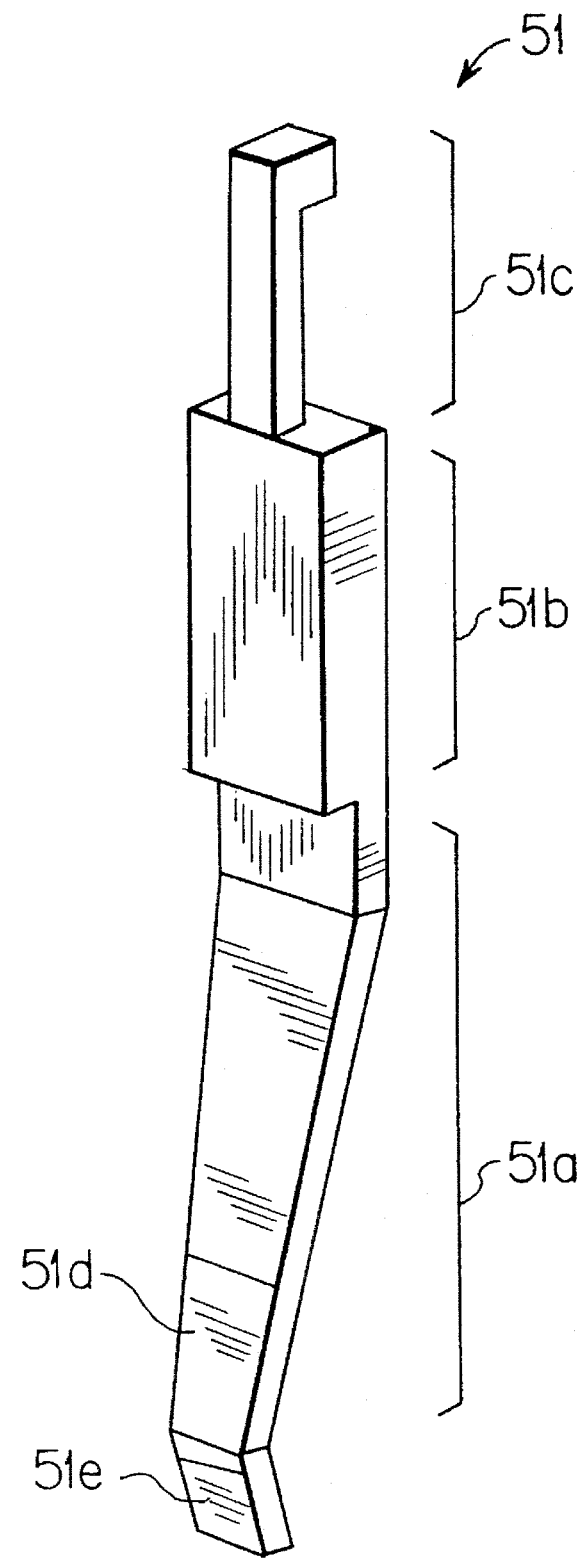

FIG. 56 is a perspective view showing an example of a conductive beam that may be used to mate with the semiconductor die carrier of the present invention.

Figure 57:
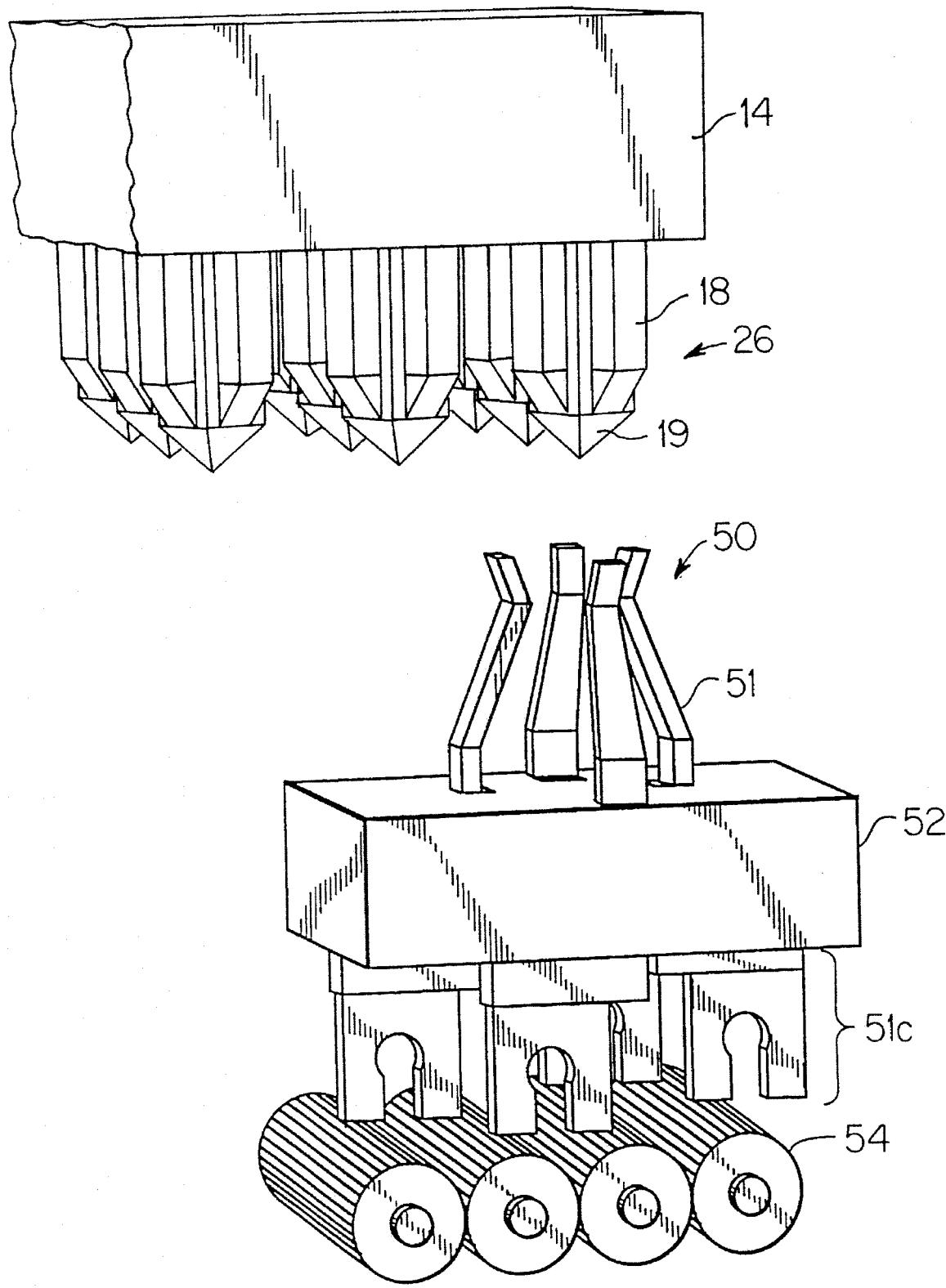

FIG. 57 is a perspective view of an interconnect system including plurality of posts and also flexible beams arranged to interface with a wire or cable.

Figure 58:
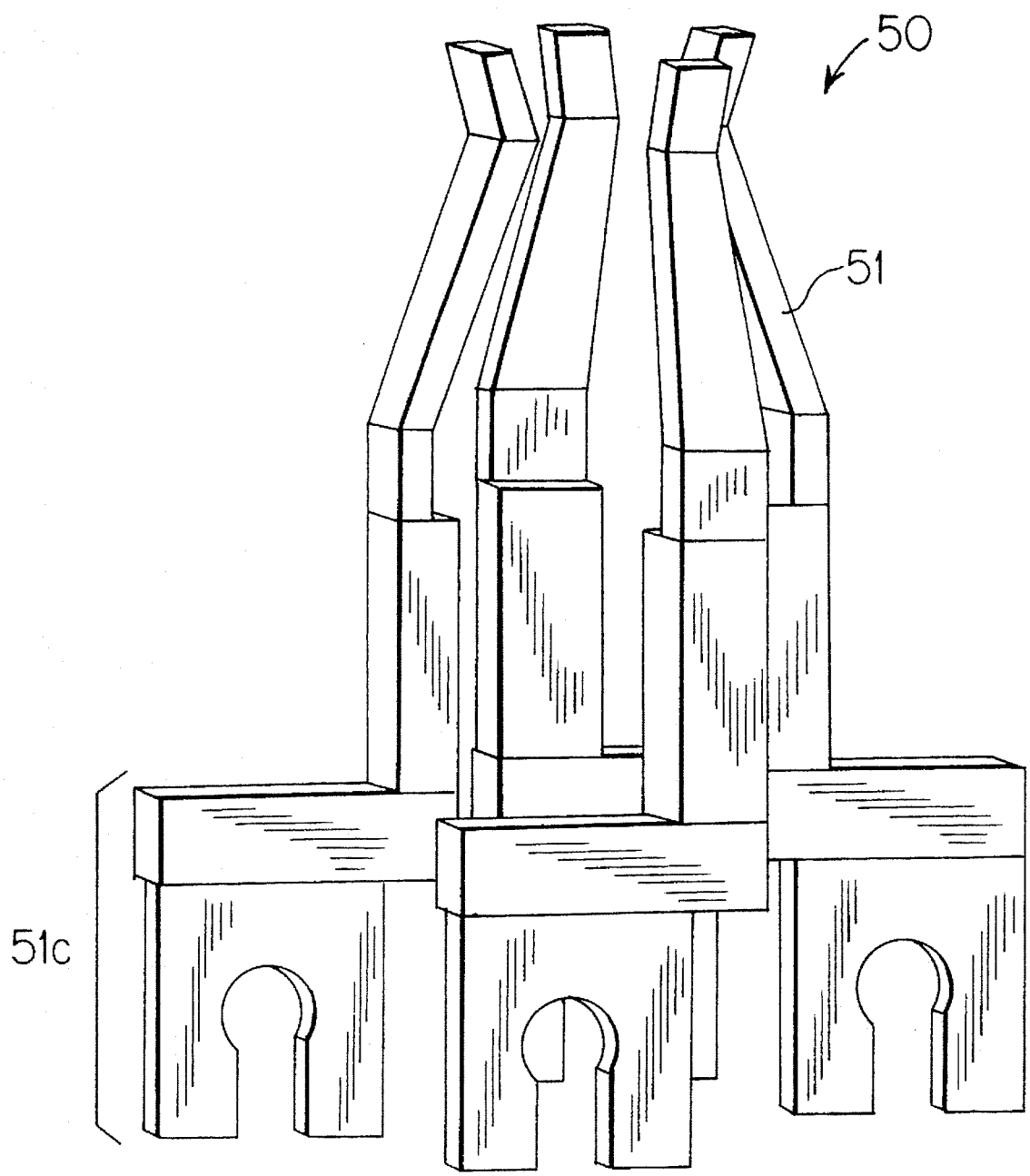

FIG. 58 is a perspective view of a plurality of flexible beams of a receiving-type interconnect component, each having a wire or cable interface foot portion.

Figure 59:
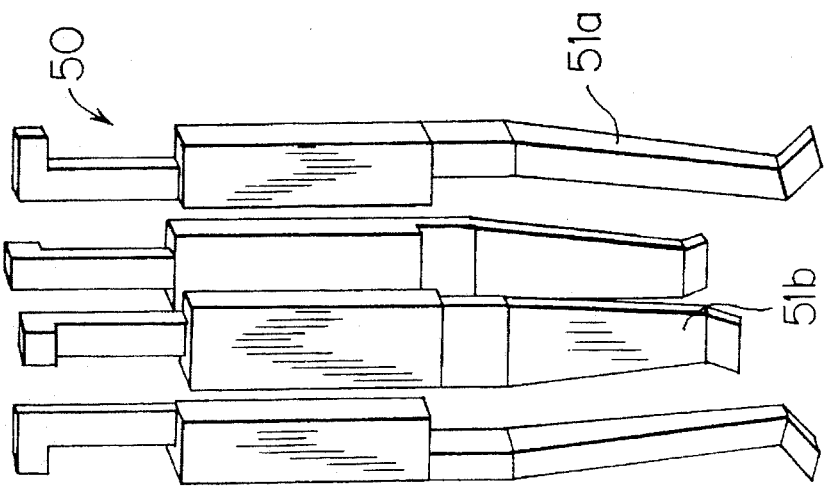

FIG. 59 is a perspective view of beams of a receiving-type interconnect component in accordance with the present invention having portions of different lengths.

Figure 60:
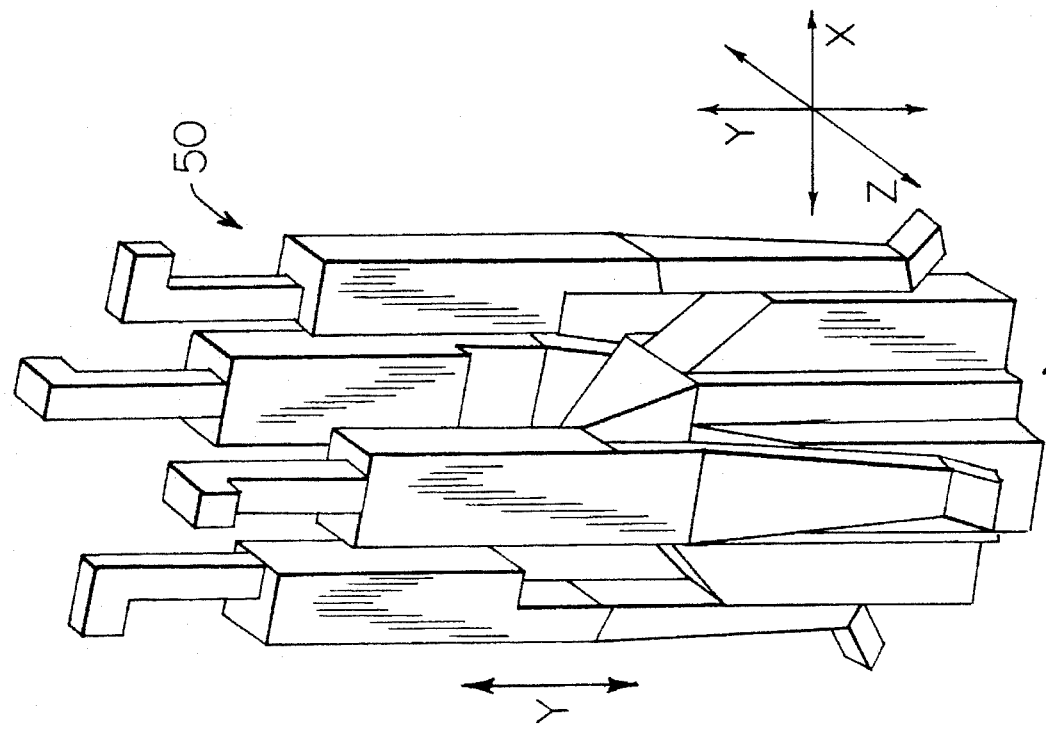

FIG. 60 is a perspective view showing a projection-type interconnect component received within a receiving-type interconnect component.

Figure 61:
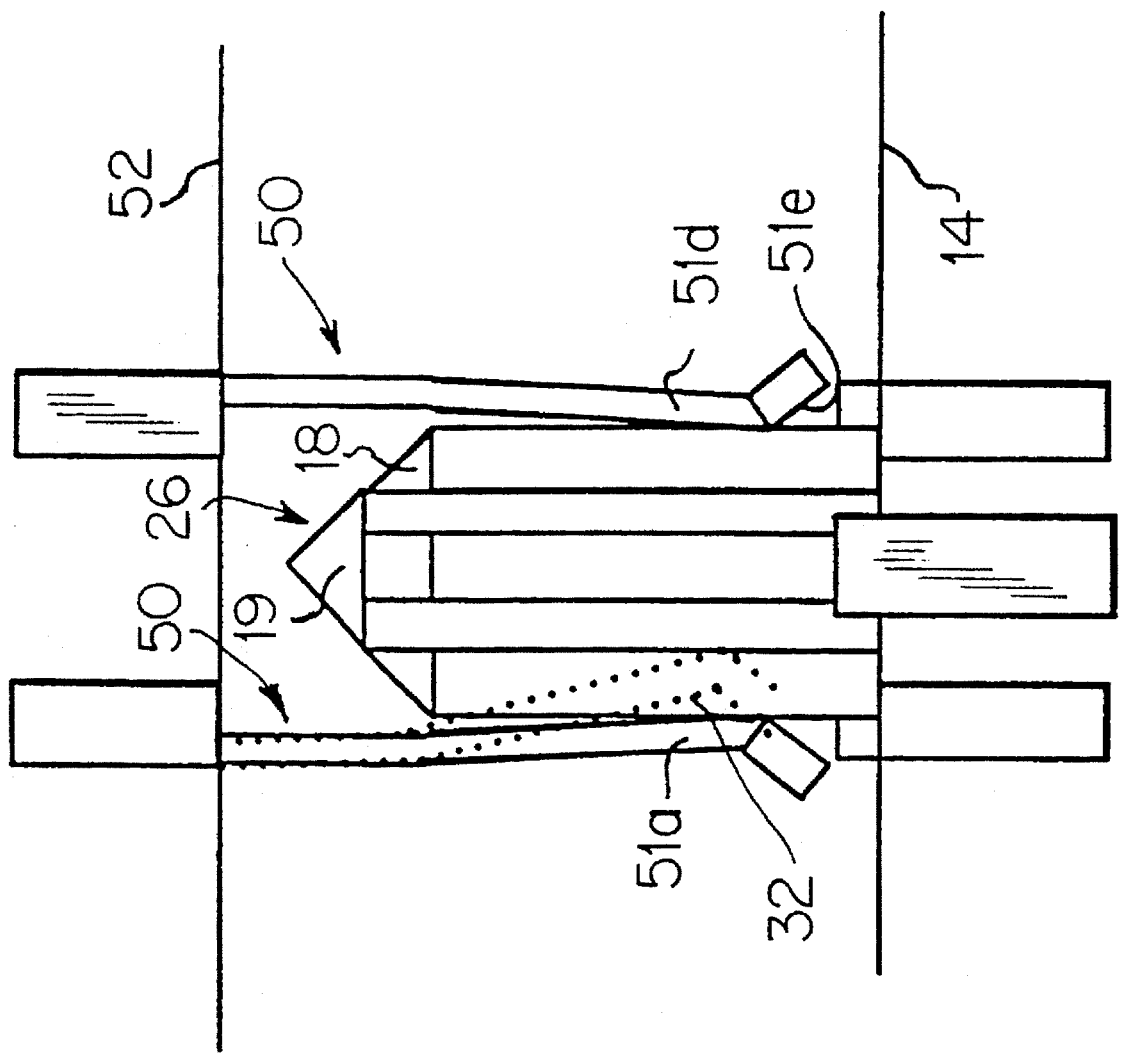

FIG. 61 is a side view of a projection-type interconnect component received within a receiving-type interconnect component.

Figure 62:
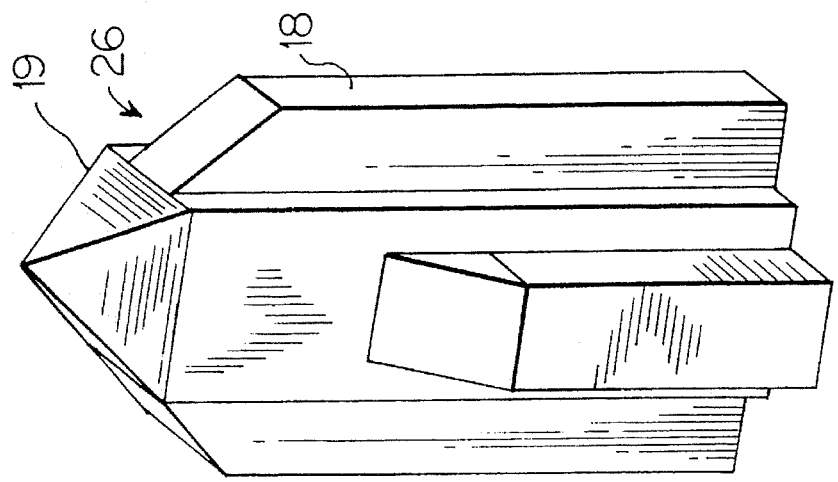

FIG. 62 is a perspective view of a portion of a projection-type interconnect component having conductive posts which vary in height.

Figure 63:
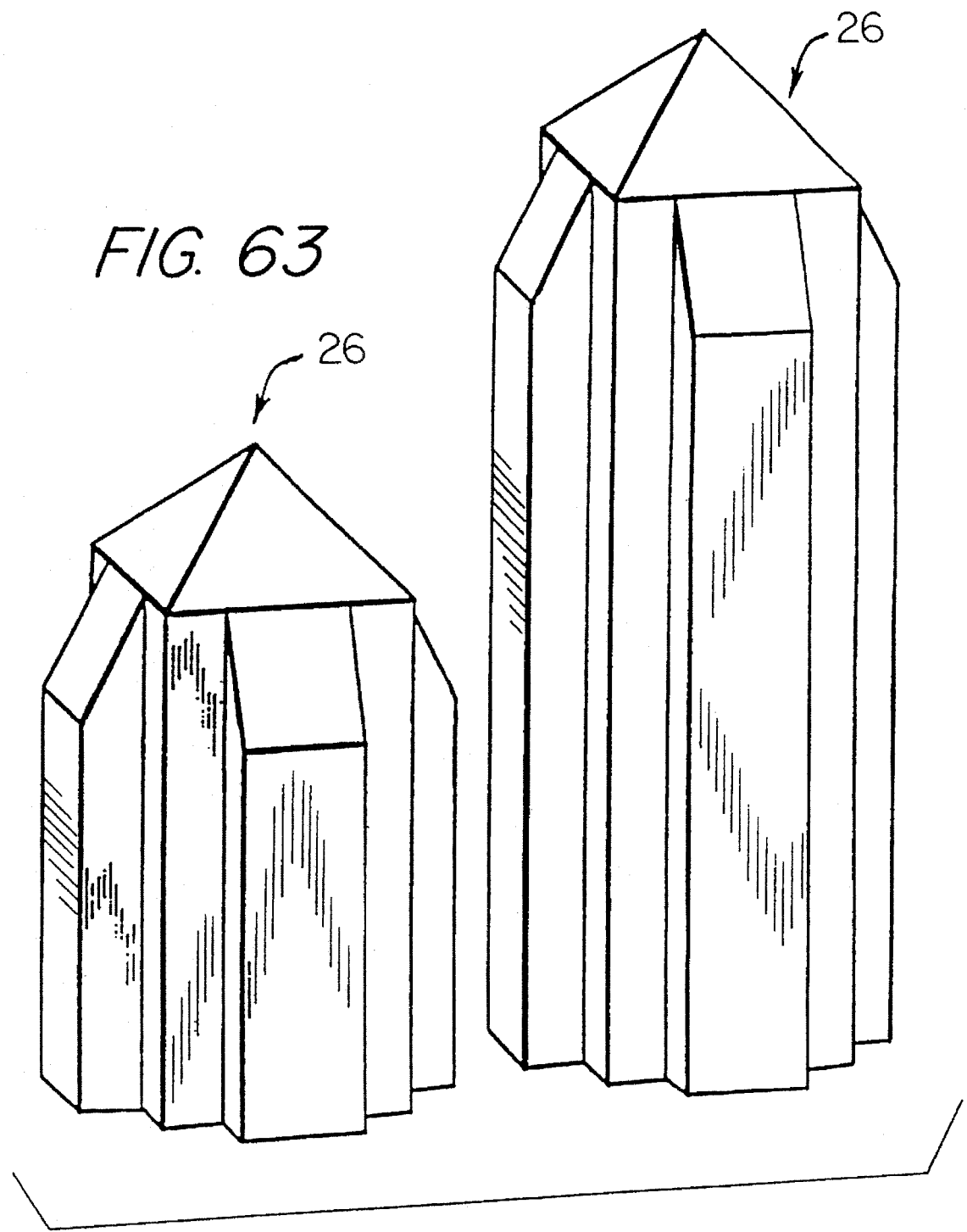

FIG. 63 is a perspective view of several projection-type interconnect components having different heights.

Figure 64B:
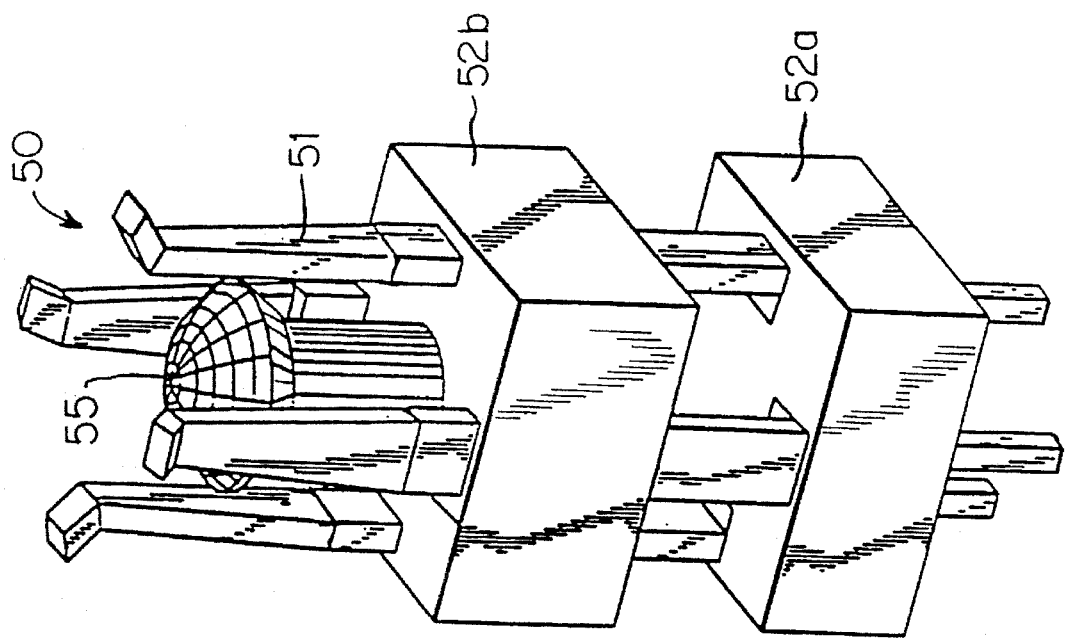
Figure 64A:
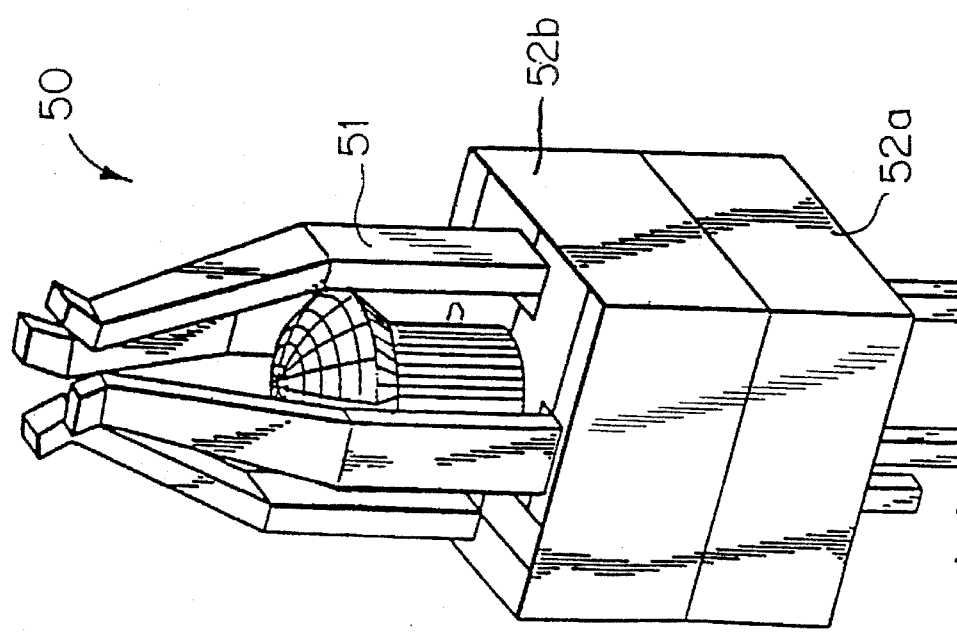

FIG. 64(a) is a perspective view of a first type of low-insertion-force or zero-insertion-force component in a closed state.

FIG. 64(b) is a perspective view of the low-insertion-force or zero-insertion-force component of FIG. 64(a) in an open state.

Figure 64C:
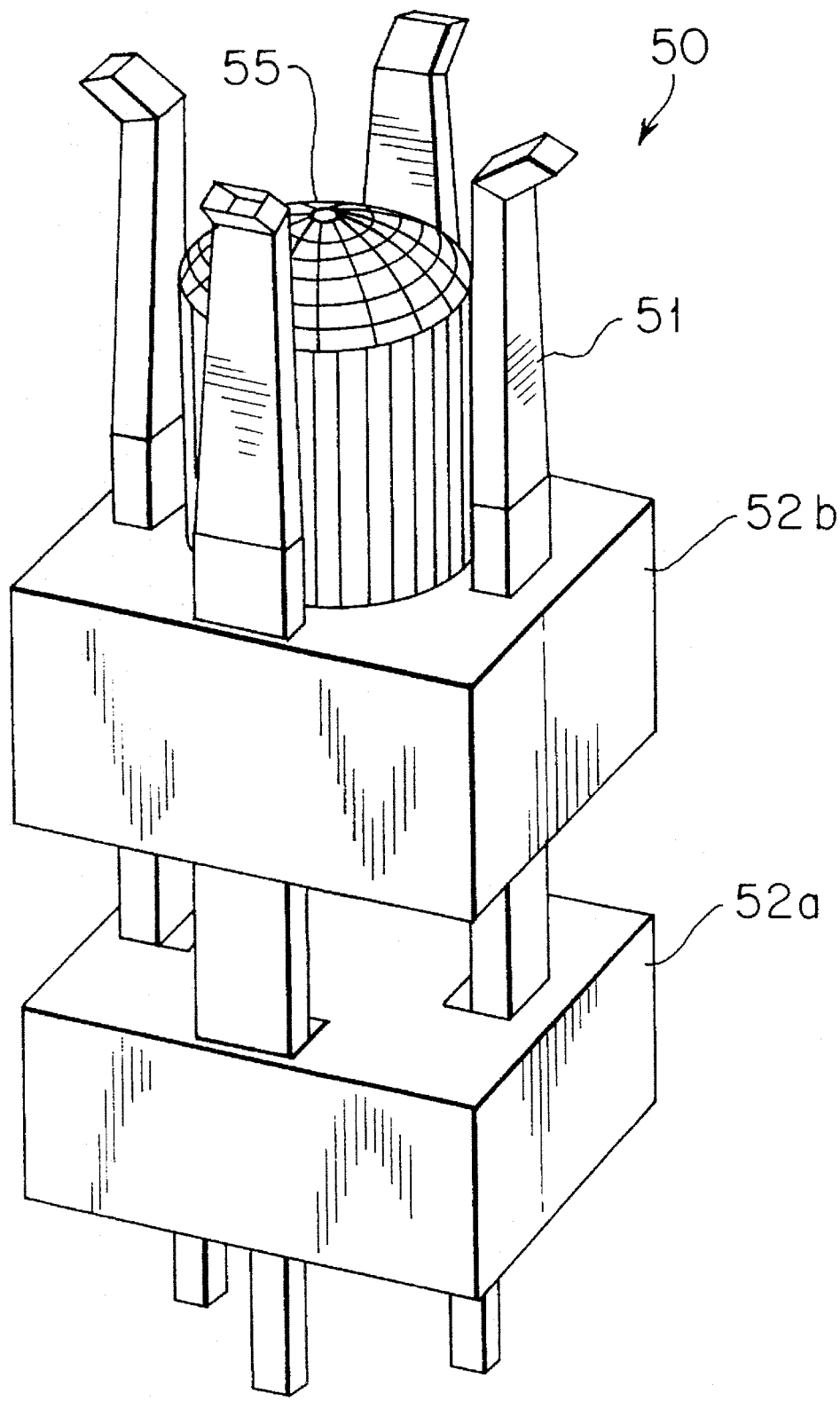

FIG. 64(c) is a perspective view of the low-insertion-force insertion-force or zero-insertion-force component using a straight member.

Figure 65B:
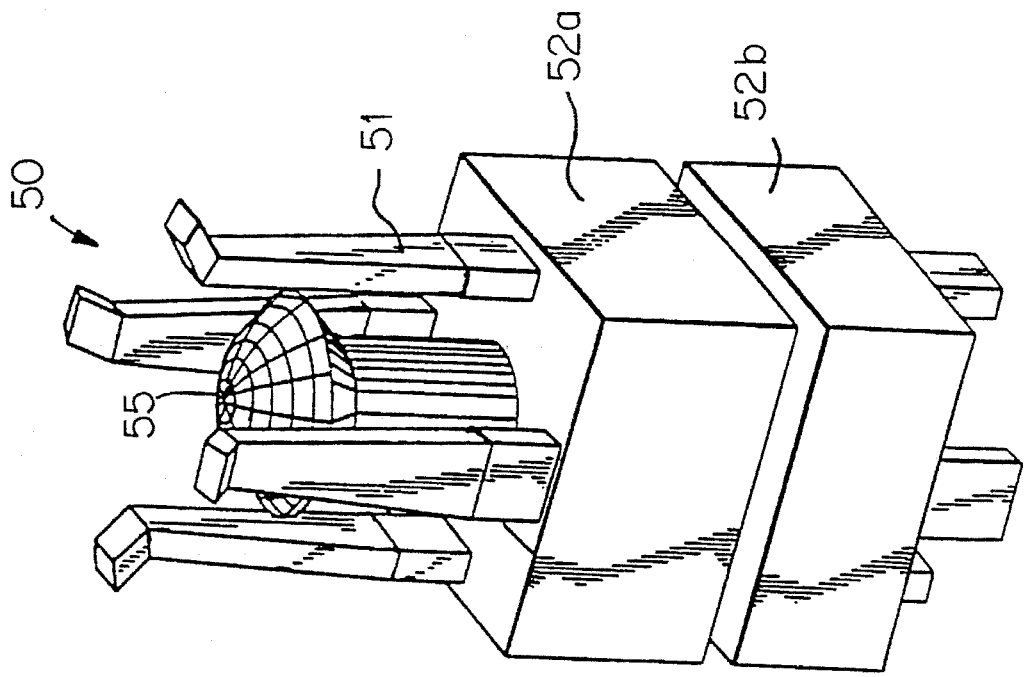
Figure 65A:
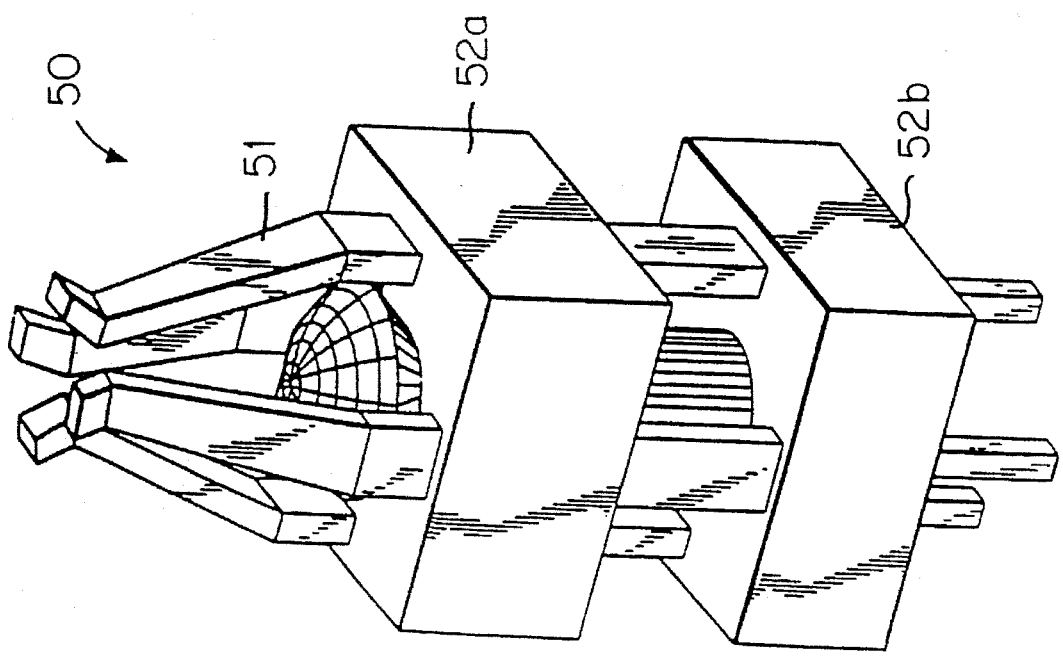

FIG. 65(a) is a perspective view of the first type of low-insertion-force or zero-insertion-force component in a closed state.

FIG. 65(b) is a perspective view of the low-insertion-force or zero-insertion force component of FIG. 65(a) in an open state.

Figure 65C:
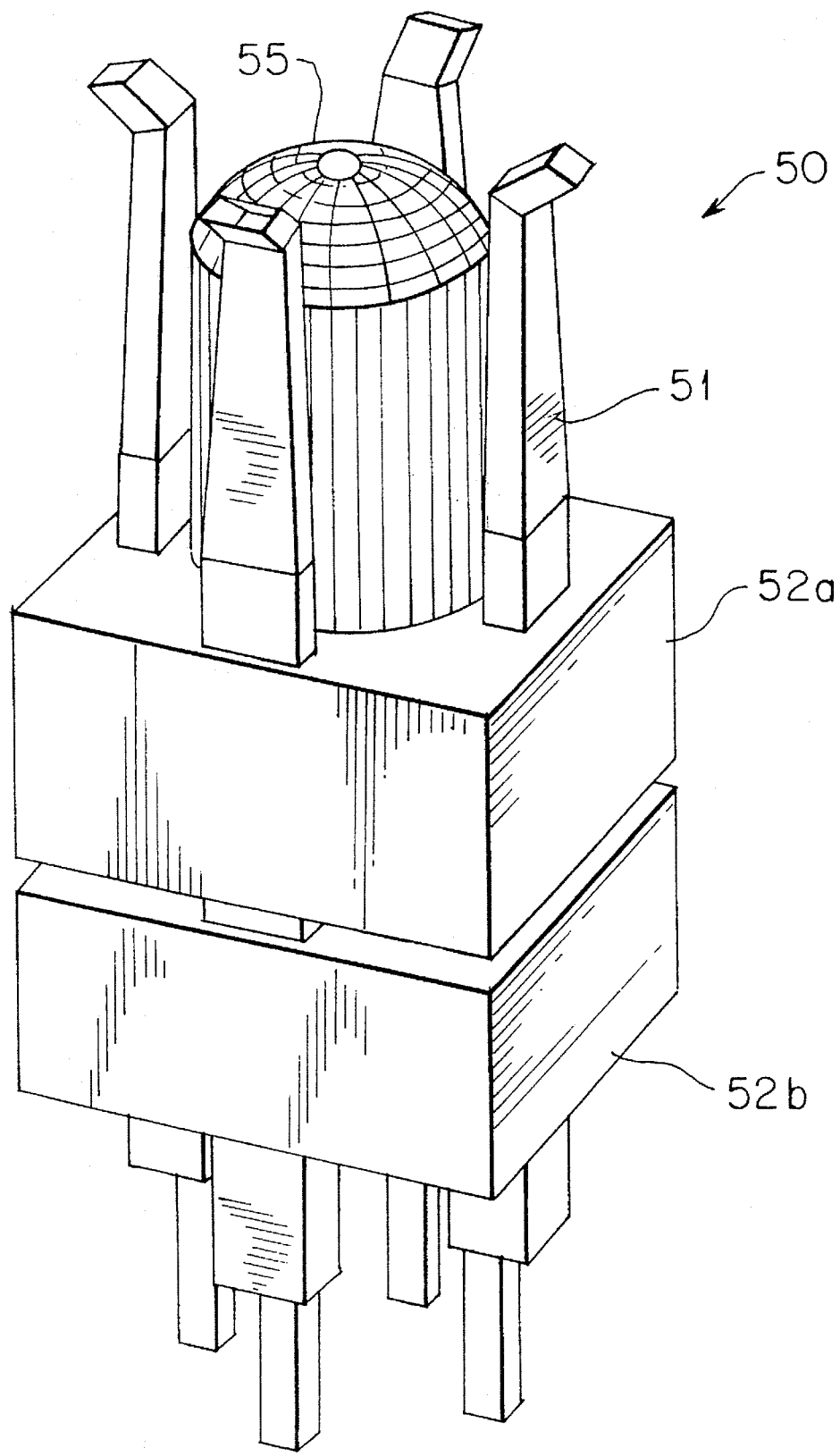

FIG. 65(c) is a perspective view of the second type of low-insertion-force or zero-insulation force component using a straight member.

8

Figure 66A:
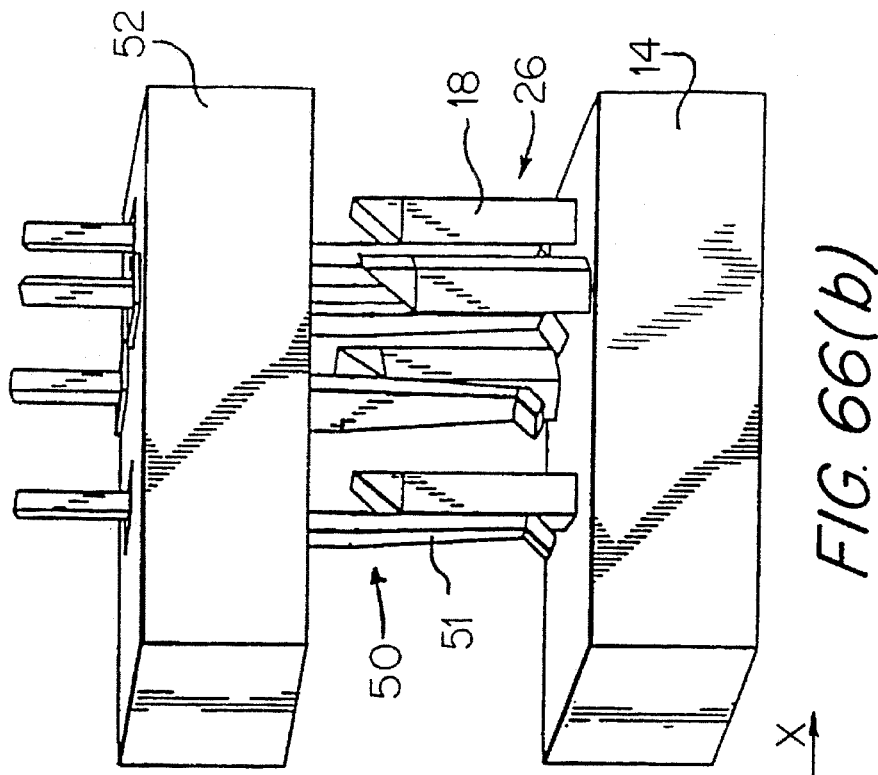

FIG. 66(a) is a perspective view of a third type of low-insertion-force insertion-force or zero-insertion-force component in a first state.

Figure 66B:
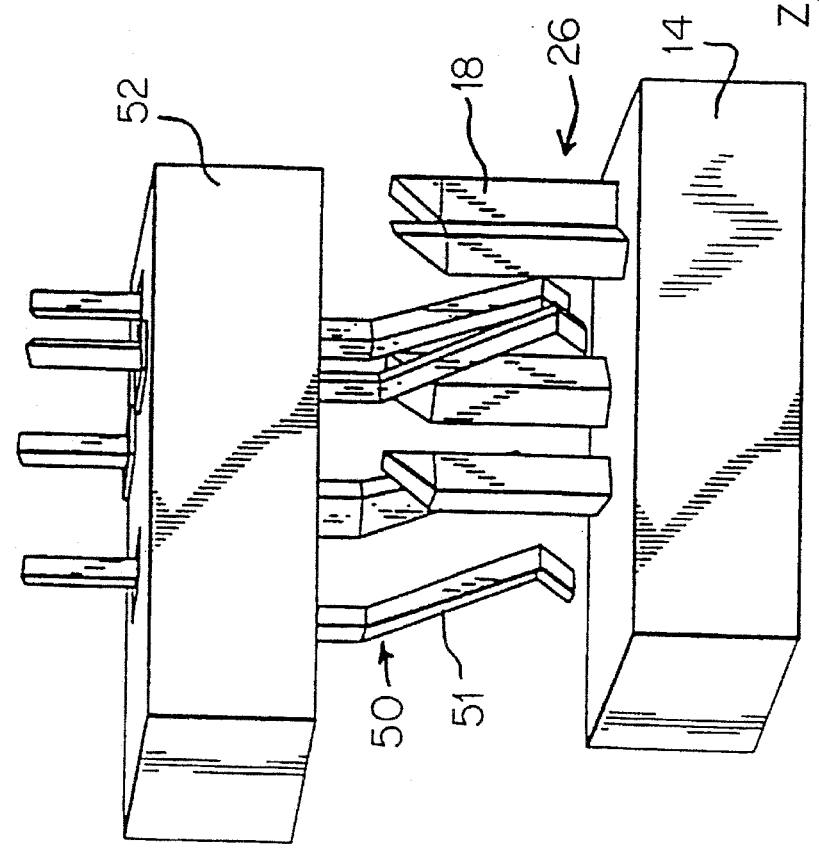

FIG. 66(b) is a perspective view of the low-insertion-force or zero-insertion-force component of FIG. 66(a) in a second state.

FIG. 67(a) is a perspective view of an electrical interconnect system in a position prior to mating.

Figure 67B:
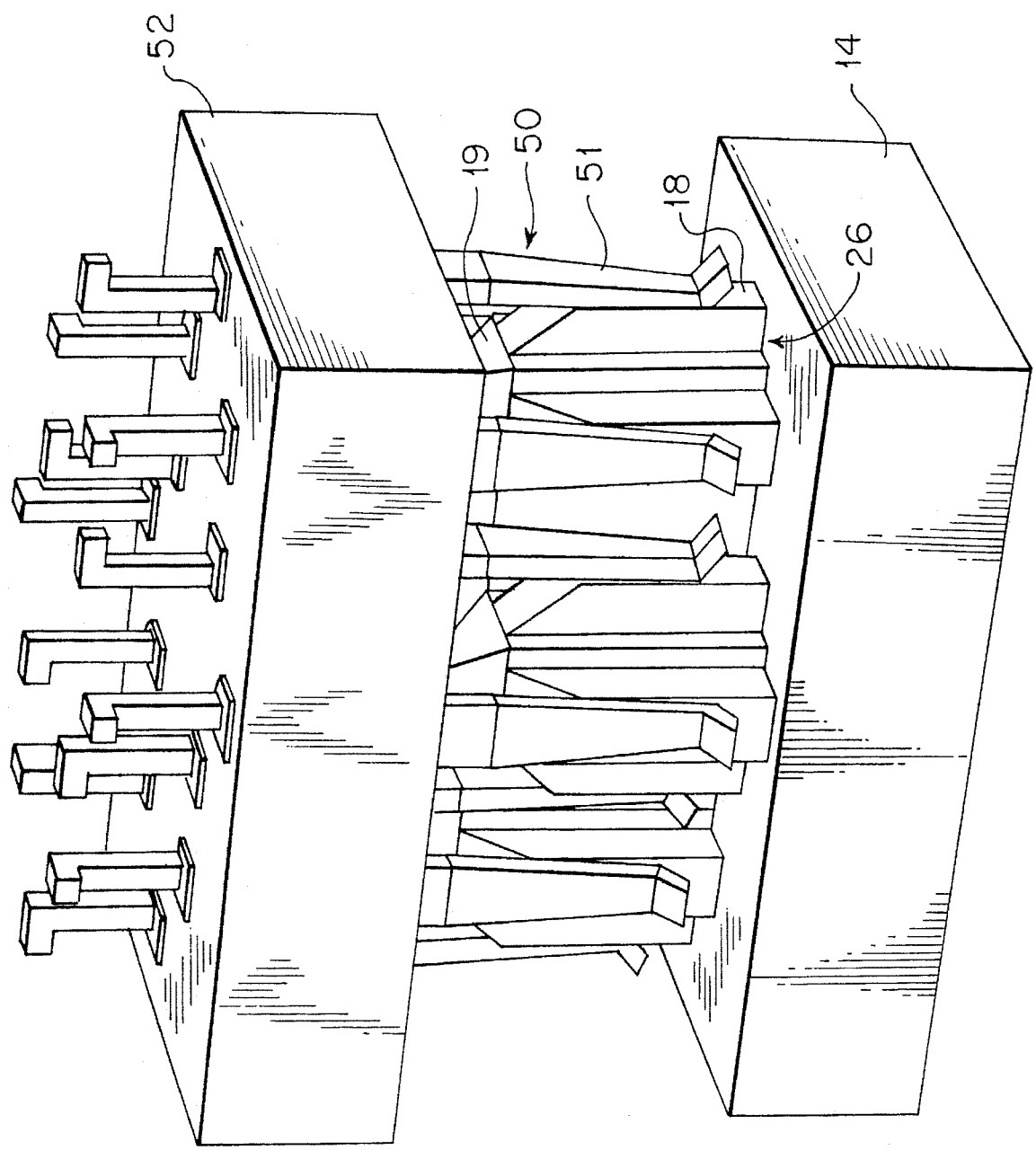

FIG. 67(b) is a perspective view of an electrical interconnect system in the mated condition.

Figure 68A:
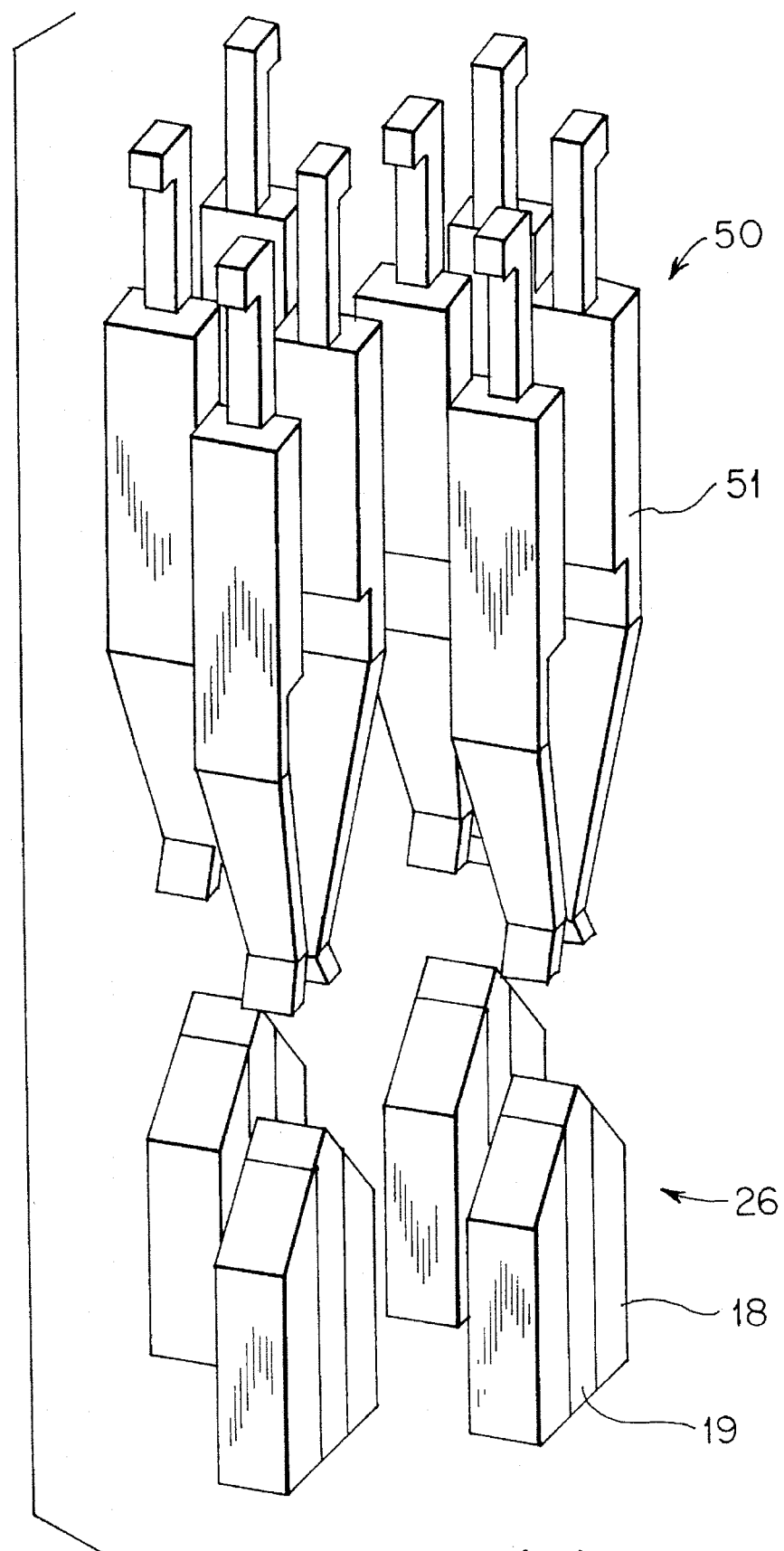

FIG. 68(a) is a perspective view of an electrical interconnect system grouped in a diamond-shape in a position prior to mating.

Figure 68C:
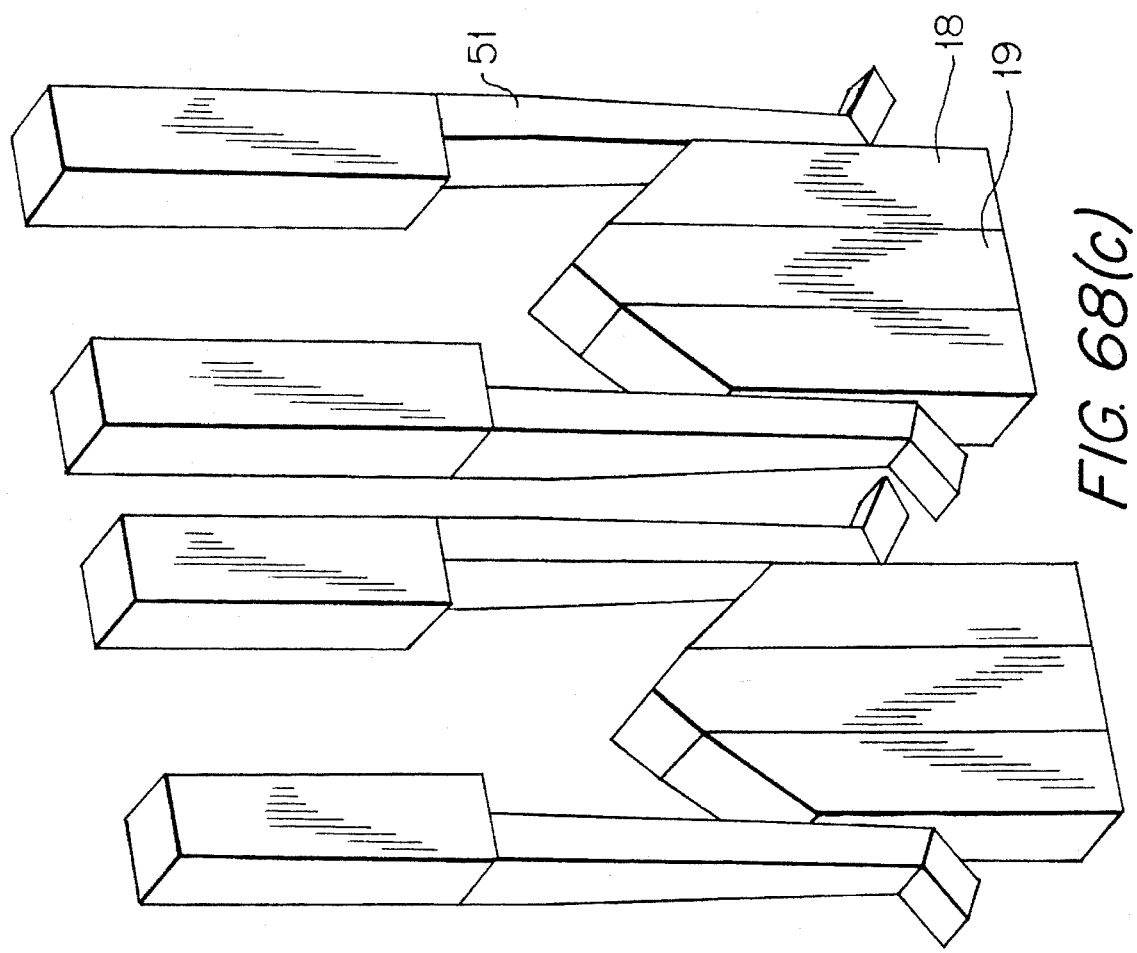
Figure 68B:
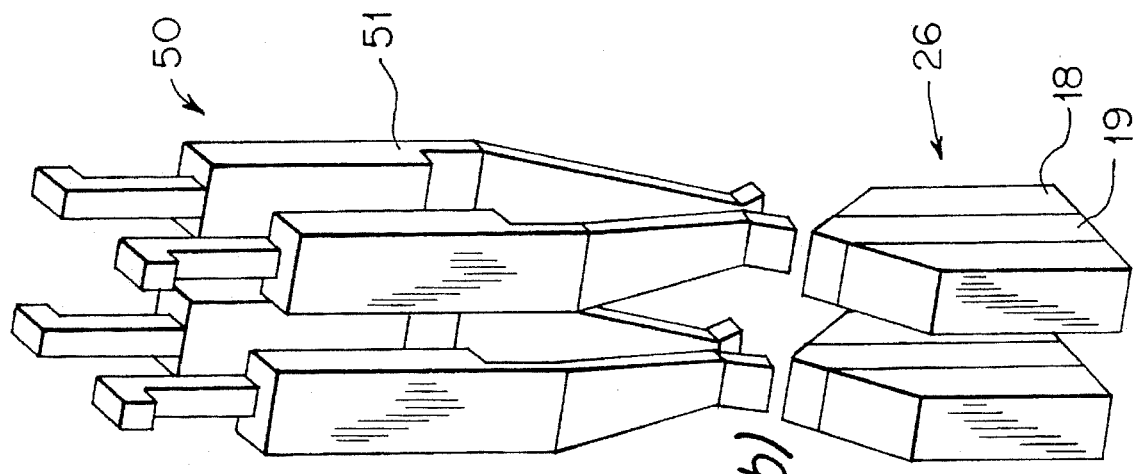

FIG. 68(b) is a perspective view of an electrical interconnect system in a position prior to mating.

FIG. 68(c) is a perspective view of a mated electrical interconnect system in accordance with the present invention.

Figure 69B:
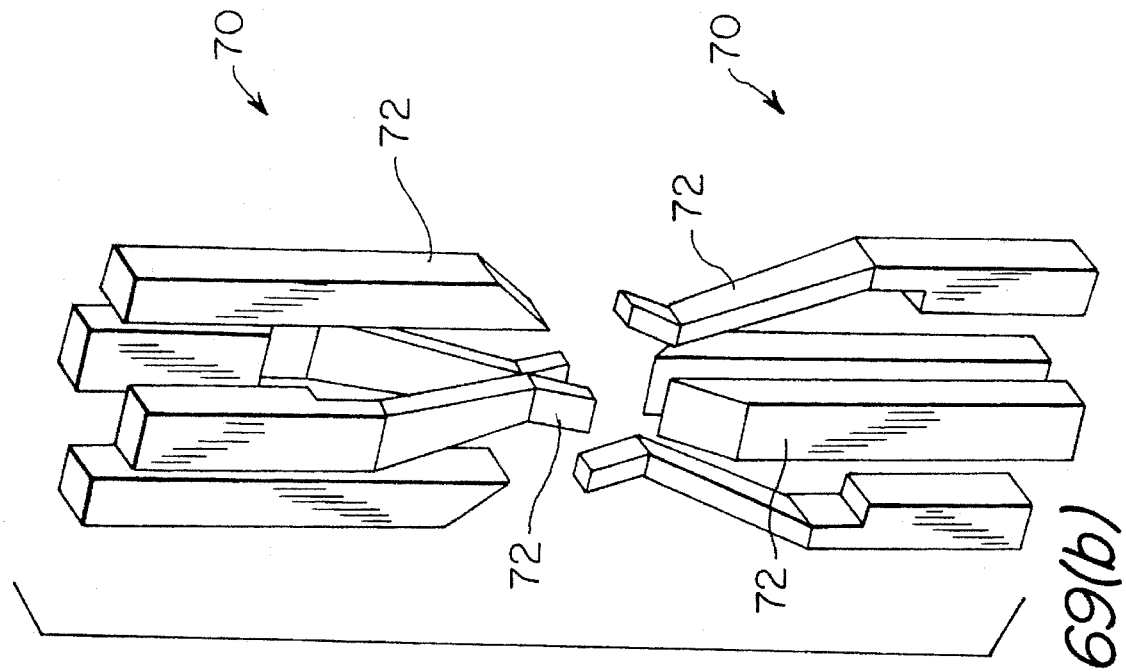
Figure 69A:
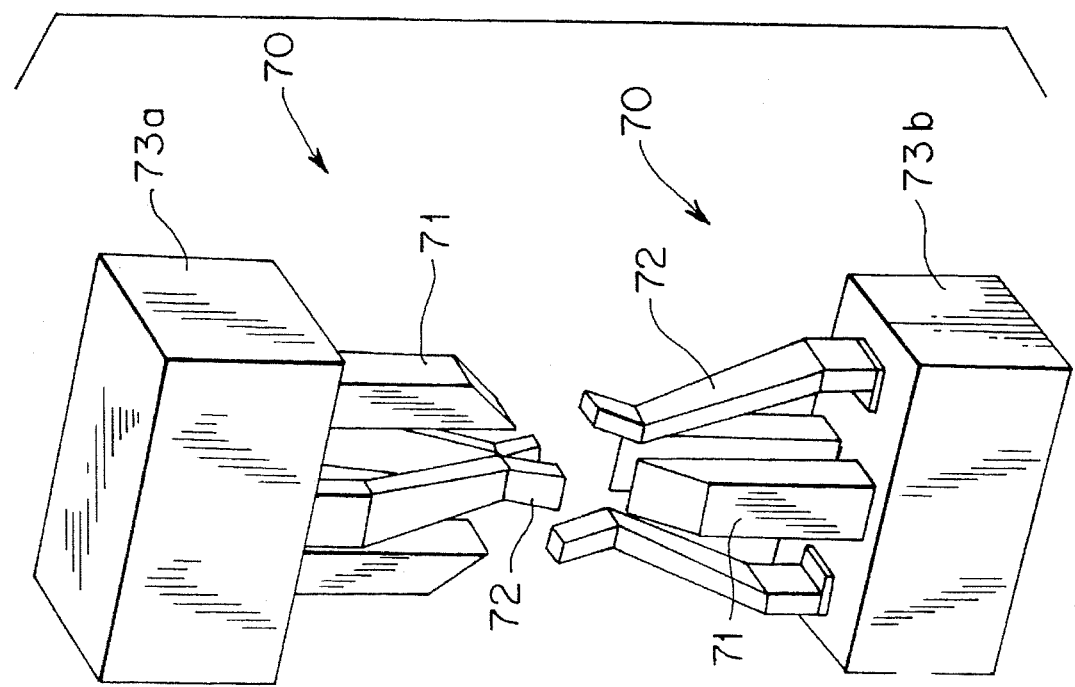

FIG. 69(a) is a perspective view of an electrical interconnect system using hybrid electrical interconnect components prior to mating.

FIG. 69(b) is a perspective view of contacts for the electrical interconnect system of FIG. 69(a) prior to mating.

Figure 70A:
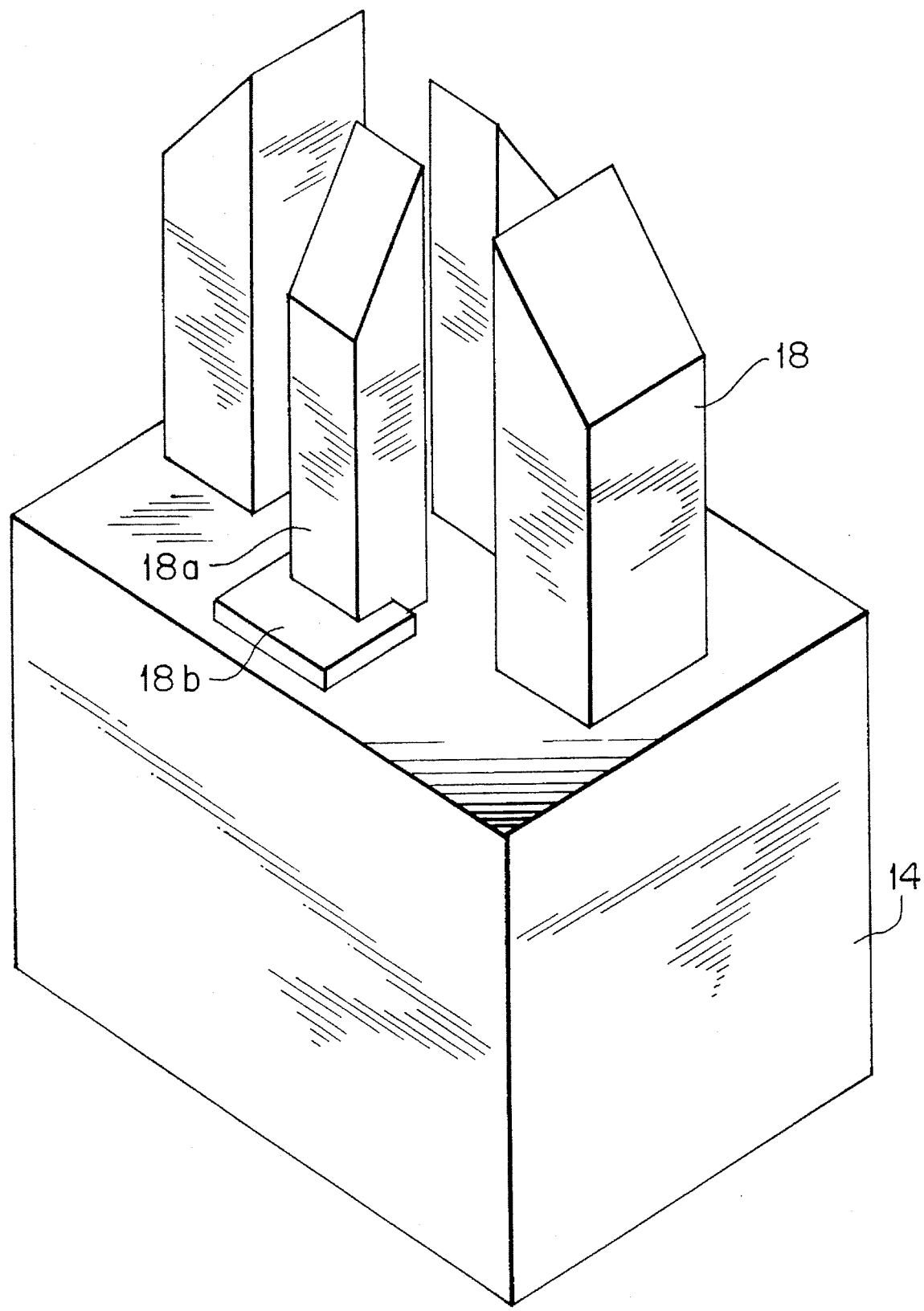

FIG. 70(a) is a perspective view of an embodiment of a projection-type electrical interconnect component in accordance with the present invention showing straight and offset posts.

Figure 70B:
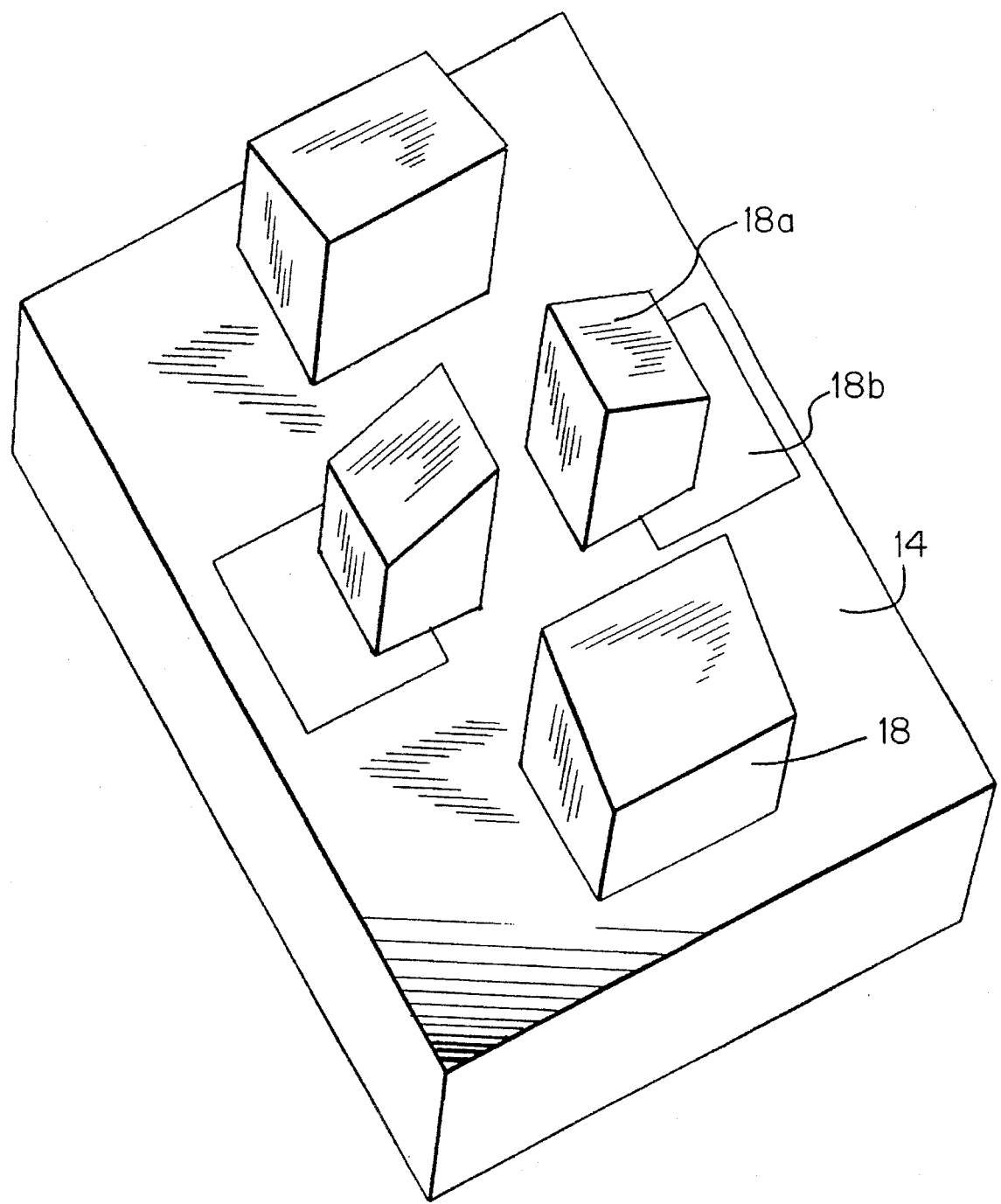

FIG. 70(b) is a perspective view of an embodiment of a projection-type electrical interconnect component in accordance with the present invention showing straight and offset posts.

Figure 71:
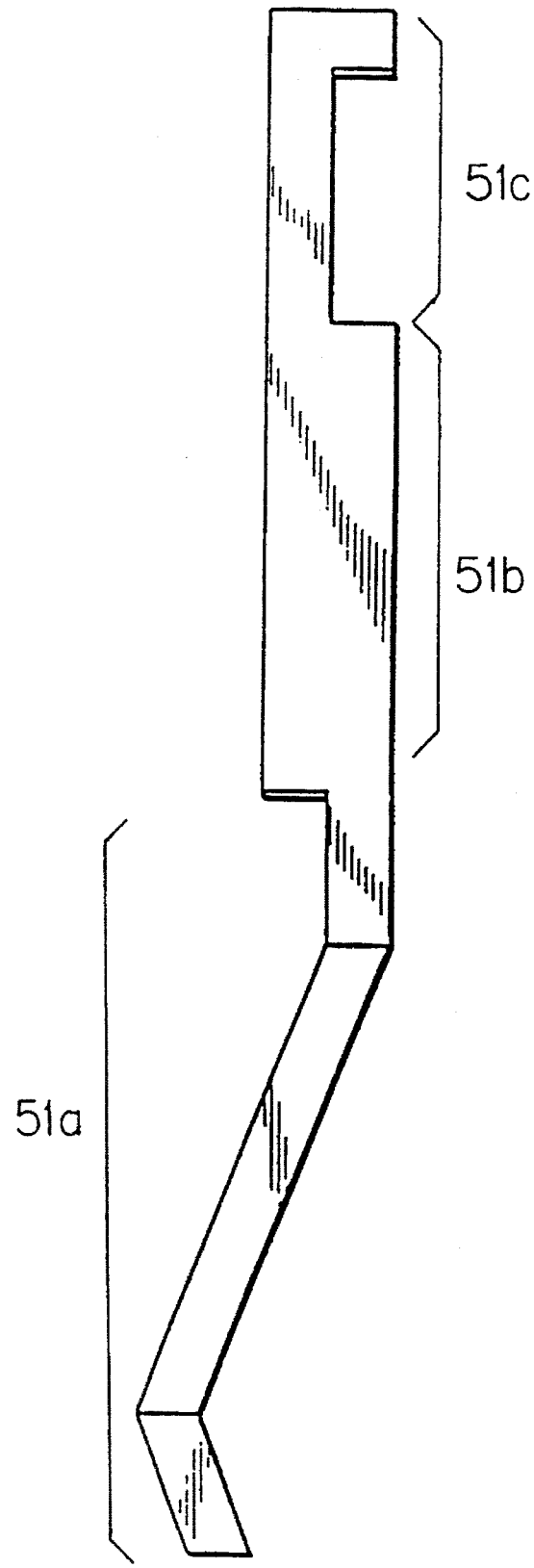

FIG. 71 a side view of a conductive beam having an offset contact portion.

Figure 72A:
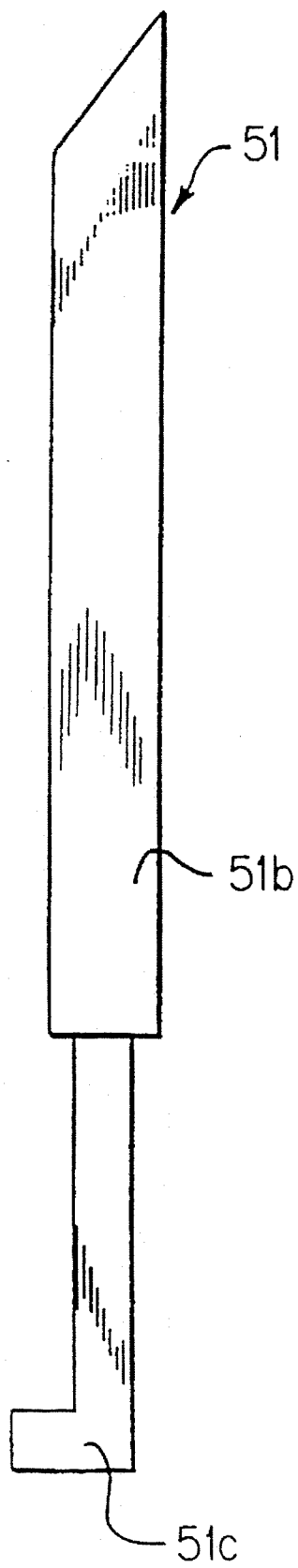

FIG. 72(a) is a side view of a conductive post having aligned stabilizing and foot portions.

Figure 72B:
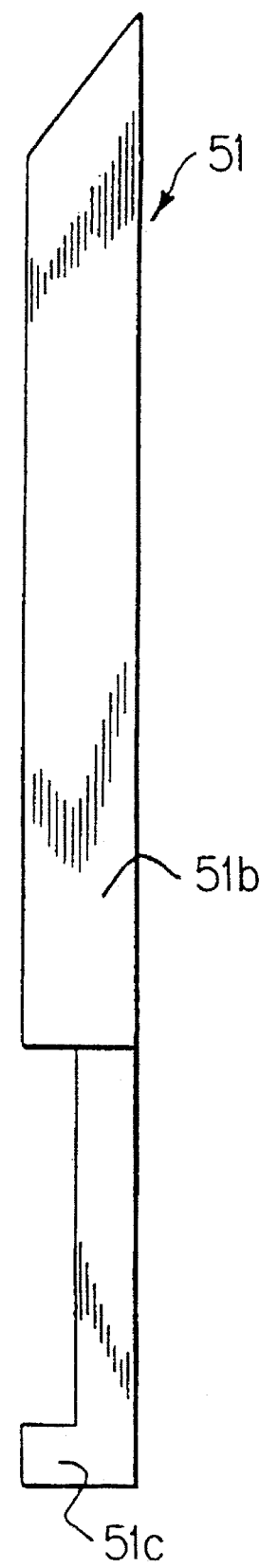

FIG. 72(b) is a side view of a conductive post having an offset foot portion.

FIG. 73(a) is a partial perspective view of a semiconductor die carrier in accordance with the present invention having contacts with bonding portions of different heights.

Figure 73B:
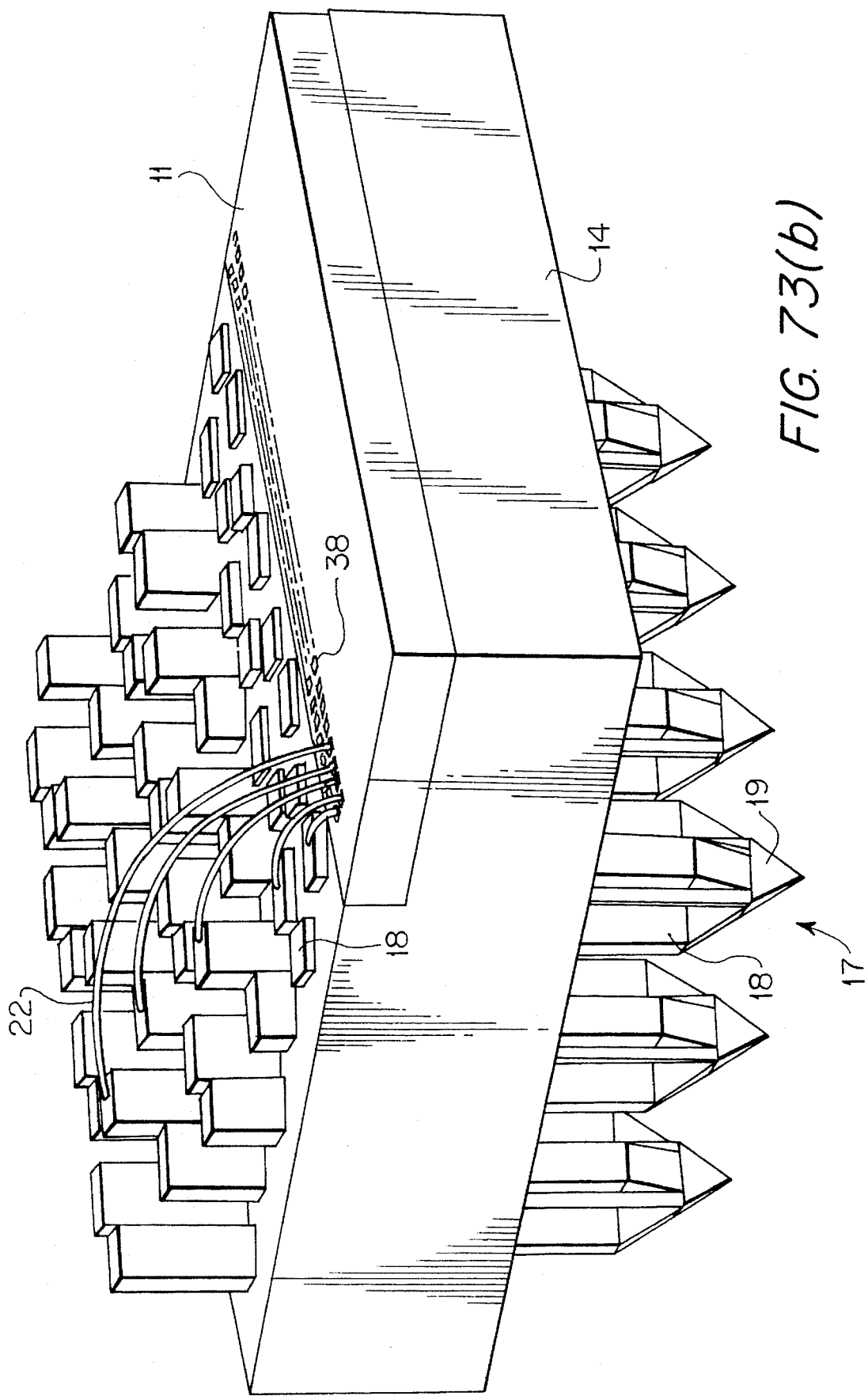

FIG. 73(b) is a partial perspective view of the semiconductor die carrier of FIG. 73(a) showing wire bond details.

FIG. 73(c) is a partial perspective view of the semiconductor die carrier illustrated in FIG. 73(a) showing wire bond details and an insulating separator.

Figure 74:
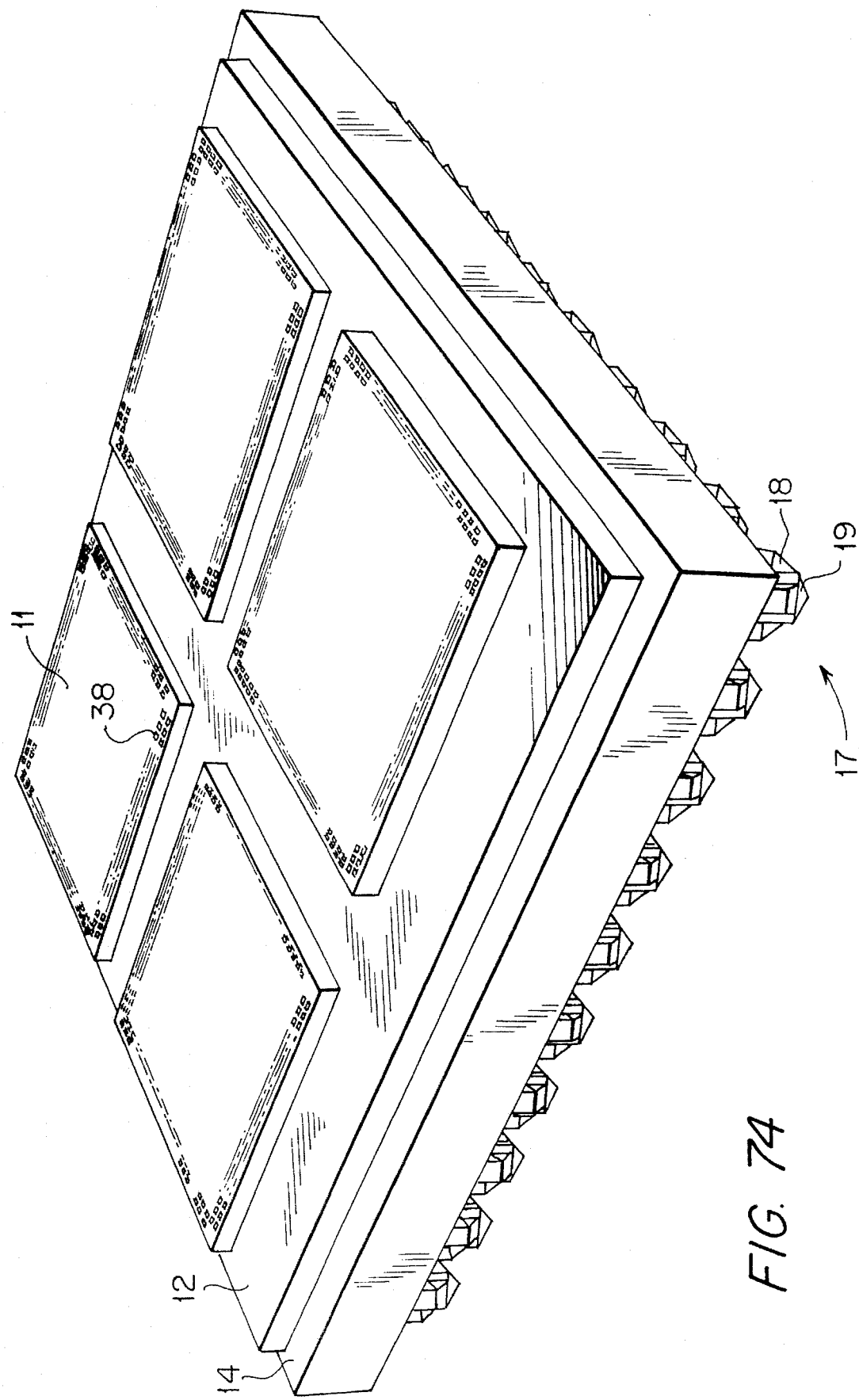

FIG. 74 is a partial perspective view of a semiconductor die carrier in accordance with the present invention incorporating multiple dies.

Figure 75:
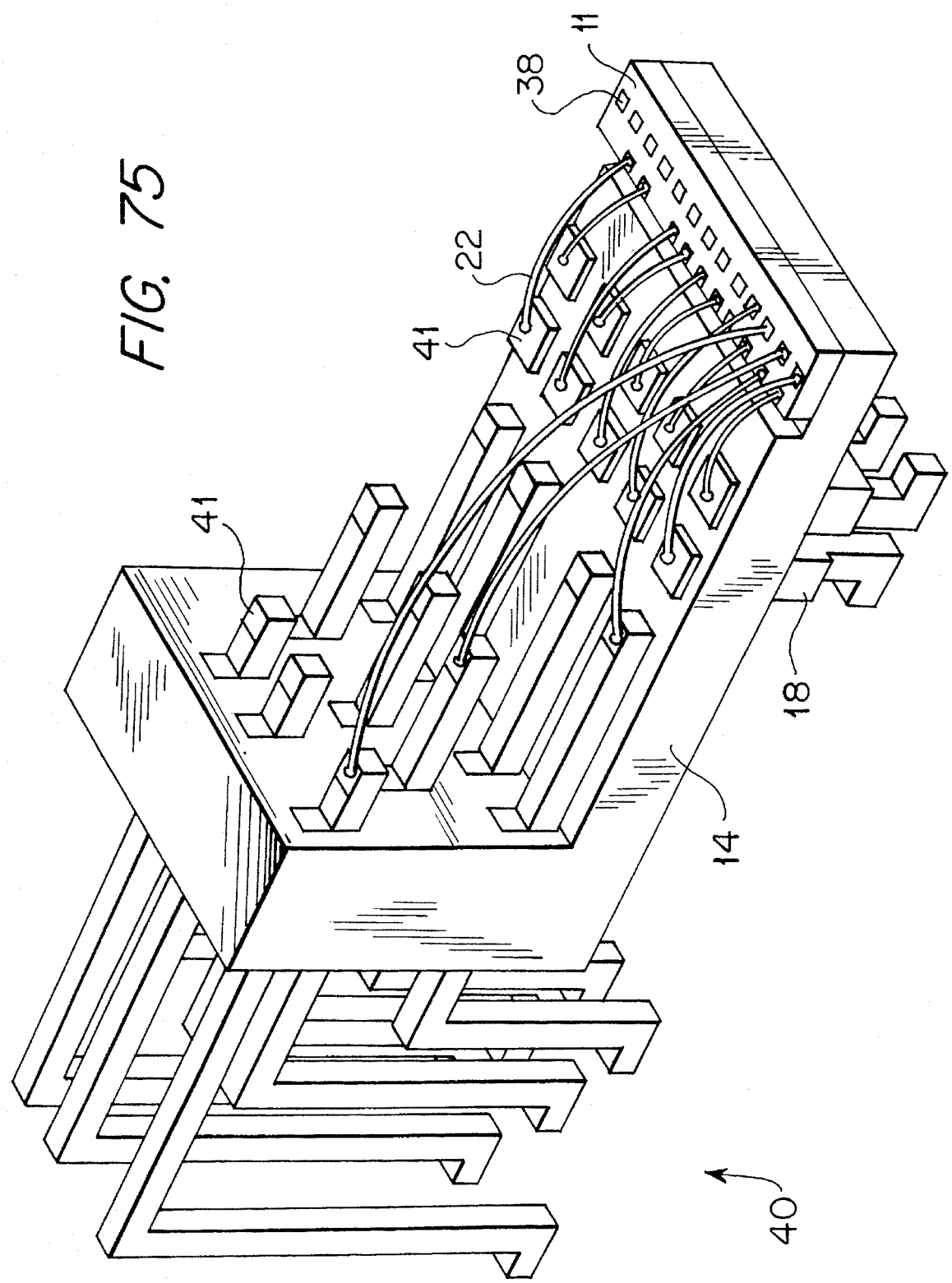

FIG. 75 is a partial perspective view of a semiconductor die carrier in accordance with the present invention having downwardly-extending leads and sideways-extending leads.

Figure 76:
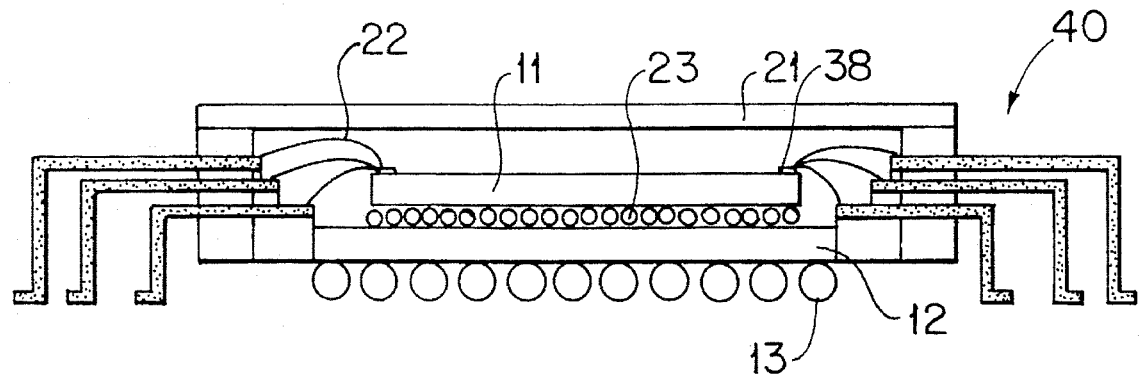

FIG. 76 is a side view of a semiconductor die carrier in accordance with the present invention incorporating a die having bonding connections on the upper and lower surface thereof, with the upper, surface connecting to sideways-extending leads and the lower surface connecting to a BGA.

Figure 77:
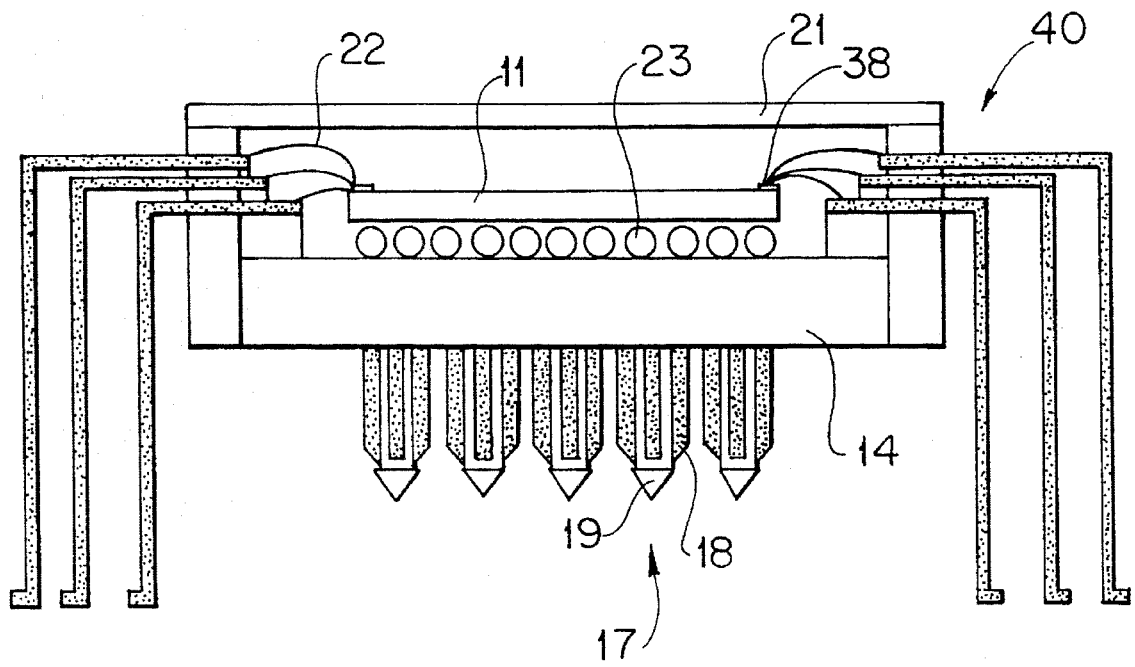

FIG. 77 is a side view of a semiconductor die carrier in accordance with the present invention incorporating a die having bonding connections on the upper and lower surfaces thereof, with the upper surface connecting to sideways-extending leads and the lower surface connecting to a plurality of electrical interconnect components.

Figure 78:
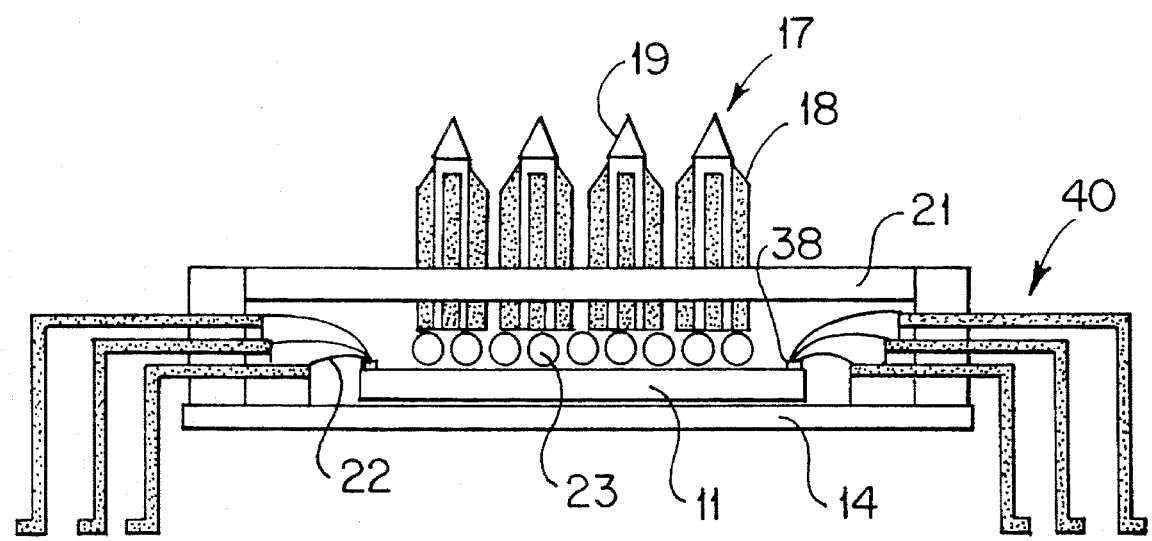

FIG. 78 is a side view of a semiconductor die carrier in accordance with the present invention incorporating a die having bonding connections on the upper surface thereof, with the upper surface connecting to both sideways-extending leads and a plurality of electrical interconnect components.

Figure 79:
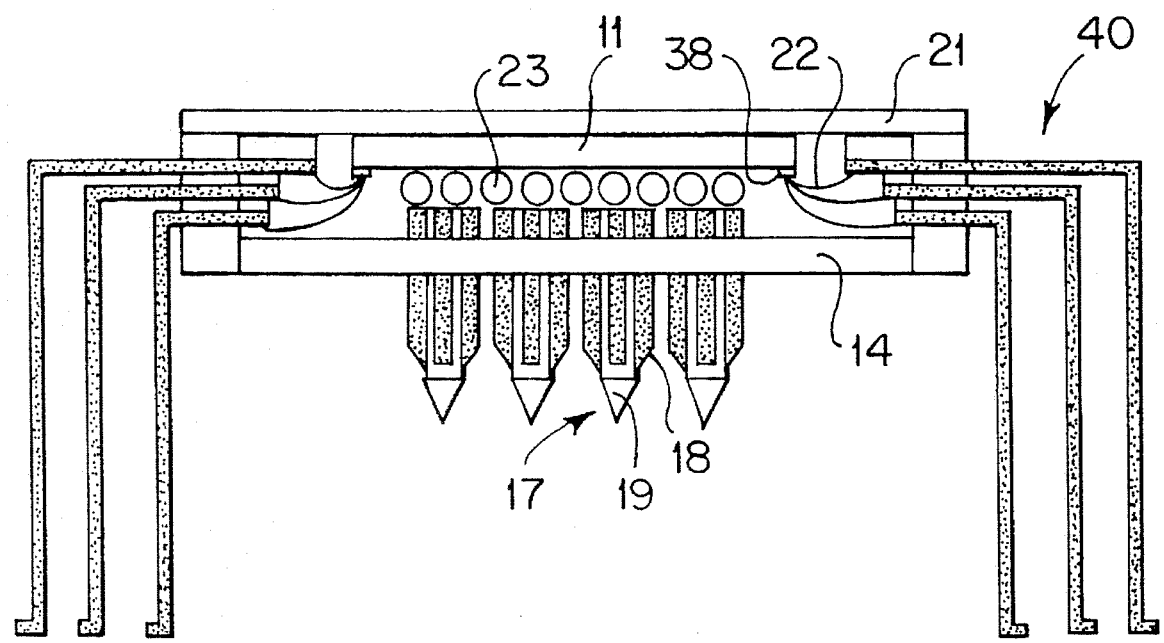

FIG. 79 is a side view of a flip-chip semiconductor die carrier in accordance with the present invention incorporating a die having bonding connections on the lower surface thereof, with the lower surface connecting to both sideways-extending leads and a plurality of electrical interconnect components.

Figure 80:
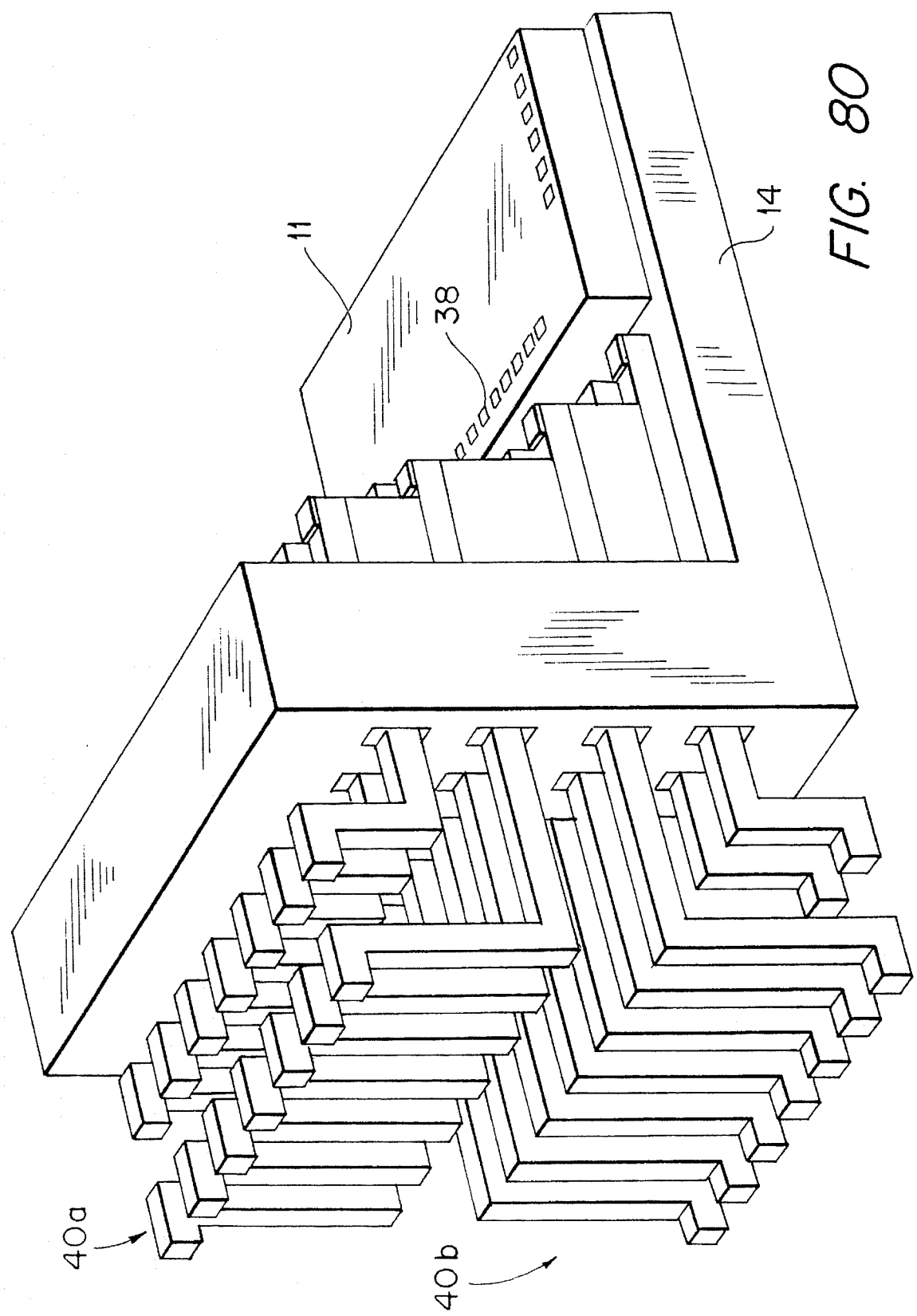

FIG. 80 is a partial perspective view of a semiconductor die carrier in accordance with the present invention having upwardly-oriented and downwardly-oriented sideways-extending leads.

DESCRIPTION OF THE PREFERRED EMBODIMENT

A prefabricated semiconductor die carrier in accordance with the present invention can support over 1,000 contacts (leads) per square inch in either pluggable or SMT-compatible configurations. Because it has a greater contact density, the semiconductor die carrier of the present invention allows for more grounding leads, permitting increased signal speed and more efficient noise reduction.

In accordance with the present invention, semiconductor dies can be housed in significantly smaller, prefabricated packages than those currently available. The packages for the semiconductor die carrier of the present invention can be pluggable or SMT-compatible.

The present invention supports various die attach methods, including TAB, C4, and wire bonding. Moreover, the present invention minimizes the distance electrical signals need to travel after leaving the die and before reaching the PCB or cable or other interface surface, thereby reducing noise in the signals and the power requirements of the semiconductor die carrier.

In accordance with one aspect of the present invention, a semiconductor die carrier having a high-density of pluggable contacts may be provided. In accordance with another aspect of the present invention, a semiconductor die carrier having a high-density of SMT contacts with improved stability may be provided.

Details relating to the present invention will now be discussed with reference to the accompanying drawings. For the sake of convenience, the same reference numerals will be used to designate the same or similar components of the present invention in the accompanying drawings.

Figure 1:
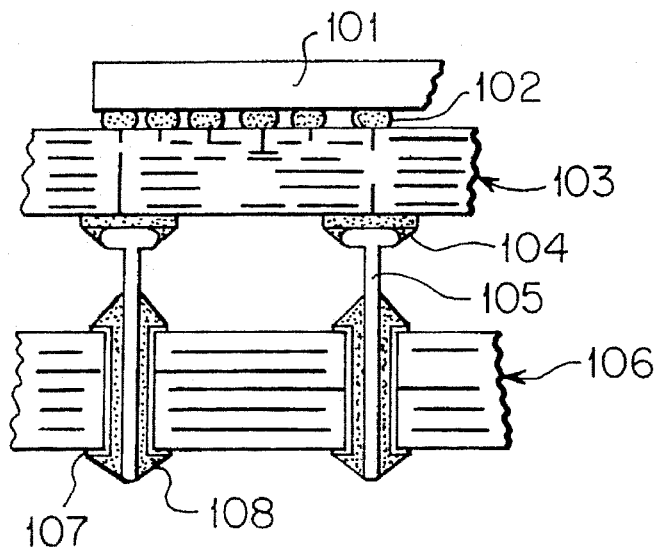
FIG. 1 is a side view of components of a semiconductor package manufactured in accordance with a conventional C4 bonding technique.
Figure 2:
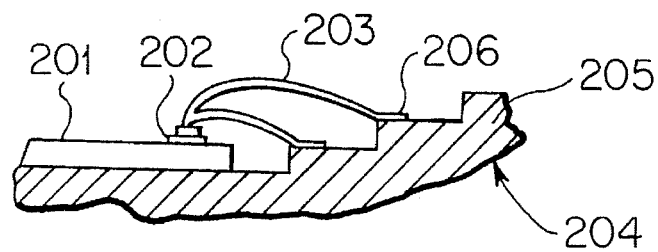
FIG. 2 is a side view of components of a semiconductor package configured in accordance with a conventional wire bonding technique.
Figure 3:
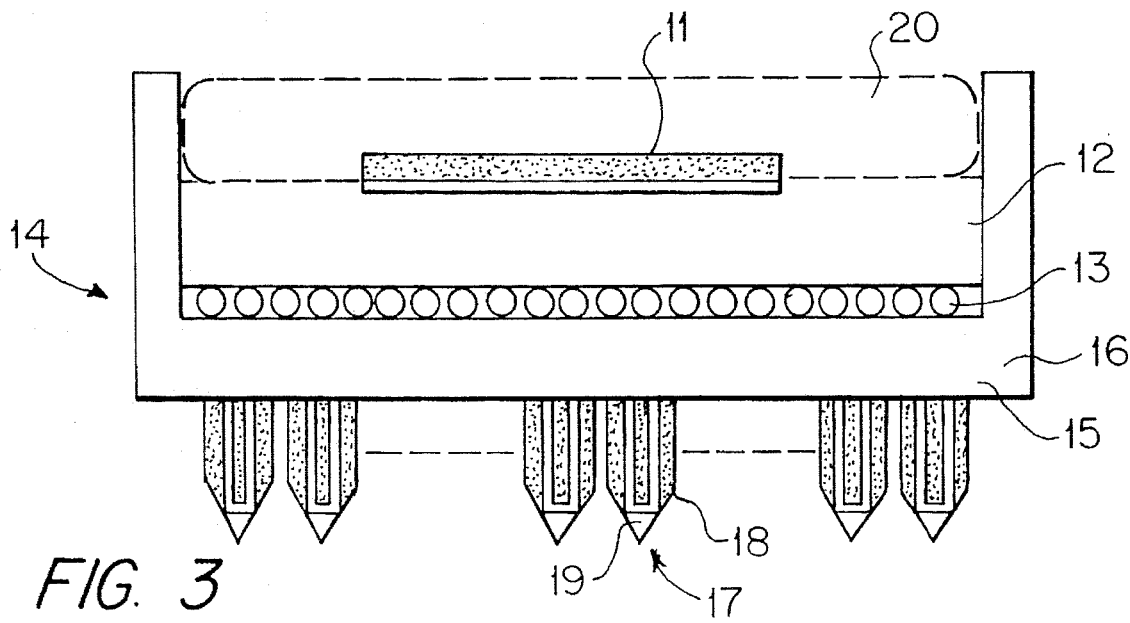
FIG. 3 is a side view of an embodiment of a semiconductor die carrier in accordance with the present invention.

A side view of an embodiment of a semiconductor die carrier in accordance with the present invention is shown in FIG. 3. In accordance with the embodiment of FIG. 3, the semiconductor die carrier includes a semiconductor die 11; a multi-layer conductive substrate 12, including insulative material having multiple conductive traces formed therein; a BGA (Ball Grid Array) comprising an arrangement of solder balls 13; an insulative substrate 14 having a floor 15 and a set of side walls 16, the number of side walls depending on the package configuration; a plurality of electrical interconnect components 17 each comprising a plurality of electrically conductive contacts 18 and, optionally, an insulative buttress 19; and encapsulation material 20 for sealing the semiconductor die 11 within the semiconductor carrier. The conductive contacts 18 function as leads for the semiconductor die carrier.

The semiconductor die 11 in accordance with the present invention may be a semiconductor die having a single row of bonding pads arranged along each of its edges, a semiconductor die having, for example, two or more rows of bonding pads arranged along each of its edges, or a semiconductor die having a plurality of conductive lands formed thereon suitable for mounting in accordance with C4 or other technology. Virtually any semiconductor die suitable for bonding in accordance with one or more of the C4, wire bond, TAB, or other techniques will suffice. The semiconductor die 11, therefore, may be bonded to the multi-layer conductive substrate using any of these bonding technologies. In the event C4 technology is used, the semiconductor die 11 is bonded to the multi-layer conductive substrate 12 via C4 interconnections formed from melted balls of solder (not shown in FIG. 3). In the event wire bond or TAB technology is used, the semiconductor die 11 is bonded to the multi-layer conductive substrate 12 via bonding pads formed on the die and corresponding bonding wires (not shown in FIG. 3).

The multi-layer conductive substrate 12 for the embodiment shown in FIG. 3 may be a board, printed wire board, or a board-like device having a configuration resembling that of a miniature PCB. The substrate 12 may be, for example, a board made of ceramic or other material (FR4, for example) and having vias, through-holes, and multiple levels of conductive traces formed therein. The conductive components of the substrate 12 provide a plurality of conductive paths between the semiconductor die 11 and the solder balls 13 of the BGA.

The BGA is an array of miniature solder balls 13 formed of a tin-lead compound, for example. The solder balls 13 of the BGA are arranged in a grid pattern that matches the pattern formed by the conductive contacts 18 of the electrical interconnect components 17 and the conductive portions formed on the lower surface of the multi-layer conductor 12. During manufacture of the semiconductor die carrier, the solder balls 13 of the BGA are melted to establish permanent electrical connections between the conductive portions of the multi-layer conductive substrate 12 and the conductive contacts 18 of the electrical interconnect components 17. As an alternative to using a BGA, a conductive adhesive may be used in place of the solder balls 13.

The insulative substrate 14 of the semiconductor die carrier is made of a high-temperature plastic, liquid crystal polymer, or insulative material having properties the same or similar to a liquid crystal polymer. Preferably, the material for the insulative substrate 14 is a liquid crystal polymer sold by Hoechst Celanese under the trademark VECTRA, which has a coefficient of thermal expansion that is the same or similar as the coefficient of thermal expansion for silicon.

The insulative substrate 14 includes a floor 15 and a plurality (e.g., four) of side walls 16. The entire substrate 14, including the floor 15 and side walls 16, can be formed as an integral unit in a single molding process, or the floor 15 and side walls 16 can be molded separately and then fastened together using an epoxy or other adhesive material.

During the molding process, a series of holes or passages (not shown in FIG. 3) are formed in the floor 15, each of the passages being configured to receive a corresponding one of the contacts 18 of the electrical interconnect components 17. As an alternative to forming the passages during the molding process, the passages could be added after molding by, for example, removing material of the substrate to form the passages. As a further alternative, the contacts 18 may be formed within the substrate 14 using an insert molding process wherein the contacts are held at a predetermined position and then the insulative material of the walls is molded or formed around the contacts.

The electrical interconnect components 17 can be projection-type interconnect components, such as those shown in FIG. 3, receiving-type interconnect components, hybrid-type interconnect components, or SMT-type interconnect components. Each projection-type interconnect component is configured for receipt within a corresponding receiving-type interconnect component, and each receiving-type interconnect component is configured to receive a corresponding projection-type interconnect component. In this manner, each projection-type interconnect component of the present invention can be mated with a corresponding receiving-type interconnect component. Each hybrid-type interconnect component is configured for mating with a corresponding hybrid-type interconnect component. Each SMT-type interconnect component is configured for SMT-mounting on a PCB or other interface surface. More specific discussion on the "projecting," "receiving," "hybrid," and "SMT-compatible" characteristics of the electrical interconnect components will be provided in greater detail below.

Each electrical interconnect component 17 comprises a plurality of conductive contacts 18. The contacts 18 are inserted into the floor 15 of the substrate 14 after formation of the passages in the floor or, alternatively, molded into the floor. In accordance with the insertion process, each of the contacts is inserted into a corresponding one of the passages. To facilitate high-volume production, the pins or contacts may be inserted very rapidly. The dimensions of the contacts 18 and the passages in the floor 15 are such that each contact 18 fits tightly within its corresponding passage. However, if desired, each contact 18 can be further fastened within its corresponding passage using an epoxy or other adhesive material.

In accordance with the present invention, when the electrical interconnect components 17 are, for example, projection-type interconnect components, such as the electrical interconnect components shown in FIG. 3, each of the projection-type interconnect components may optionally include, in addition to contacts 18, an insulative buttress 19. Like the insulative substrate 14, each buttress 19 may be made of a liquid crystal polymer. Preferably, the material for each buttress 19 is a liquid crystal polymer such as VECTRA (trademark). The buttresses can be integrally molded within the substrate 14 or, alternatively, can be adhered to the floor 15 of the substrate using an epoxy or other adhesive material after completion of the molding process. Preferably, although not required, formation of the buttresses 19 precedes insertion of the contacts 18 into the floor 15.

When the electrical interconnect components 17 of the semiconductor die carrier are projection-type interconnect components, such as the electrical interconnect components shown in FIG. 3, the semiconductor die carrier may be mounted by plugging the electrical interconnect components 17 into a corresponding set of receiving-type interconnect components. When the electrical interconnect components of the semiconductor die carrier are receiving-type interconnect components, the semiconductor die carrier may be mounted by plugging a corresponding set of projection-type interconnect components within the receiving-type interconnect components 17. When the electrical interconnect components are hybrid-type components, the semiconductor die carrier may be mounted by mating the hybrid-type components of the semiconductor die carrier with other hybrid-type components. In any of these configurations, the mounting of the semiconductor die carrier constitutes a reversible plugging procedure, so that the semiconductor die carrier can be unplugged at a later time to carry out, for example, board tests in the field. Alternatively, when the electrical interconnect components 17 of the semiconductor die carrier are SMT-compatible interconnect components, mounting of the semiconductor die carrier entails soldering the contacts 18 onto a PCB or other like interface surface.

The encapsulation material 20, which can be a thermally conductive material such as a liquid crystal polymer such as VECTRA (trademark), epoxy, or other material, seals the semiconductor die 11 within the semiconductor die carrier. Such sealing retains the internal components of the carrier, prevents contamination, and performs a heat sink function.

Figure 4:
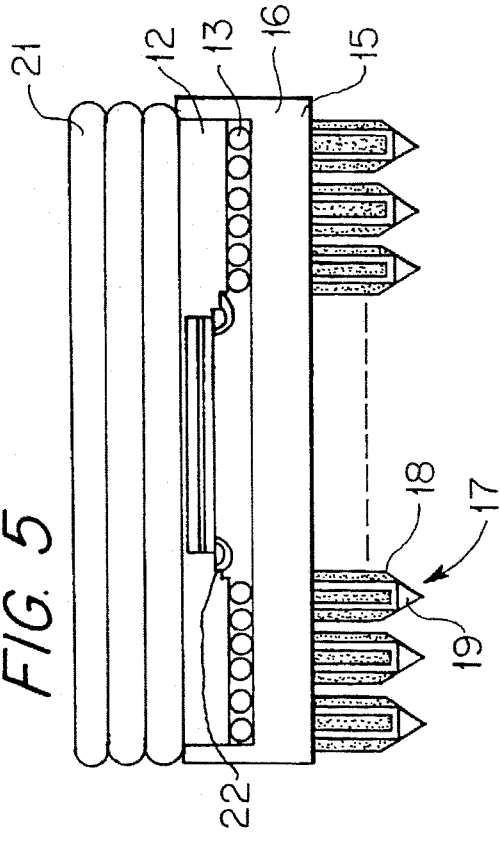
FIG. 4 is a side view of a cap configuration in accordance with the microconductor die carrier of the present invention.
Figure 5:
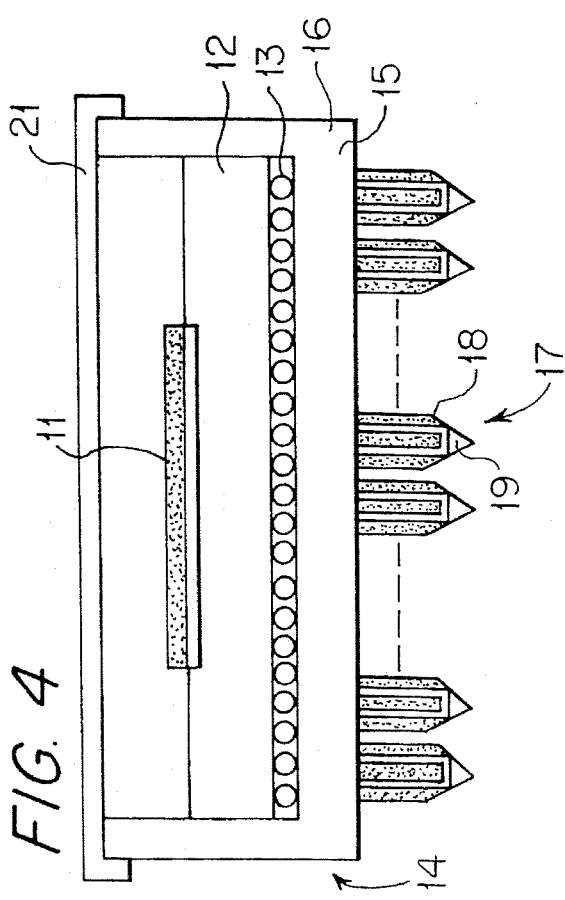
FIG. 5 is a side view of a cavity-down configuration in accordance with the present invention.

As an alternative to sealing the semiconductor die within encapsulation material, the semiconductor die could be capped with a thermally conductive plastic or metal heat sink cap 21, as shown in FIG. 4. The empty space beneath the cap 21 may be a vacuum or may be filled with encapsulation material or air, for example. As with the encapsulation material 20, the heat sink cap 21 prevents contamination and dissipates heat. It should be noted that in accordance with the configuration of FIG. 4, the semiconductor die 11 could be mounted on the cap 21 in a flip-chip or cavity-down configuration, with the bonding pads of the die facing toward the floor 15. An example of a flip-chip configuration, incorporating a plurality of bonding wires 22, is shown in FIG. 5. The flip-chip configuration is applicable to other embodiments of the present invention as well.

As semiconductor designs become more powerful, heat dissipation becomes critical to the design of semiconductor packages. Preferably, in accordance with the present invention, the die is in close proximity or in contact with the cap 21. FIG. 5 illustrates an example where the die 11 contacts the cap 21.

In conventional PGA-type semiconductor packages, the die is placed within a ceramic material, and then a metal heat sink is bonded to the ceramic material to facilitate heat dissipation. The semiconductor die carrier of the present invention, on the other hand, is manufactured with the heat sink forming a part of the package. Thus, the semiconductor die carrier of the present invention, using a multi-piece package having different pieces with different thermal conductivities, is more efficient and can use less material than conventional semiconductor packages.

Figure 6:
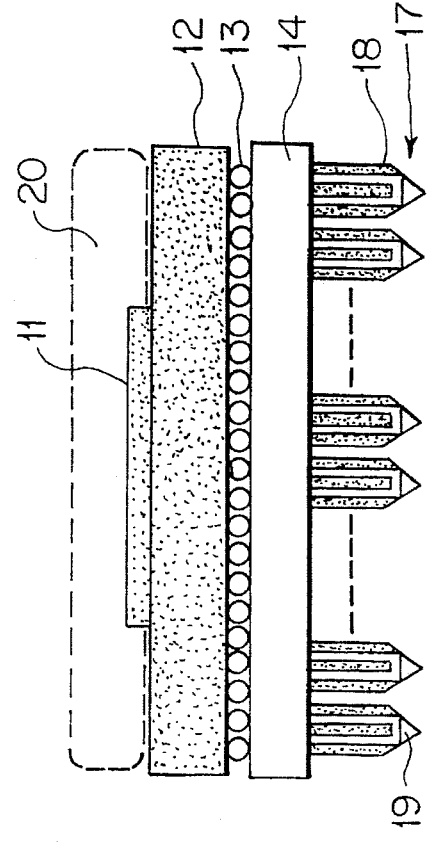
FIG. 6 is a side view of a configuration without side walls in accordance with the present invention.

From the configuration shown in FIG. 6, it can be seen that the embodiment of FIG. 3 may be manufactured using a substrate 14 without side walls. In this configuration, the material 20 for retaining the semiconductor die, preventing contamination, and providing a heat sink function, may be an epoxy encapsulation material, a molding compound, or a liquid crystal polymer such as VECTRA (trademark), for example.

Figure 7:
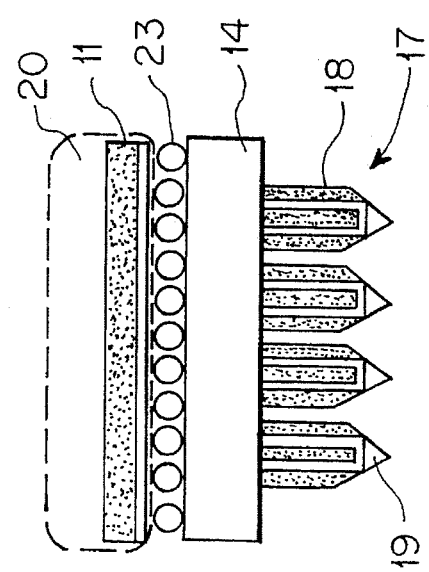
FIG. 7 is a side view of another embodiment of a semiconductor die carrier in accordance with the present invention.

A side view of another embodiment of a semiconductor die in accordance with the present invention is shown in FIG. 7. In accordance with the embodiment of FIG. 7, the semiconductor die carrier may include a semiconductor die 11; an insulative substrate 14; a plurality of electrical interconnect components 17, each comprising a plurality of electrically conductive contacts 18 and, optionally, if the electrical interconnect components are hybrid-type interconnect components, or projection-type interconnect components such as those depicted in FIG. 7, an insulative buttress 19; and an encapsulation material or molding compound 20 for sealing the semiconductor die 11 within the semiconductor die carrier. The conductive contacts 18 function as leads for the semiconductor die carrier.

Unlike the embodiment of the semiconductor die carrier illustrated in FIG. 3, the embodiment of FIG. 7 does not use a multi-layer conductive substrate 12, a BGA 13, or an insulative substrate 14 having side walls 16. Instead, in the embodiment of the semiconductor die carrier illustrated in FIG. 7, the semiconductor die 11 is directly connected to the insulative substrate 14 via C4 interconnections in contact with the semiconductor die and, therefore, components such as multi-layer conductive substrate 12 and BGA 13 can be eliminated in this embodiment. The elimination of these extra components allows the provision of a semiconductor die carrier that is very low in profile and, at the same time, affords a very high-density external interface.

With respect to the embodiment of FIG. 7, the semiconductor die 11, which may be a 13.0 mm×13.0 mm die, is preferably bonded directly to the substrate 14 using C4 interconnections. The C4 interconnections are formed using an array of solder balls 23 formed of tin-lead, for example. The balls of solder for the C4 interconnections may have a diameter of 0.2 mm, for example, prior to melting. The solder balls 23 for the C4 interconnections are arranged in a grid pattern that matches the pattern formed by the conductive contacts 18 of the electrical interconnect components 17 and lands on the landed or appropriate surface of the die. During manufacture of the semiconductor die carrier, the solder balls 23 for the C4 interconnections are melted to establish permanent electrical connections between the conductive portions or lands on the lower surface of the semiconductor die 11 and the conductive contacts 18 of the electrical interconnect components 17.

Figure 8:
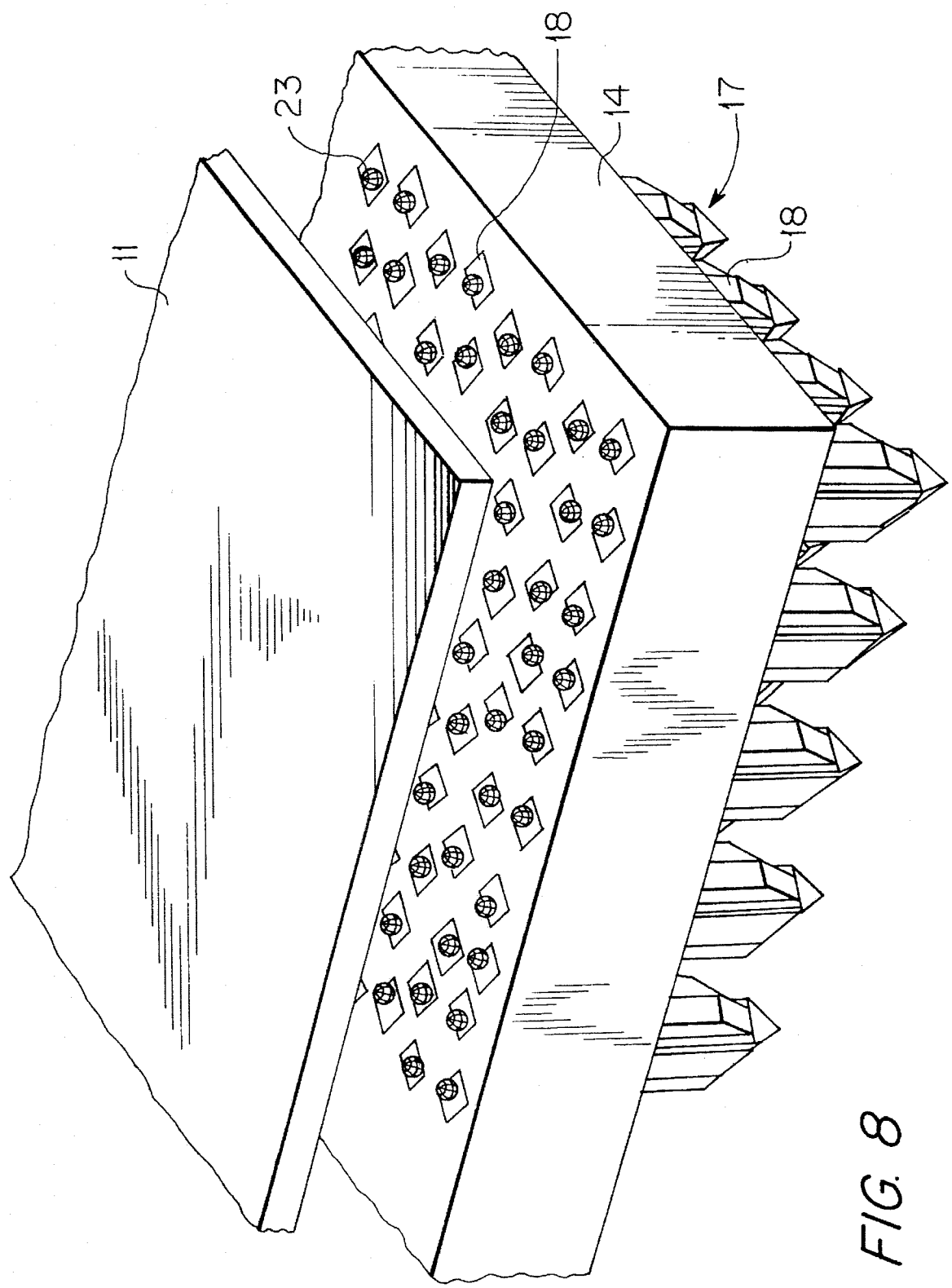
FIG. 8 is a partial perspective view of portions of a semiconductor die carrier in accordance with the present invention.

FIG. 8 is a partial perspective view in accordance with the embodiment of the semiconductor die carrier shown in FIG. 7, illustrating the semiconductor die 11 prior to its bonding to the insulative substrate 14 via C4 interconnections. An exemplary grid pattern of the solder balls 23 for the C4 interconnections can be understood from FIG. 8. After melting, a permanent electrical interconnection exists between conductive portions on the lower surface of the semiconductor die 11 and the portions of the electrically conductive contacts 18 extending above the upper surface of the insulative substrate 14.

FIG. 8 depicts that for the embodiment of the semiconductor die carrier of FIG. 7, the area occupied by the entire semiconductor die carrier is approximately equal to the size of the semiconductor die itself. No conventional package known to the inventors can be configured to have such compact dimensions.

The insulative substrate 14 for the semiconductor die carrier of FIG. 7, like the substrate 14 for the embodiment of the semiconductor die carrier of FIG. 3, is made of a high-temperature plastic, liquid crystal polymer, or insulative material having properties the same or similar to a liquid crystal polymer. Preferably, the material for the insulative substrate 14 is a liquid crystal polymer such as VECTRA (trademark). Moreover, as with the embodiment of the semiconductor die carrier shown in FIG. 3, the electrical interconnect components 17 can be projection-type interconnect components, as depicted in FIG. 7, receiving-type interconnect components, hybrid-type interconnect components, or SMT-type interconnect components. Thus, the semiconductor die carrier of FIG. 7 can either be pluggable or SMT-compatible.

Figure 9:
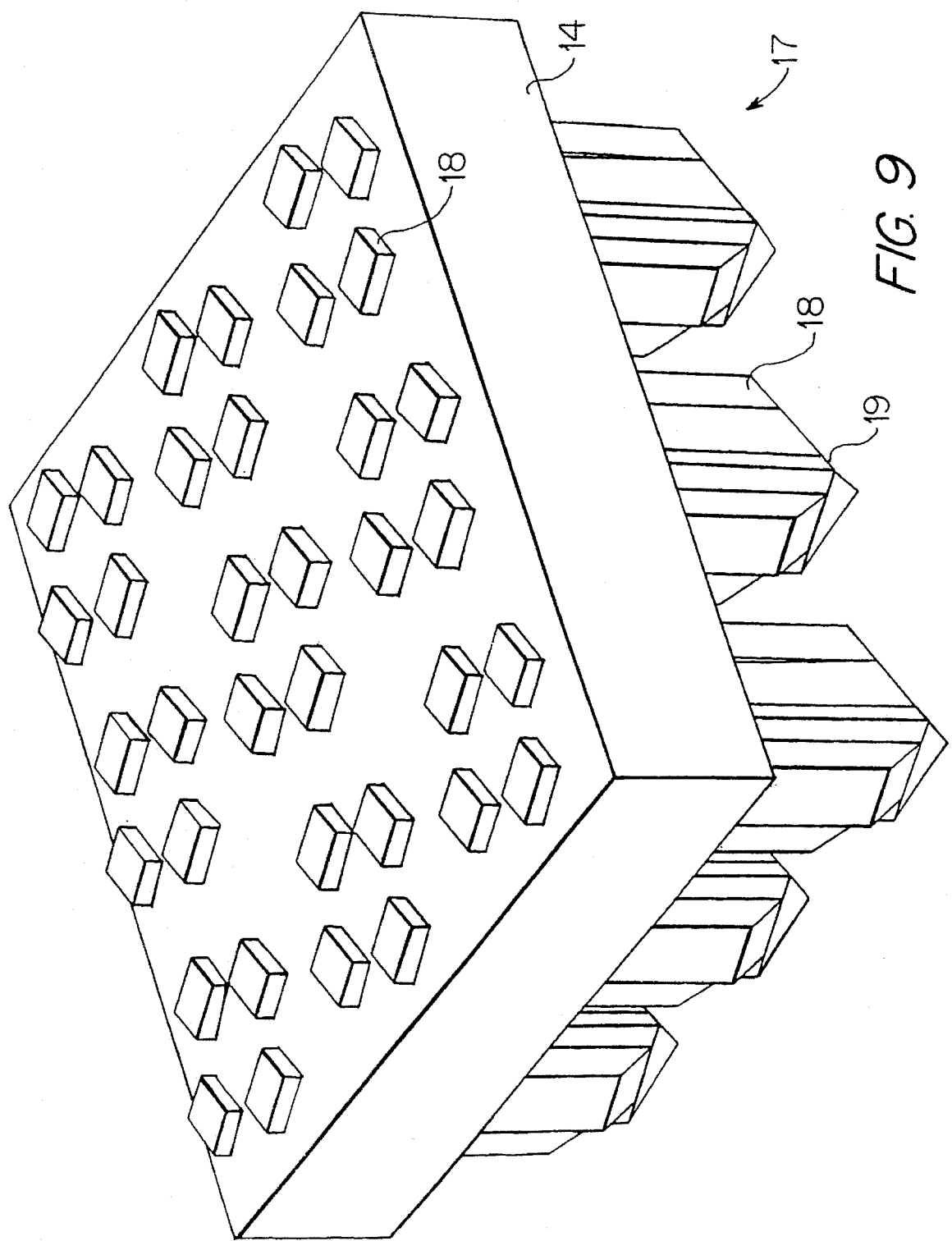
FIG. 9 is a partial perspective view of a semiconductor die carrier in accordance with the present invention.
Figure 10:
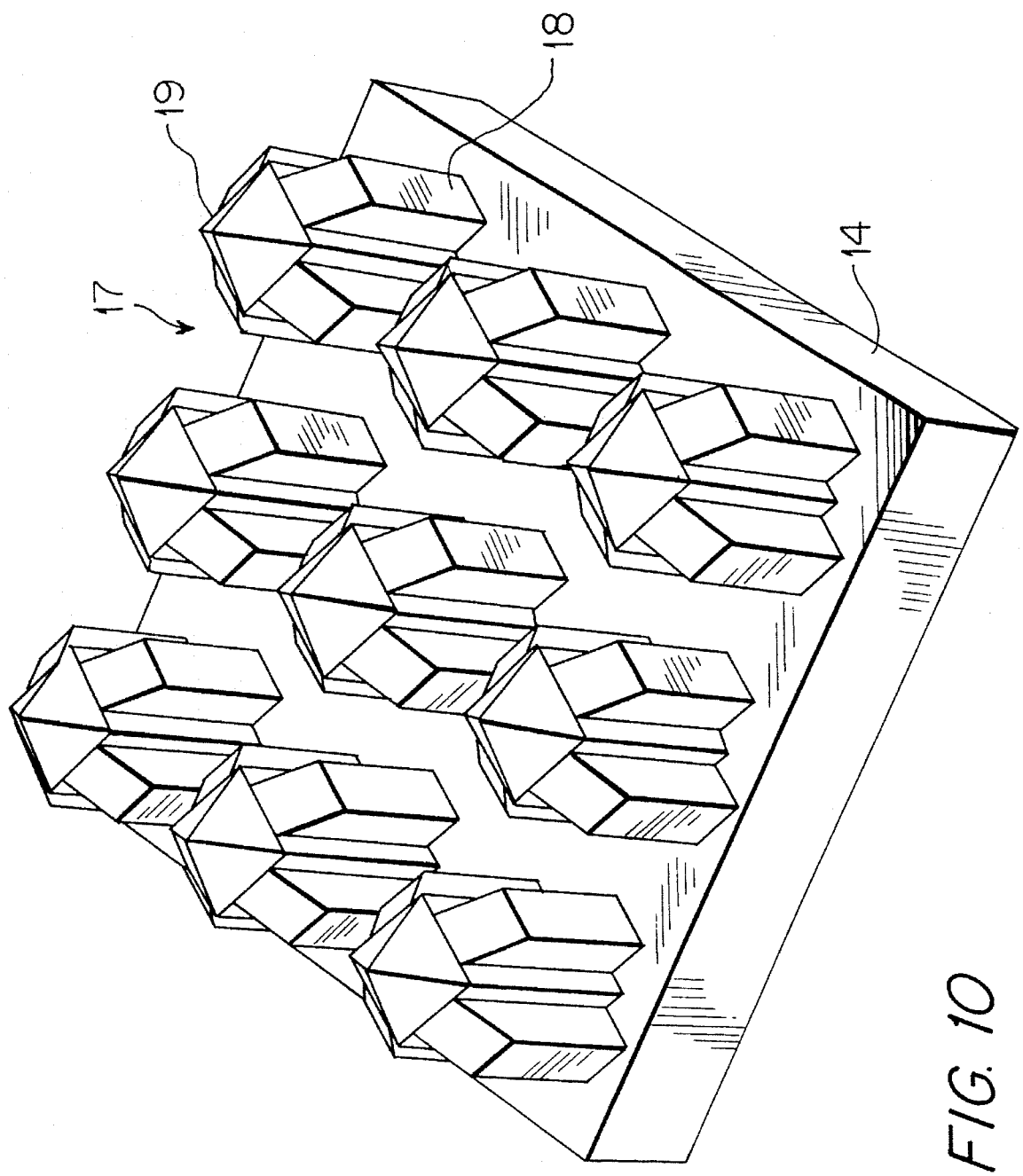
FIG. 10 is another partial perspective view of a semiconductor die carrier in accordance with the present invention.

FIG. 9 is a partial view of the insulative substrate 14 connected to the electrical interconnect components 17. FIG. 10 is another partial view of the insulative substrate 14 connected to the electrical interconnect components 17. In FIGS. 9 and 10, each of the electrical interconnect components 17 is a projection-type electrical interconnect component including conductive contacts 18 and a buttress 19.

As seen from FIG. 9, a grid pattern is formed by the portions of the contacts 18 extending above the insulative substrate 14. When bonding to a BGA in accordance with the embodiment of the semiconductor die carrier of FIG. 3, the solder balls 13 of the BGA, prior to melting, are arranged in a grid pattern corresponding to the grid pattern of the contact portions 18 and also to the land pattern on the lower surface of the die 11. Similarly, when bonding to C4 interconnections in accordance with the embodiment of the semiconductor die carrier of FIG. 7, the solder balls 23 of the C4 interconnections, prior to melting, are arranged in a grid pattern corresponding to the grid pattern of the contacts 18 and also to the land pattern on the lower surface of the die 11. Thereafter, the solder balls are melted and then cooled to fasten the portions of the contacts 18 extending above the substrate 14 to either the multi-layer conductive substrate 12 or directly to the semiconductor die 11, depending on the embodiment in use.

Figure 11:
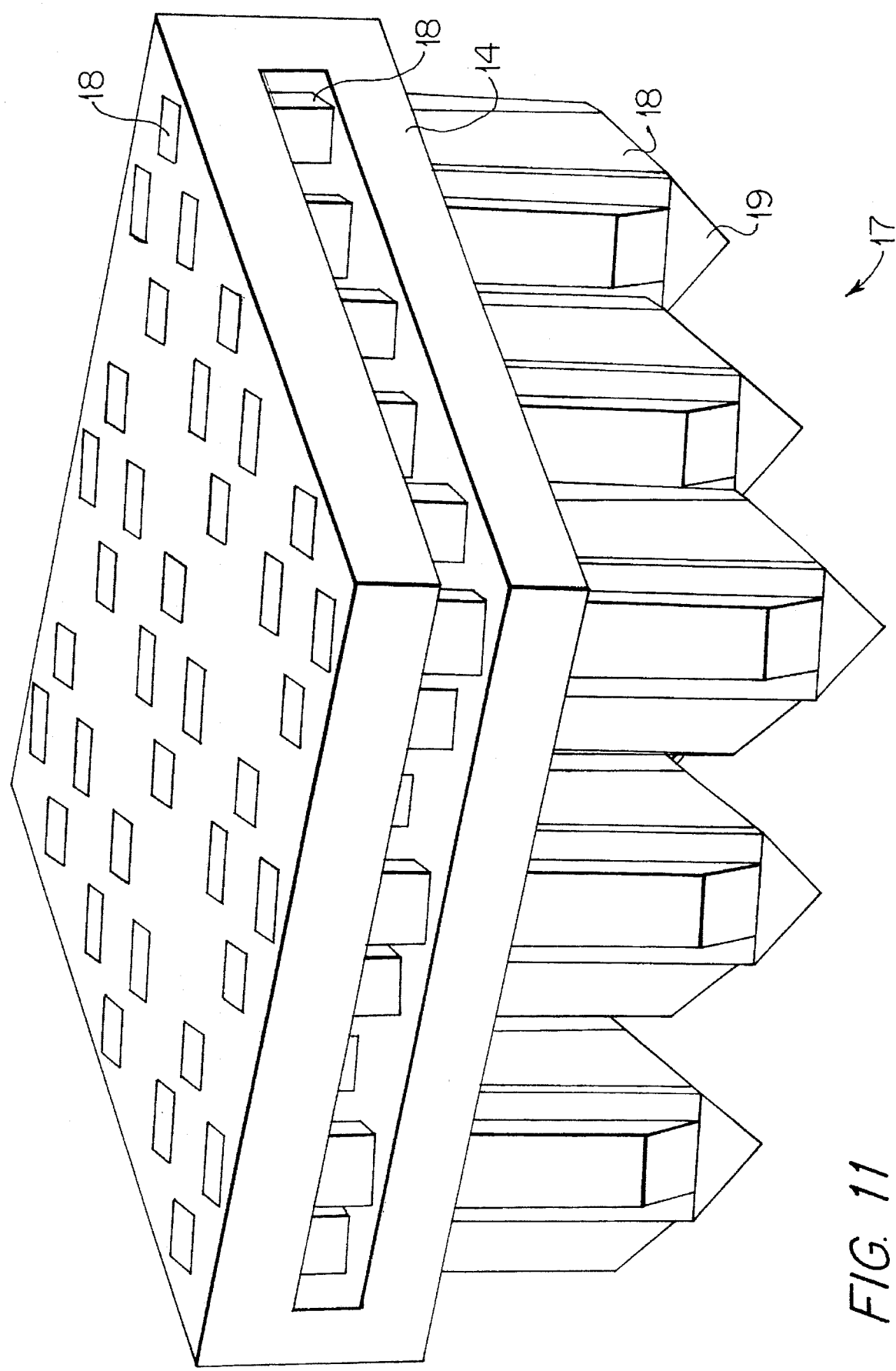
FIG. 11 is a partial perspective view of a multiple-wall configuration for a semiconductor die carrier in accordance with the present invention.

FIG. 11 shows that the insulative substrate may have a multiple-wall configuration to facilitate insertion and retention of the contacts 18 within the substrate. For this configuration, the space between the walls of the substrate 14 may be filled with encapsulation material to assist in retaining the contacts 18. The multiple-wall configuration of FIG. 11 is applicable to die carriers manufactured in accordance with lead insertion and insert molding techniques. For each contact, the hole in the inner wall may be larger than the hole in the outer wall, or vice-versa. Using holes or passages of different sizes can facilitate lead retention.

Figure 12:
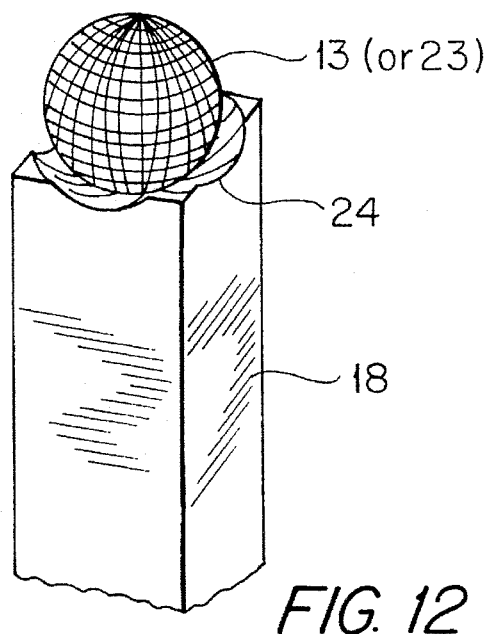
FIG. 12 is a partial perspective view of a conductive contact configured for use in connection with the present invention.

In the configuration shown in FIG. 9, the portion of each contact 18 extending through the substrate 14 may be square, round, or rectangular, and the top surface thereof may be flat. At the end of the conductive contact 18 that connects the conductive contact to the multi-layer conductive substrate 12 or semiconductor die 11, a concave well 24 may be formed, as shown in FIG. 12. Each concave well 24 serves as a receptacle for a corresponding solder ball to facilitate proper placement and maintenance of the grid pattern for the solder balls prior to melting. In this manner, the likelihood of obtaining proper BGA and C4 interconnections is increased.

Figure 13:
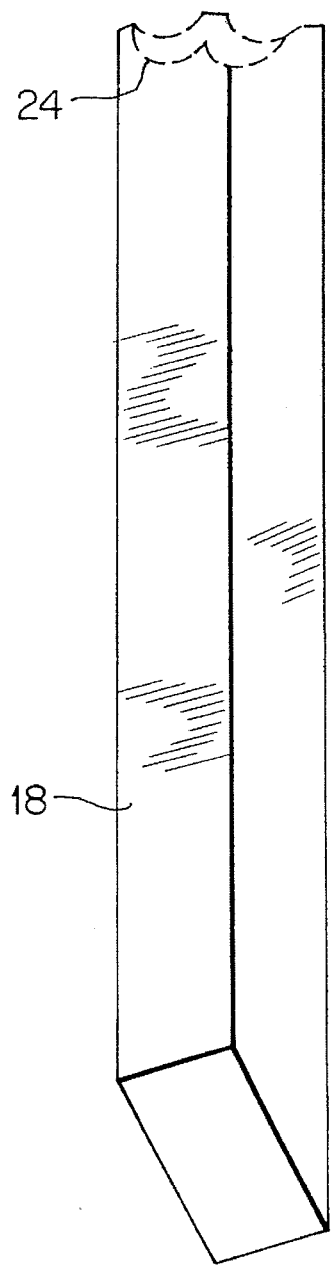
FIG. 13 is a perspective view of a conductive contact configured for use in connection with the present invention.
Figure 14:
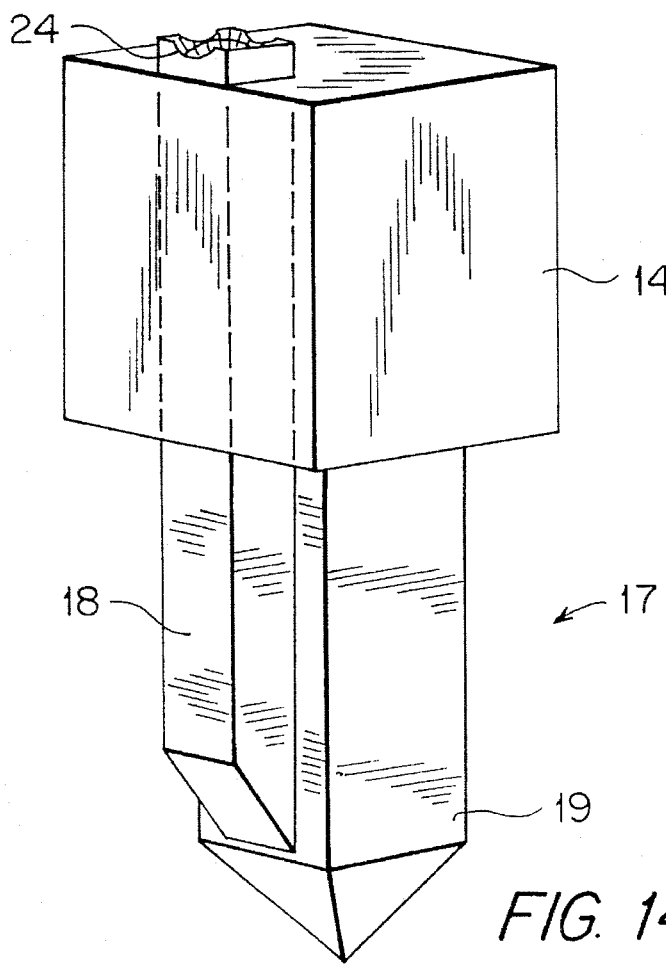
FIG. 14 is a partial perspective view of a semiconductor die carrier in accordance with the present invention.
Figure 15:
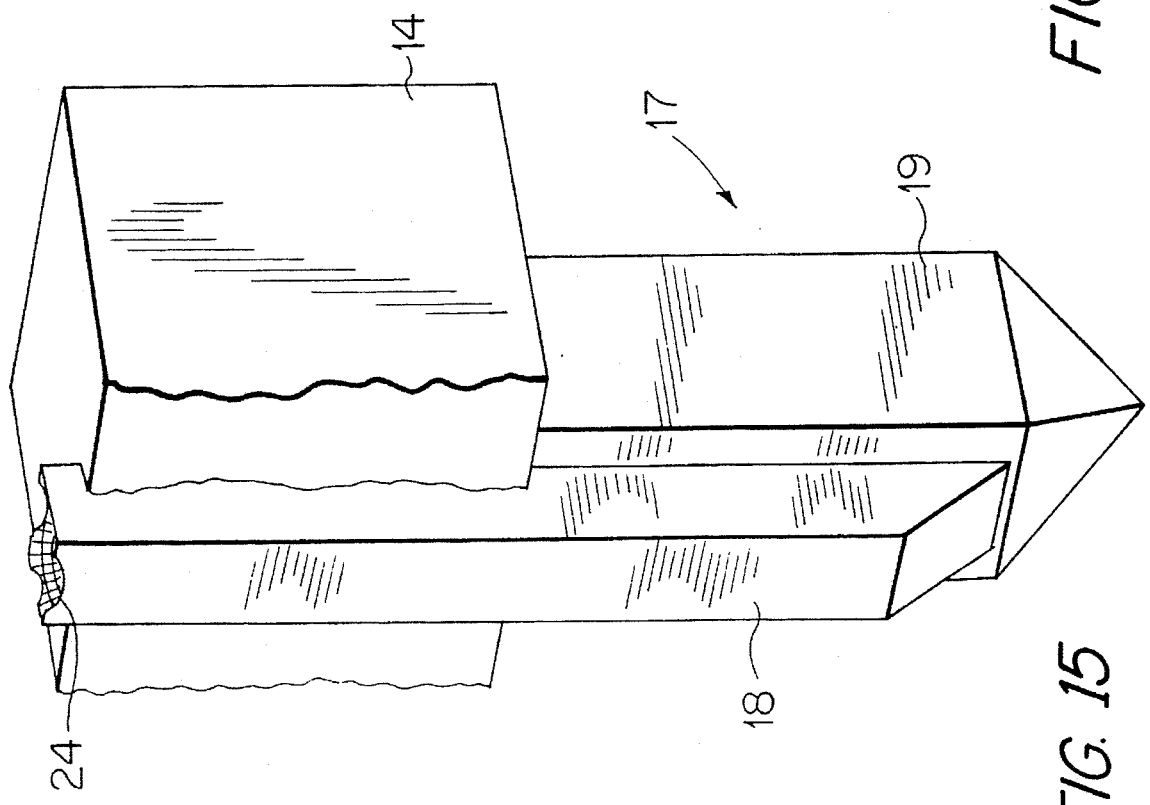
FIG. 15 is another partial perspective view of a semiconductor die carrier in accordance with the present invention.

FIG. 13 is a perspective view of one of the contacts 18 prior to insertion of that contact into the insulative substrate 14. FIGS. 14 and 15 are views showing one of the conductive contacts 18 inserted into the insulative substrate 14 at a position adjacent an insulative buttress 19. A concave well 24 for the conductive contact 18 can be seen in each of FIGS. 13–15.

Figure 16:
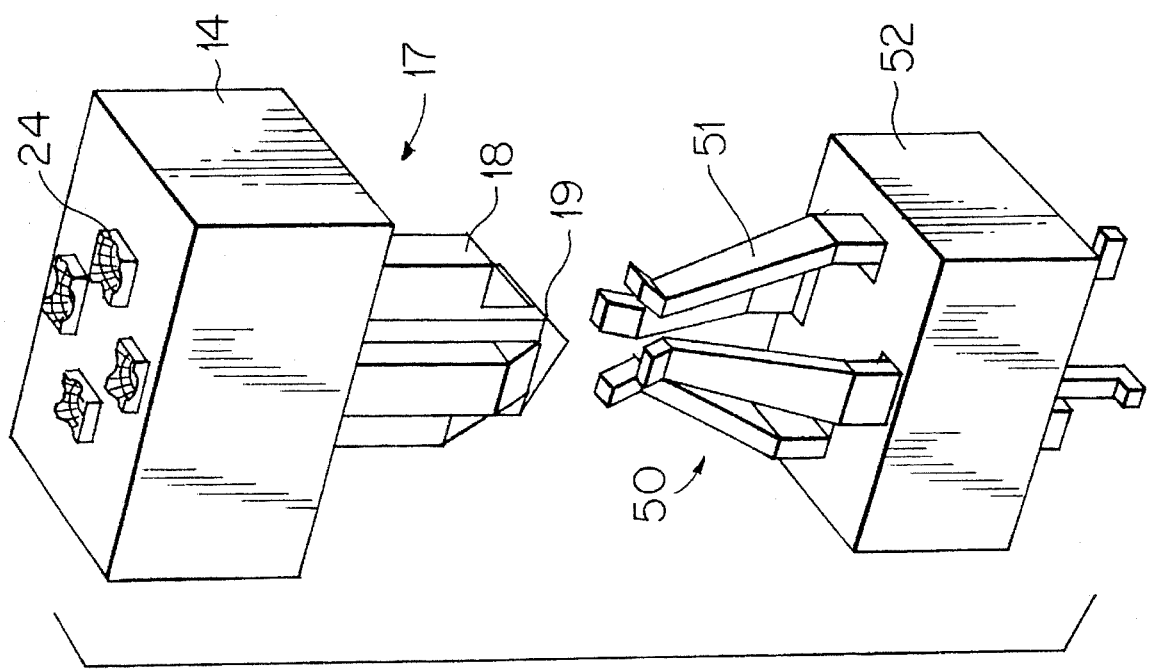
FIG. 16 is a partial perspective view illustrating plugging aspects relating to the present invention.

FIG. 16 illustrates the manner in which each projection-type electrical interconnect component 17 of the semiconductor die carrier may be pluggably attached to a receiving-type electrical interconnect component 50. In particular, FIG. 16 depicts the projection-type interconnect component 17 just prior to receipt within the receiving-type interconnect component 50. The plugging of each electrical interconnect component 17 on the semiconductor die carrier to a corresponding electrical interconnect component 50 results in a pluggable connection for the entire semiconductor die carrier, facilitating testing in the field and the like.

In FIG. 16, the electrical interconnect component 17 for the semiconductor die carrier is a projection-type interconnect component, while the other electrical interconnect component 50 is a receiving-type interconnect component. However, the electrical interconnect component 17 for the semiconductor die carrier could be a receiving-type interconnect component, a hybrid-type interconnect component, or an SMT-compatible interconnect component, assuming the other electrical interconnect component 50 has a matching configuration.

The receiving-type interconnect component 50 of FIG. 16 includes a plurality of conductive contacts 51 extending from an insulative substrate 52. The conductive contacts of projection-type interconnect components will be referred to herein as "posts," and the conductive contacts of receiving-type interconnect components will be referred to herein as "beams."

Figure 17:
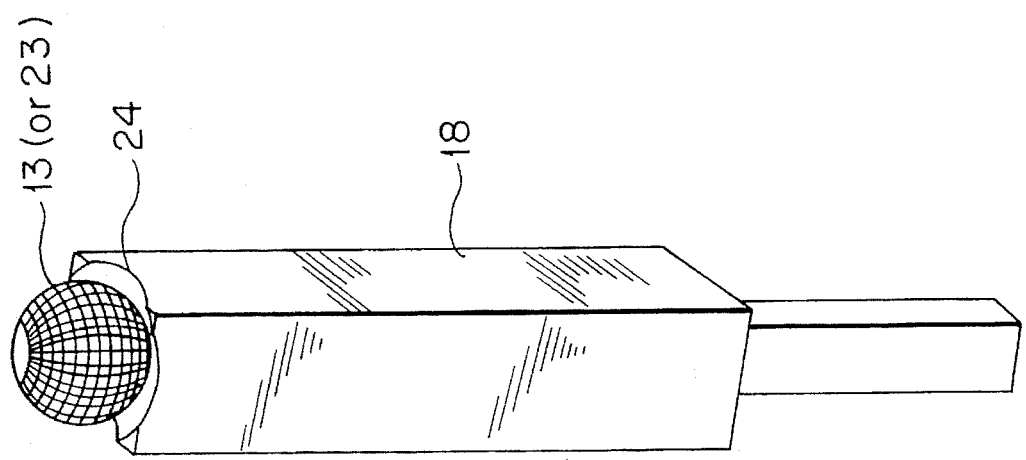
FIG. 17 is a perspective view of a conductive contact configured for use in connection with the present invention.

FIG. 17 is a perspective view of one of the conductive contacts 18 from an electrical interconnect component 17 that is SMT-compatible. Such electrical interconnect components can be surface-mounted to a PCB or other interface surface. Raising the semiconductor die carrier above the interface surface aids in processing and facilitates testing.

Figure 18:
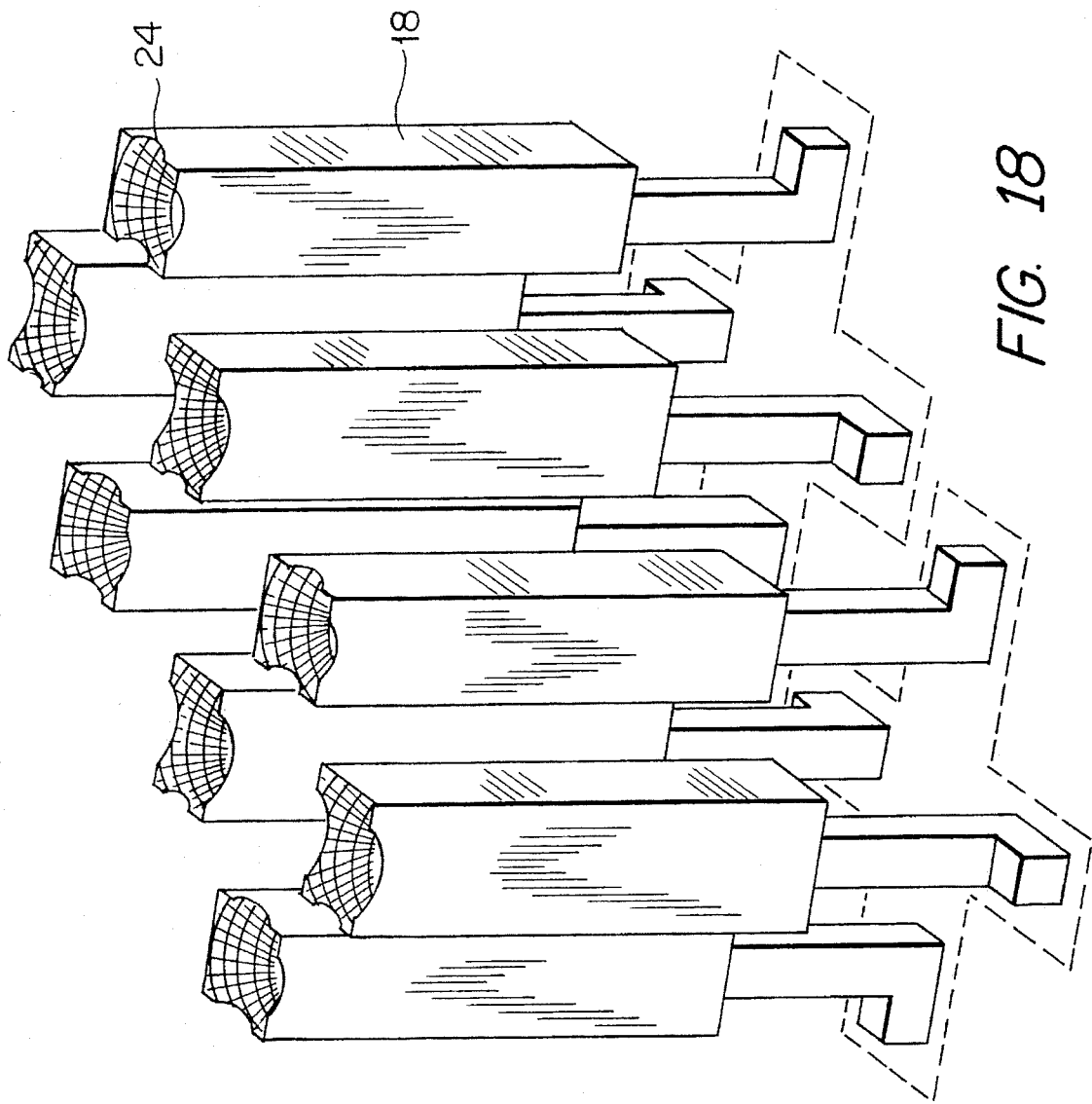
FIG. 18 is a perspective view of a plurality of conductive contacts configured for use in connection with the present invention.
Figure 19:
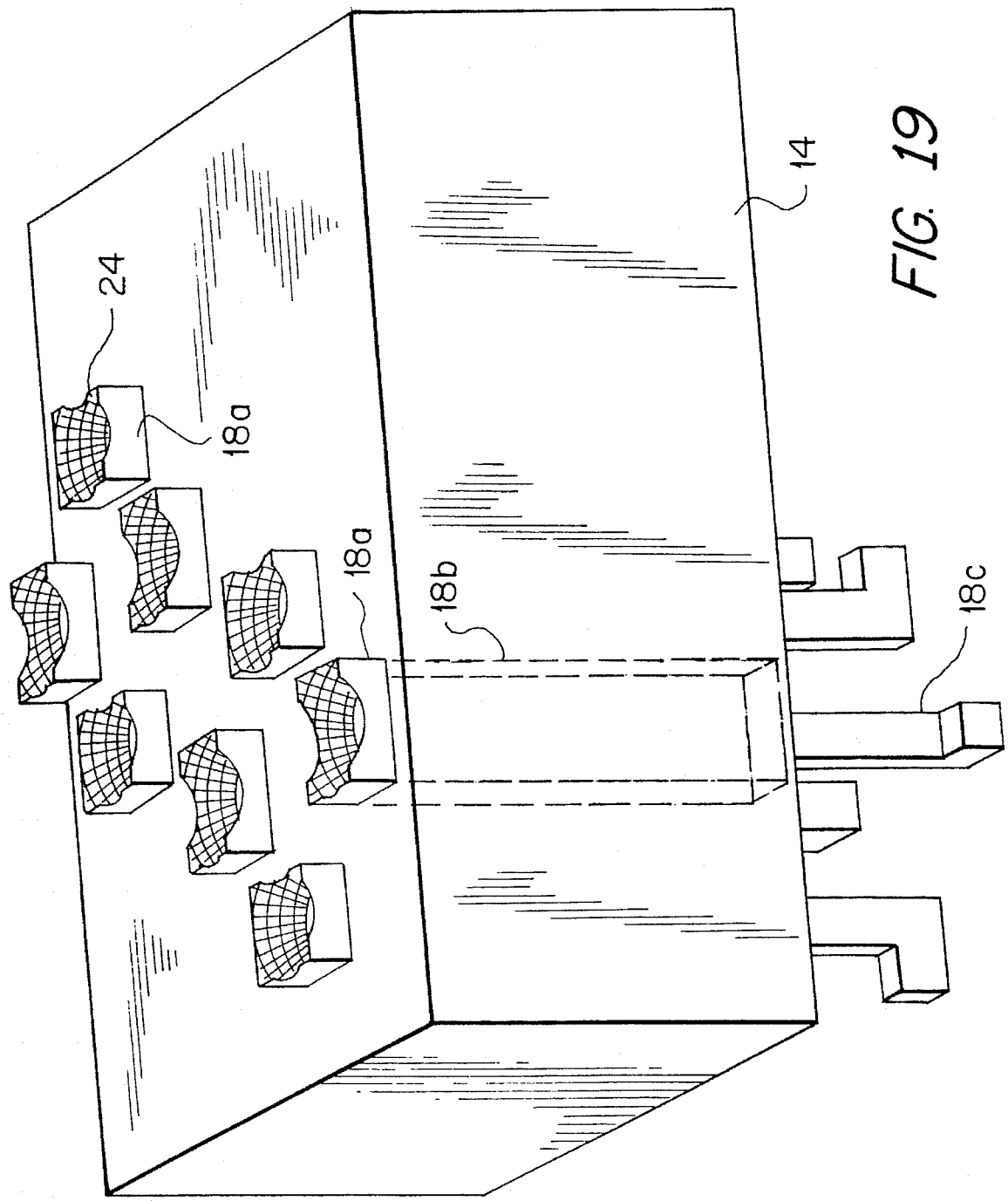
FIG. 19 is a partial perspective view of a semiconductor die carrier in accordance with the present invention.

FIG. 18 shows a plurality of conductive contacts 18 from electrical interconnect components 17 that are SMT-compatible, and FIG. 19 depicts such electrical interconnect components after insertion into the insulative substrate 14. The contacts 18 of FIGS. 18 and 19 have L-shaped foot portions, in contrast to the "Butt Joint" or straight foot portion shown in FIG. 17. Both types of foot portions are applicable for use in accordance with the present invention.

In FIGS. 18 and 19, two SMT-compatible electrical interconnect components are shown, with each interconnect component including four conductive contacts 18. Each of the electrical interconnect components 17 in FIGS. 18 and 19 has a cross-shaped configuration, as indicated by the dotted lines in FIG. 18. The cross-shaped configuration facilitates nesting of the various electrical interconnect components 17 to afford a high-density of contacts. The nesting aspects of the present invention will be discussed in greater detail below.

With reference to FIG. 19, each SMT-compatible contact 18 includes a bonding section 18a extending above the substrate 14; a stabilizing section 18b embedded or anchored within the substrate 14; and a foot section 18c extending below the lower surface of the insulative substrate 14. The foot sections 18c of the SMT-compatible contacts 18 may be directly SMT-mounted to a PCB or other interface surface.

The electrical interconnect components 18 are arranged on the insulative substrate 14 in a manner that affords a very high-density of contacts per unit of area. In particular, the external interface for the semiconductor die carrier in accordance with the present invention includes a plurality of contacts arranged into groups, and the groups may be interleaved among one another. Where conventional semiconductor packages interface by interconnecting individual pins with individual sockets, the semiconductor die carrier of the present invention increases density and flexibility by interconnecting whole groups of contacts with, for example, corresponding groups of contacts, in the most efficient manner possible.

Figure 20:
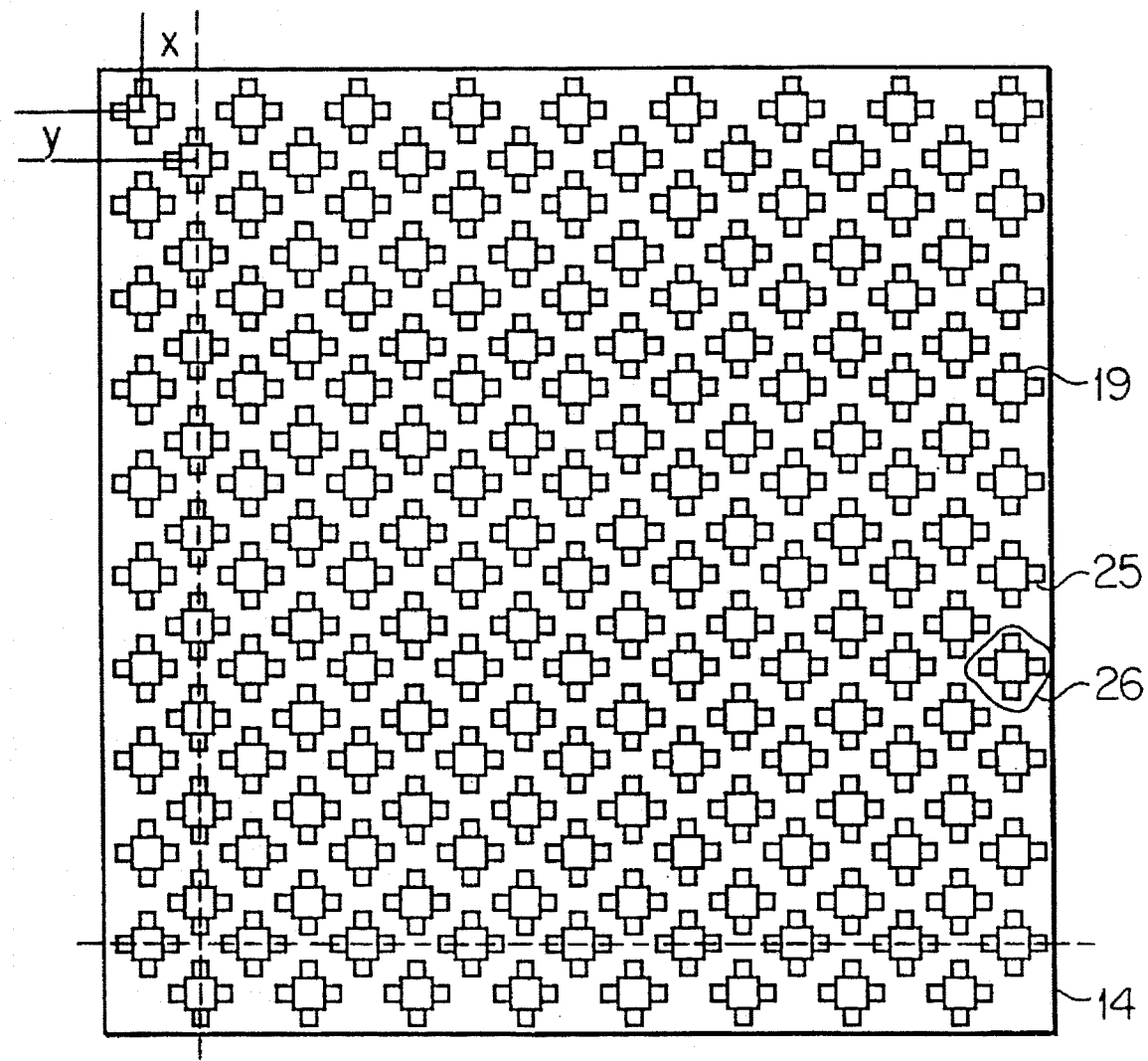
FIG. 20 is a view of a nested arrangement of electrical interconnect components for a semiconductor die carrier in accordance with the present invention.

FIG. 20 depicts an arrangement of groups of holes or passages 25 in accordance with the present invention. In accordance with the arrangement of FIG. 20, groups of holes or passages 25 are formed in the floor of the insulative substrate 14. A conductive contact is fitted within each of the passages to form an array of electrical interconnect components. The array may comprise projection-type, receiving-type, hybrid-type, or SMT-type interconnect components, or combinations or mixtures of such interconnect components.

Herein, reference numeral 26 will be used to refer to each group of contacts forming an interconnect component or, more generically, to the interconnect component including the group of contacts. Thus, each interconnect component 26 referred to herein may be a projection-type interconnect component (such as interconnect component 17 of FIG. 3), a receiving-type interconnect component, a hybrid-type interconnect component, or an SMT-compatible interconnect component.

The conductive contacts of each interconnect component may be arranged such that the contacts of each interconnect component are interleaved or nested within the contacts of other ones of the interconnect components. In other words, the conductive contacts of the array may be arranged such that portions of each group 26 overlap into columns and rows of adjacent groups of contacts to achieve the highest possible density while providing adequate clearance for the mating beams of the receiving-type interconnect components used. It should be noted that while the electrical interconnect components 26 of FIG. 20, when such components are projection-type interconnect components or hybrid-type interconnect components, may each have a buttress 19 located at a central portion of that interconnect component, either in contact with conductive contacts or not in contact with such contacts, one or more (e.g., all) of the interconnect components 26 may be without a buttress. When the electrical interconnect components are receiving-type interconnect components, such components do not include a buttress.

Although the electrical interconnect components 26 shown in FIG. 20 are projection-type interconnect components each configured for receipt within a corresponding receiving-type interconnect component, it should be noted that the electrical interconnect components 26 of FIG. 20 for the semiconductor die carrier could be receiving-type interconnect components each configured to receive a corresponding projection-type interconnect component, hybrid-type interconnect components each configured for mating with a corresponding hybrid-type interconnect component, or SMT-compatible interconnect components each configured for surface-mounting on a PCB or other interface surface.

As shown in FIG. 20, each group of contacts 26 forming an electrical interconnect component may be arranged in the shape of a cross. However, other shapes such as those that may easily be nested, are contemplated. The grouping of the contacts into the shape of a cross (as in FIG. 20) aids in balancing contact stresses to keep the conductive beams of each receiving-type interconnect component or hybrid-type interconnect component from being overly stressed. Further, the use of cross-shaped groups results in alignment advantages not found in conventional interconnect or socket systems. For example, the cross-shaped interconnect components of FIG. 20, when the electrical interconnect components 26 are projection-type interconnect components, each align with the conductive beams of a corresponding receiving-type interconnect component, causing the whole arrangement of FIG. 20 to be similarly aligned.

The nesting of groups (e.g., cross-shaped groups) of holes or contacts (i.e., the nesting of projection-type, receiving-type, hybrid-type, or SMT-compatible interconnect components) allows adequate clearance between the contacts for mating or plugging with corresponding interconnect components, while decreasing to a minimum the space between contacts. No prior art system known to the inventors utilizes space in this manner. Furthermore, as explained above, when the electrical interconnect components 26 are projection-type interconnect components or hybrid-type interconnect components, the inclusion of a buttress 19 between the contacts of each electrical interconnect component is optional. In the absence of a buttress, each group of posts for each projection-type interconnect component or hybrid-type interconnect component is capable of spreading corresponding conductive beams of corresponding interconnect components during mating due to the sloped upper surfaces of the posts.

It should be noted that the nested configuration of FIG. 20 eliminates the need for providing insulative walls between the conductive contacts, although such insulative walls may be used if desired. It should also be noted that while the nested configuration of FIG. 20 may be an arrangement for the conductive contacts of the electrical interconnect components 26 on the semiconductor die carrier, the nested configuration of FIG. 20 could also be the arrangement for the contacts of electrical interconnect components configured for mating with the electrical interconnect components 26 of the semiconductor die carrier. For example, for both the electrical interconnect components 26 of the semiconductor die carrier and the electrical interconnects which mate with the interconnect components 26 of the die carrier, the contacts of all of such components could be arranged so that portions of each group of contacts associated with an electrical interconnect component overlap into columns and rows of adjacent groups of contacts associated with other electrical interconnect components. In other words, both arrays of interconnect components with a given electrical interconnect system may be arranged in a nested configuration. Furthermore, by arranging the conductive contacts into groups (e.g., the cross-shaped groups 26 of FIG. 20), the foot portions of the interconnect components for each group may be arranged to enhance the layout and trace routing of the interface surface (e.g., a PCB surface) to which the semiconductor die carrier is being connected.

Figure 21B:
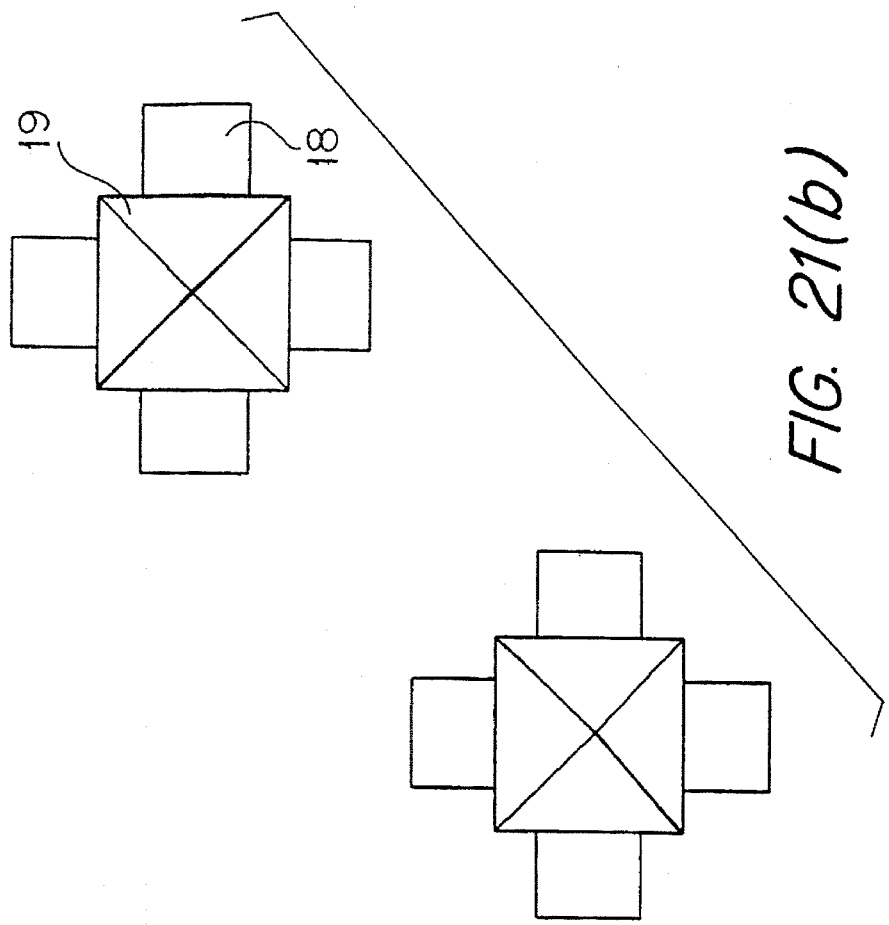
FIG. 21(*a*) is a view of an arrangement of electrical interconnect components in accordance with the present invention.
Figure 21A:
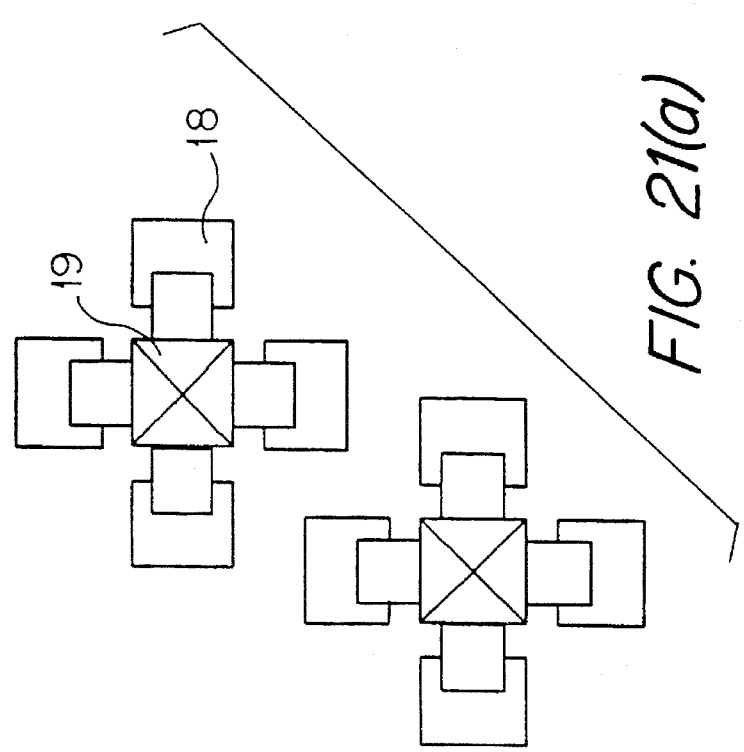

The density of the interconnect arrangement of FIG. 20, when the electrical interconnect components are projection-type interconnect components or hybrid-type interconnect components each including an insulative buttress, depends on the configuration of the conductive contacts, the spacing between buttresses, and the size of the buttresses used. As shown in FIGS. 21(a) and 21(b), respectively, the cross-section of each buttress may be 0.5 mm×0.5 mm, 0.9 mm×0.9 mm, or some other dimension. As an example, the interconnect components of FIG. 21(a) may each include a 0.5 mm×0.5 mm buttress and offset posts such as that shown in FIG. 48, and the interconnect components of FIG. 21(b) may each include a 0.9 mm×0.9 mm buttress and non-offset posts such as that shown in FIG. 47. Preferably, as shown in FIGS. 21(a) and 21(b), both the distance between adjacent contacts within a single electrical interconnect component, and the distance between adjacent contacts from different electrical interconnect components, are greater than or equal to 0.2 mm.

An arrangement wherein each buttress is 0.5 mm×0.5 mm is shown in FIG. 22. Even higher densities may be achieved when a buttress is not used.

For the nested arrangement of FIG. 20, when a 0.9 mm×0.9 mm buttress is used, a center-line to center-line distance X between columns of electrical interconnect components may be 1.5 mm; a center-line to center-line distance Y between rows of electrical interconnect components may be 1.25 mm; and the overall density for the arrangement may be 680 contacts per square inch. When a 0.5 mm×0.5 mm buttress is used, a center-line to center-line distance X between columns of electrical interconnect components may be 1.0 mm; a center-line to center-line distance Y between rows of electrical interconnect components may be 1.5 mm; and the overall density for the arrangement may be 828 contacts per square inch. When a small buttress or no buttress is used, a center-line to center-line distance X between columns of electrical interconnect components may be 0.9 mm; a center-line to center-line distance Y between rows of electrical interconnect components may be 1.25 mm; and the overall density for the arrangement may be 1,028 contacts per square inch.

In the nested arrangement depicted in FIG. 20, the electrical interconnect components 26 are arranged in rows and columns on the insulative substrate 14 (the dotted lines in FIG. 20 designate a row and a column, respectively); the electrical interconnect components of adjacent rows of the arrangement are staggered as are the electrical interconnect components from adjacent columns of the arrangement; and the electrical interconnect components are interleaved among one another in a nested configuration such that a portion of each electrical interconnect component overlaps into an adjacent row of the electrical interconnect components or an adjacent column of the electrical interconnect components. The projection-type, receiving-type, hybrid-type, or SMT-type interconnect components with a given electrical interconnect system may all be arranged in accordance with the nested arrangement depicted in FIG. 20.

While FIG. 20 shows an arrangement having twenty rows and seventeen columns, arrangements having other numbers of rows and columns are envisioned. For example, arrangements having more or less than seventeen columns, and two, three, four, or more rows are contemplated.

Figure 23:
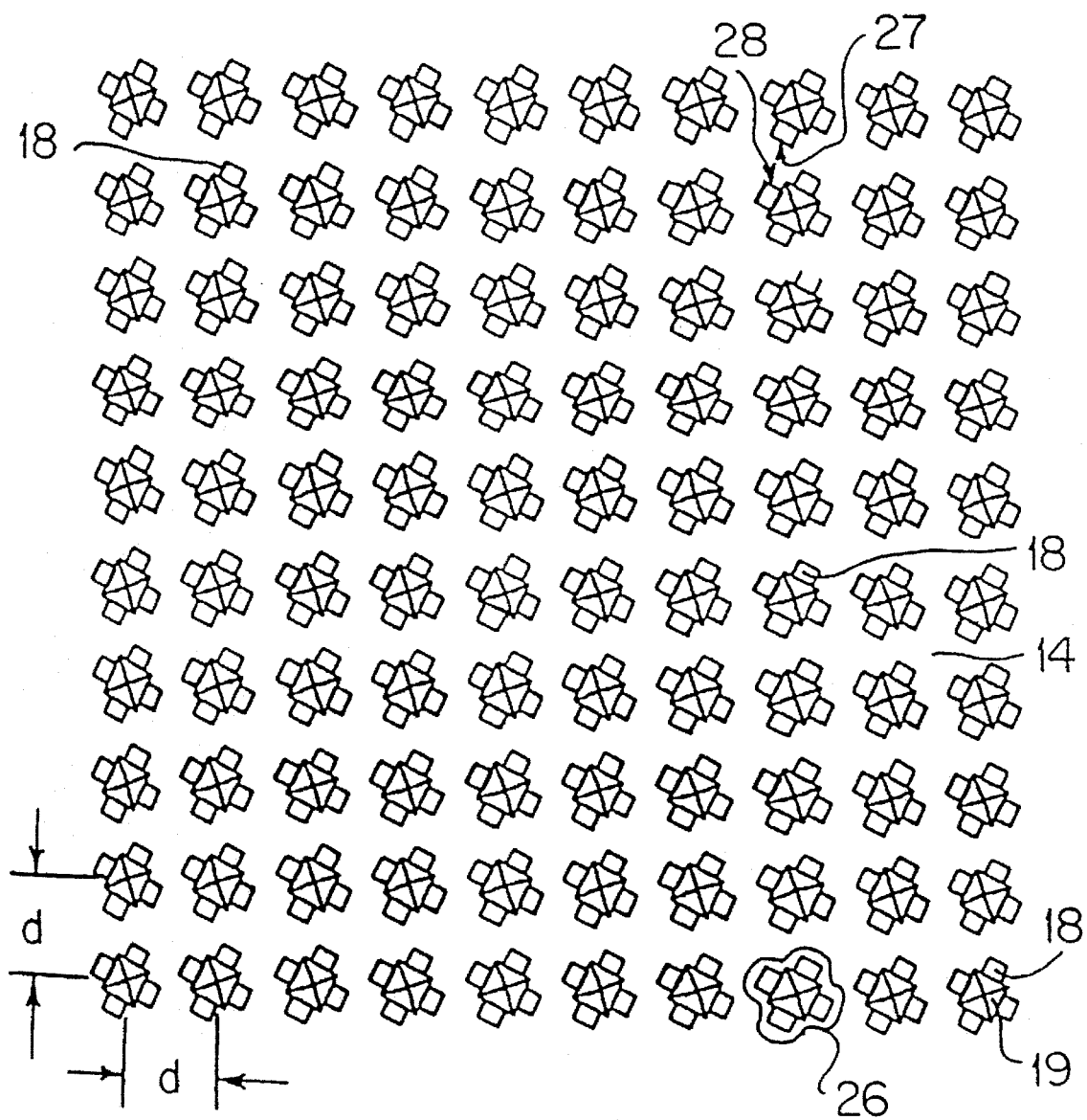
FIG. 23 is a view of a modification of a nested arrangement of electrical interconnect components for a semiconductor die carrier in accordance with the present invention.

The nested configuration in FIG. 20 can be modified to provide even greater densities. An example of one contemplated modification is depicted in FIG. 23, which essentially results from rotating the arrangement of FIG. 20 and positioning the interconnect components such that even less space exists between the components. In the arrangement of FIG. 23, the electrical interconnect components 26, whether of the projection-type, the receiving-type, the hybrid-type, or the SMT-type, are arranged in rows and columns on the insulative substrate 14; and at least one contact (e.g., a post 18 in FIG. 23) of each electrical interconnect component 26 includes a front surface 27 facing outwardly and away from that interconnect component along a line initially intersected by a side surface 28 of a contact from another electrical interconnect component of the arrangement. Also, in the arrangement of FIG. 23, adjacent interconnect components are offset such that a line drawn from the center of an interconnect component through the center of a contact for that component does not intersect the center of any interconnect components directly adjacent that component. It should be noted that, as with the nested arrangement of FIG. 20, the arrangement of FIG. 23 uses cross-shaped groups of contacts for the electrical interconnect components, although other shapes are contemplated. Also, all electrical interconnect components within a given electrical interconnect system (e.g., both the projection-type and the receiving-type interconnect components in a pluggable system) may be arranged in accordance with the arrangement depicted in FIG. 23.

Figure 25:
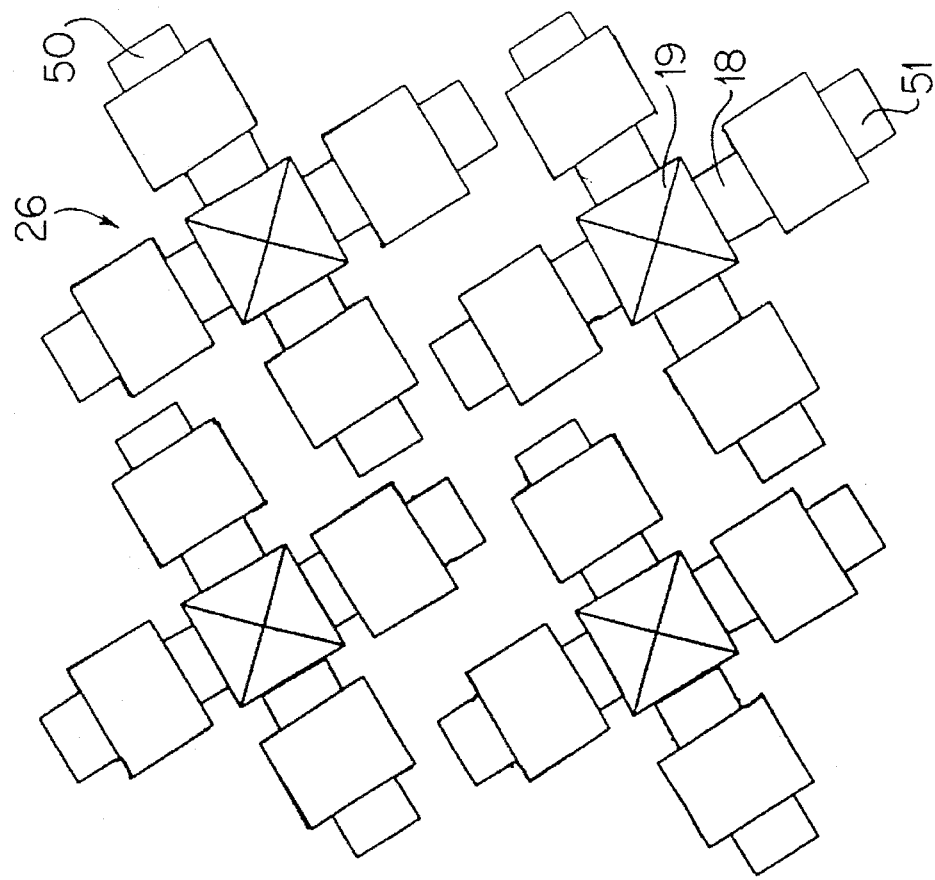
FIG. 25 is a view showing an arrangement of projection-type and receiving-type electrical interconnect components in accordance with the present invention.
Figure 24:
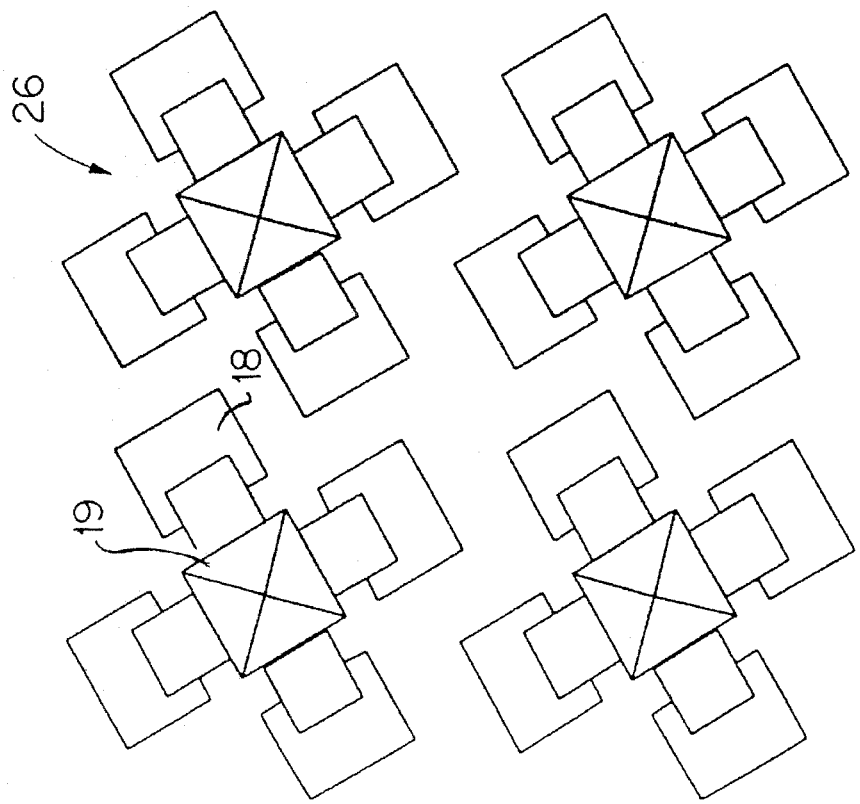
FIG. 24 is a view showing an arrangement of projection-type electrical interconnect components in accordance with the present invention.

FIG. 24 shows a portion of the arrangement in accordance with FIG. 23 using buttresses that have a cross-section of 0.5 mm ×0.5 mm. As seen from FIG. 25, when the projection-type electrical interconnect components 26 from FIG. 24 are each received within a corresponding receiving-type interconnect component 50, the conductive contacts or beams 51 of the receiving-type interconnect components are separated by a distance of 0.2 mm, for example.

Figure 26:
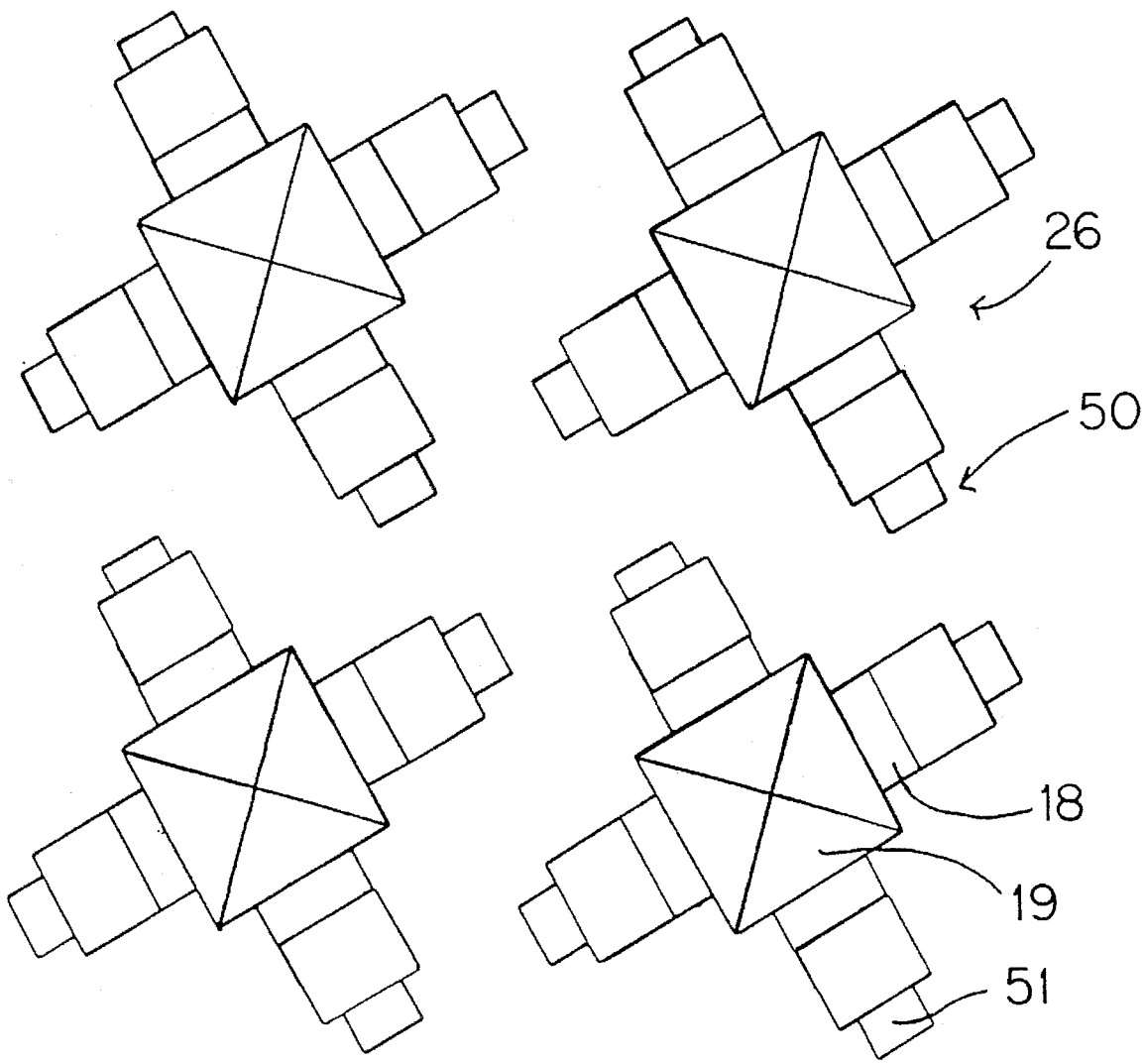
FIG. 26 is a view showing an arrangement of projection-type and receiving-type electrical interconnect components in accordance with the present invention.

FIG. 26 is a view of projection-type electrical interconnect components 26 arranged in accordance with the arrangement of FIG. 23 and received within corresponding receiving-type interconnect components 50. In FIG. 26, the buttresses 19 for the projection-type interconnect components 26 may have a cross-section of 0.9 mm×0.9 mm. The distance between each conductive contact or beam 51 and the contact which it faces is 0.4 mm, for example.

It should be noted that for the nested arrangement of FIG. 23, when a 0.9 mm×0.9 mm buttress is used, the distance d between like surfaces of the contacts may be 2.19 mm; and the overall density for the arrangement may be 460 contacts per square inch. When a 0.5 mm×0.5 mm buttress is used, the distance d may be 1.60 mm; and the overall density for the arrangement may be 900 contacts per square inch. When no buttress is used, the distance d may be 1.5 mm; and the overall density for the arrangement may be 1,156 contacts per square inch.

In the arrangements of FIGS. 20 and 23, the rows and columns of the arrangement are continuous. In other words, aside from the regular spacing between the electrical interconnect components in each row and column, there are no breaks or interruptions in the rows or columns of the electrical interconnect components. Such continuous rows and columns are particularly useful in connection with C4 bonding technology, where bonding occurs not only around the periphery of the semiconductor die, but also directly beneath the die. This is valuable in higher pin count interconnects as well.

Figure 27:
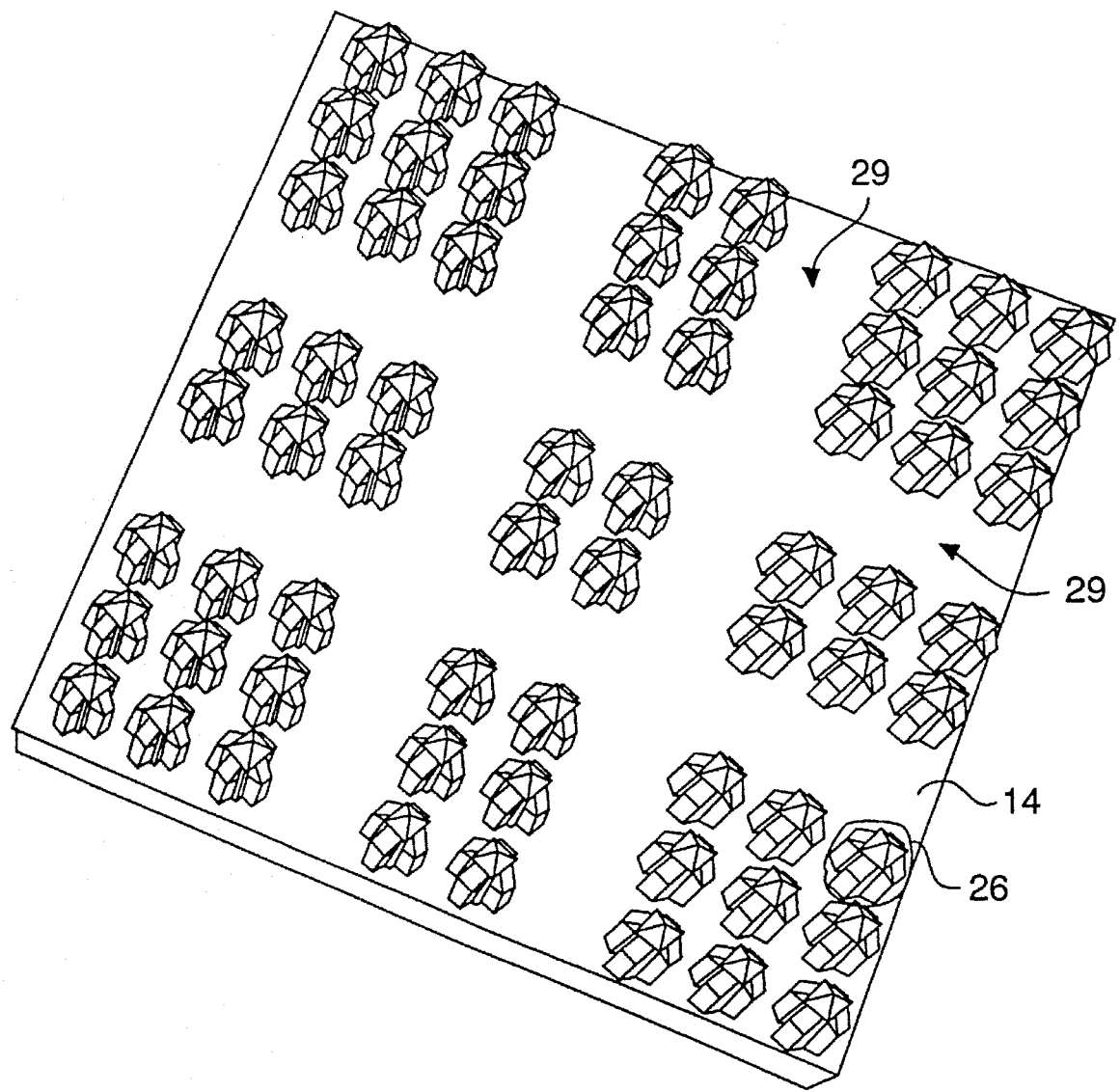
FIG. 27 is a view showing a discontinuous arrangement of electrical interconnect components in accordance with the present invention.

Instead of being arranged in continuous rows and columns, the electrical interconnect components 26 (regardless of whether such components are projection-type, receiving-type, hybrid-type, or SMT-type) can be arranged in groups or clusters of four or more components separated by channels 29, as shown in FIG. 27. This type of arrangement, utilizing the channels 29 for routing traces, allows PCB and other interface surface traces to be routed easily to vias and the like on the interface surface. To promote such routing, the channels between the groups of clusters of electrical interconnect components 26 are larger than the spacings between the electrical interconnect components 26 within each group or cluster. The use of the channels 29 is applicable to all of the interconnect arrangements disclosed in the present invention, including the arrangements of FIGS. 20 and 23.

Figure 28:
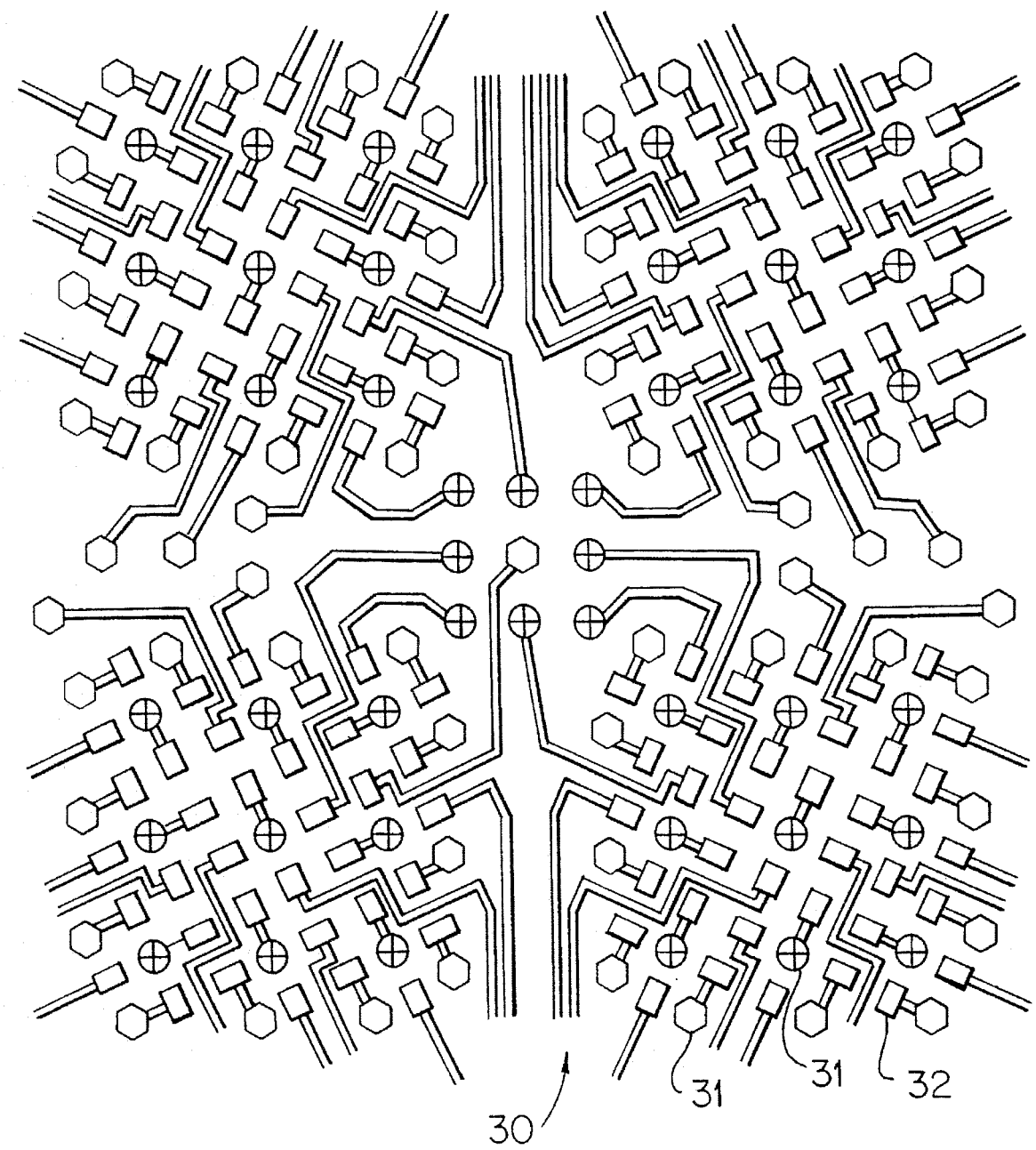
FIG. 28 is a view of a trace and via pattern on a PCB in accordance with the present invention.

The channels 29 between the groups or clusters of electrical interconnect components correspond to spaces where vias, pads, through-holes, and/or traces can be positioned. FIG. 28 is an example of a pattern on a PCB suitable for use in connection with a discontinuous arrangement of electrical interconnect components such as that shown in FIG. 27. The illustrated dimensions for the pattern are 17.33 mm and 17.69 mm, providing a density of 300 contacts per square inch. As can be seen from FIG. 28, the pattern of the PCB includes traces 30, vias 31, and pads 32, for example, with the pads being arranged in a pattern corresponding to the pattern of the electrical interconnect components. The pattern of the PCB shown in FIG. 28 routes traces, vias, and the like in the area of the PCB corresponding to the channels 29 between the electrical interconnect components of the semiconductor die carrier. Exemplary dimensions for the pattern shown in FIG. 28 are 0.15 mm for the width of the traces 30; 0.15 mm separating the traces 30 from other conductive components on the board surface; and a diameter of 0.6 mm for the vias 31. Although FIG. 28 shows an exemplary pattern from a circuit board upon which the semiconductor die carrier of the present invention may be mounted, other patterns in accordance with the present invention are envisioned.

Figure 29B:
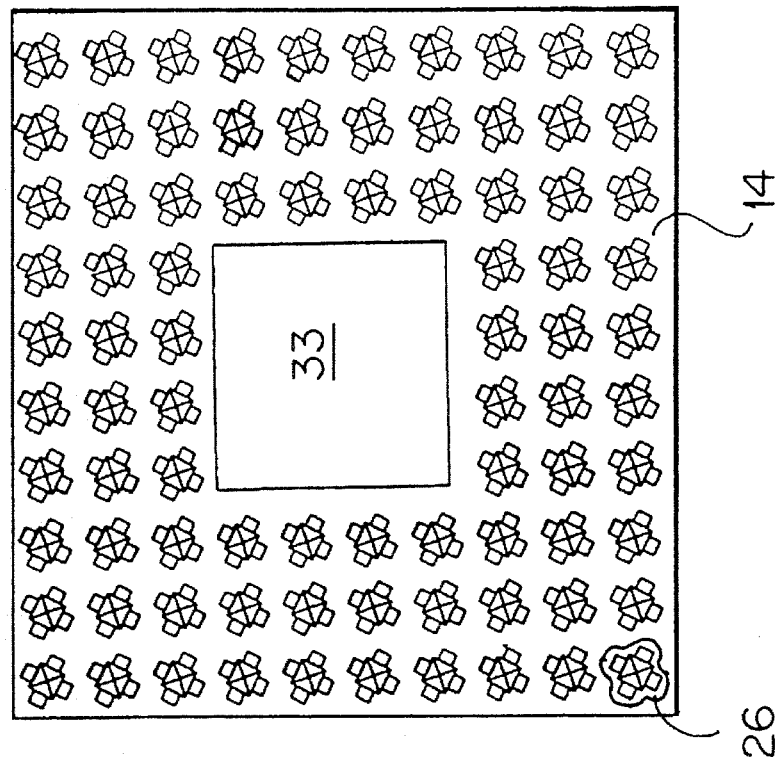
FIG. 29(*a*) is a view of an arrangement of electrical interconnect components modified to include a space at a center portion thereof.
Figure 29A:
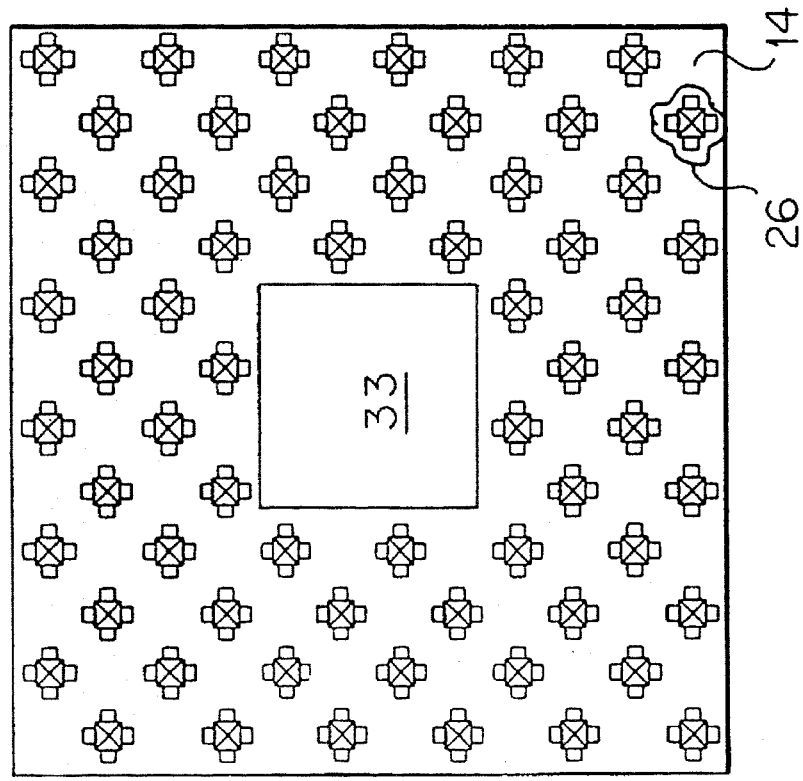

In addition to the continuous arrangements of FIGS. 20 and 23 and the clustered or discontinuous arrangement of FIG. 27, all of the arrangements of the present invention can be modified to include a space 33 at a center portion thereof to allow the use of wire bonding, TAB, and the like. FIGS. 29(a) and 29(b), respectively, are examples of the manner in which the arrangements of FIGS. 20 and 23 can be modified to include a space 33.

FIG. 29(a) shows an example of the arrangement of electrical interconnect components 26 of FIG. 20 modified to include a space 33 at a central portion thereof. In FIG. 29(a), each of the sides of the semiconductor die carrier is 25 mm long, so that the semiconductor die carrier can provide 252 conductive contacts using only 625 sq. mm of area.

FIG. 29(b) shows an example of the arrangement of electrical interconnect components 26 of FIG. 23 modified to include a space 33 at a central portion thereof. In FIG. 29(b), each of the sides of the semiconductor die carrier is 23 mm long, so that the semiconductor die carrier can provide 336 contacts using only 529 sq. mm of area.

Figure 30:
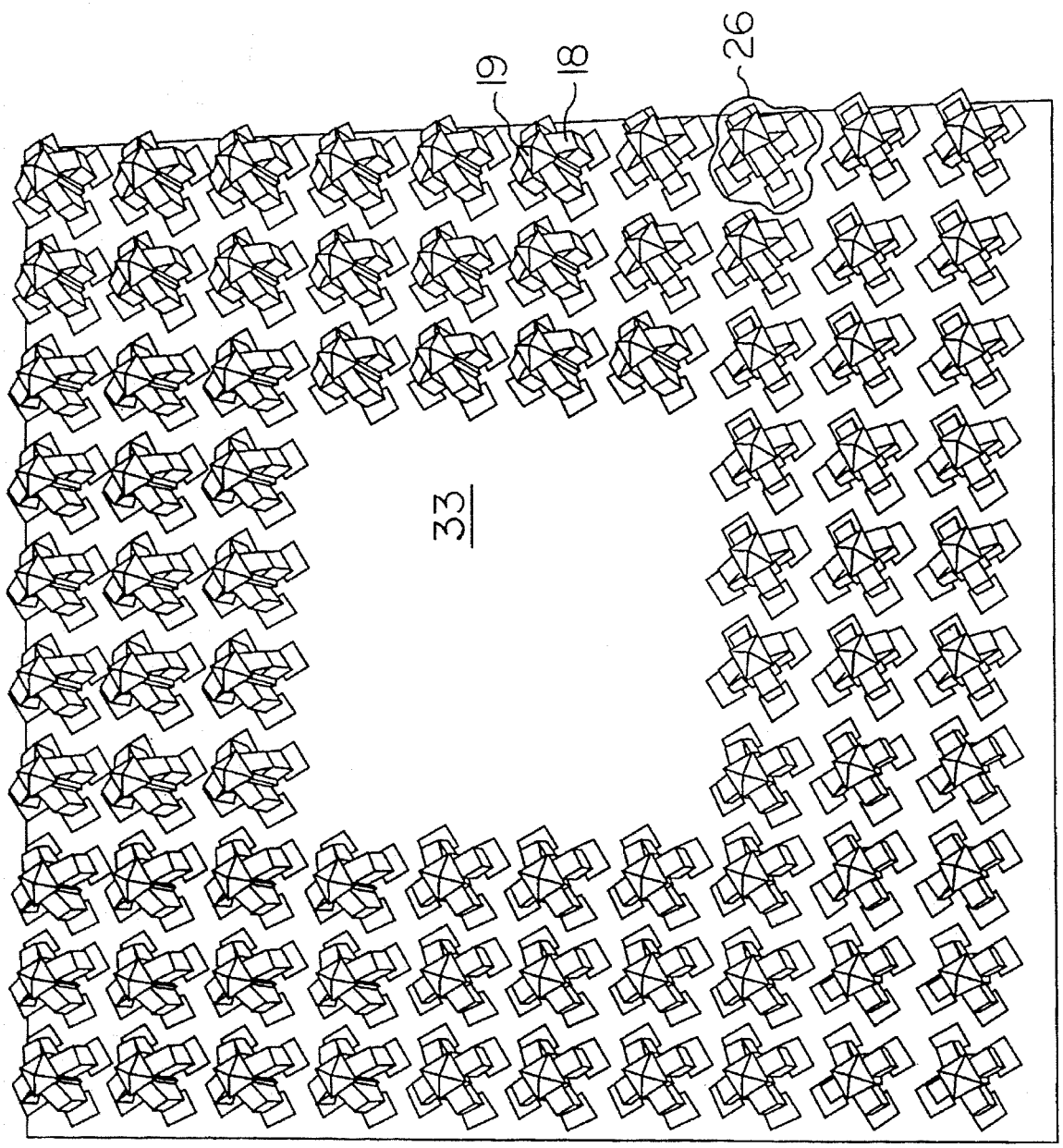
FIG. 30 is a view of an arrangement of electrical interconnect components modified to include a space at a center portion thereof.
Figure 48:
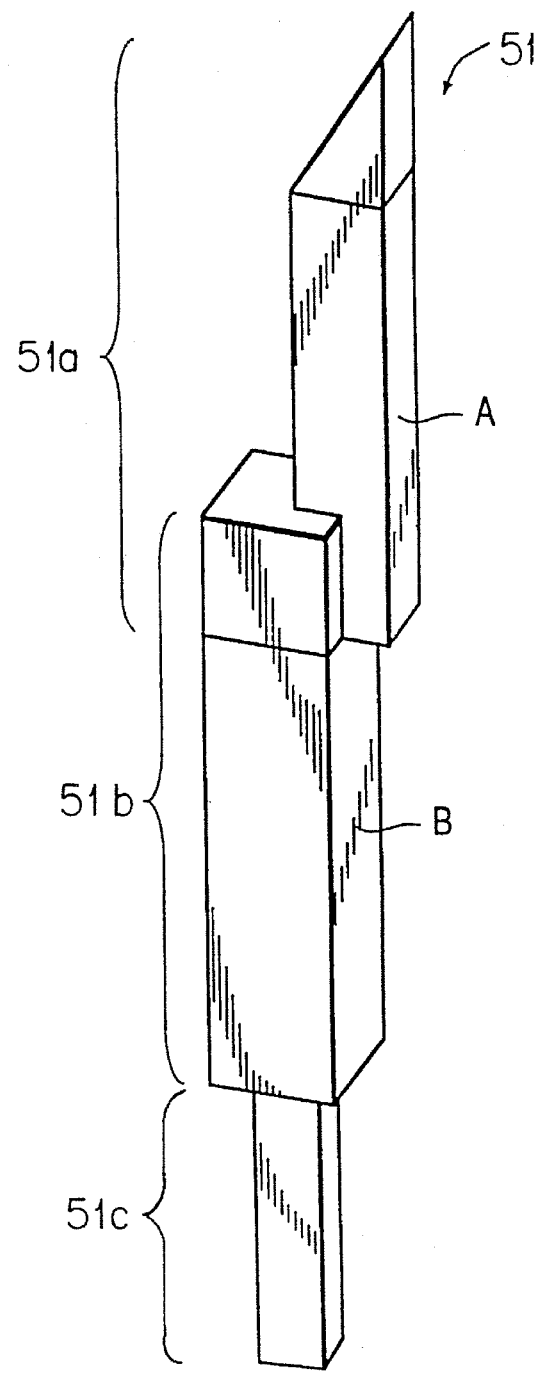
FIG. 48 is a perspective view of an offset-type conductive post that may be used in accordance with the present invention.

FIG. 30 is another view of the arrangement depicted in FIG. 29(b), with each of the contacts or posts 28 having a contact portion that is offset with respect to a corresponding stabilizing portion in the manner of the offset post depicted in FIG. 48. The contact and stabilizing portions of each contact will be discussed in greater detail below. FIG. 30, like FIGS. 29(a) and 29(b), illustrates that each interconnect arrangement in accordance with the present invention can be modified to include a space 33 at a central portion thereof. For the arrangements of FIGS. 29(a), 29(b), and 30, the depicted electrical interconnect components 26 are projection-type interconnect components each including a buttress 19. However, in accordance with the present invention, such components could be buttress-free projection-type interconnect components, receiving-type interconnect components, hybrid-type interconnect components, or SMT-compatible interconnect components.

The arrangements depicted in FIGS. 29(a), 29(b), and 30 all afford high-density interconnect interfaces, especially as compared to currently available semiconductor package interconnect interfaces. A semiconductor die carrier incorporating the arrangement of FIG. 29(a), for example, may have a side length of 25 mm and, at the same time, may provide 252 conductive contacts. A conventional Intel 486 (trademark) package, on the other hand, is a 168-pin PGA having a side length of 44 mm. Thus, the semiconductor die carrier of the present invention could be used to reduce the size of the conventional Intel 486 (trademark) package by 67% and, at the same time, provides 84 extra conductive contacts.

As another example, a semiconductor die carrier incorporating the arrangement shown in FIG. 29(b), and using buttresses each having a 0.9 mm×0.9 mm cross-section, has a side length of 23 mm and provides 336 contacts in 529 sq. mm of area. The conventional Intel PENTIUM (trademark) package, on the other hand, is a 273-pin PGA taking up 2,916 sq. mm of board area. Thus, the semiconductor die carrier of the present invention is 81% smaller than the conventional Intel PENTIUM (trademark) package.

If 0.5 mm×0.5 mm buttresses are used in accordance with the arrangement depicted in FIG. 29(b), a semiconductor die carrier that has a side length of 14.2 mm may be used to provide 336 contacts in a 201 sq. mm area. Such a semiconductor die carrier would reduce the size of the conventional Intel PENTIUM (trademark) package by 93%, while providing 63 additional contacts. To provide a more "real world" comparison, such a semiconductor die carrier would have a side length of 14.2 mm as compared to the 18.0 mm diameter of a dime. No conventional package known to the inventors can even approach this level of size reduction.

Figure 31:
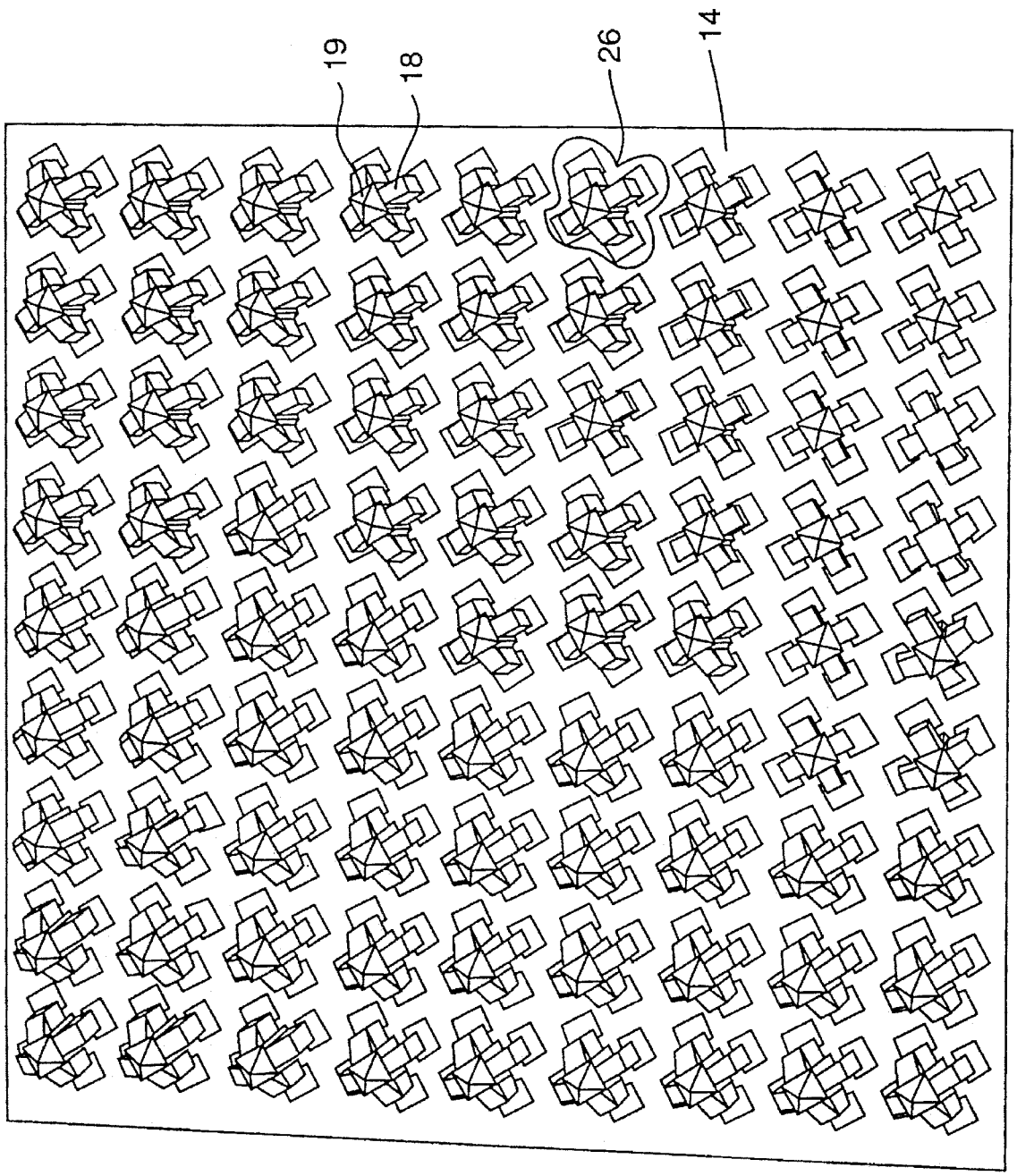
FIG. 31 is a view of an arrangement of electrical interconnect components for a semiconductor die carrier in accordance with the present invention.

FIGS. 31 through 36 illustrate various aspects relating to the arrangements in accordance with the present invention. FIG. 31, for example, shows a continuous arrangement of projection-type electrical interconnect components 26, with each contact or post 18 having a contact portion that is offset with respect to its corresponding stabilizing section in the manner of the post depicted in FIG. 48. The contact and stabilizing portions of each contact will be discussed below.

Figure 32:
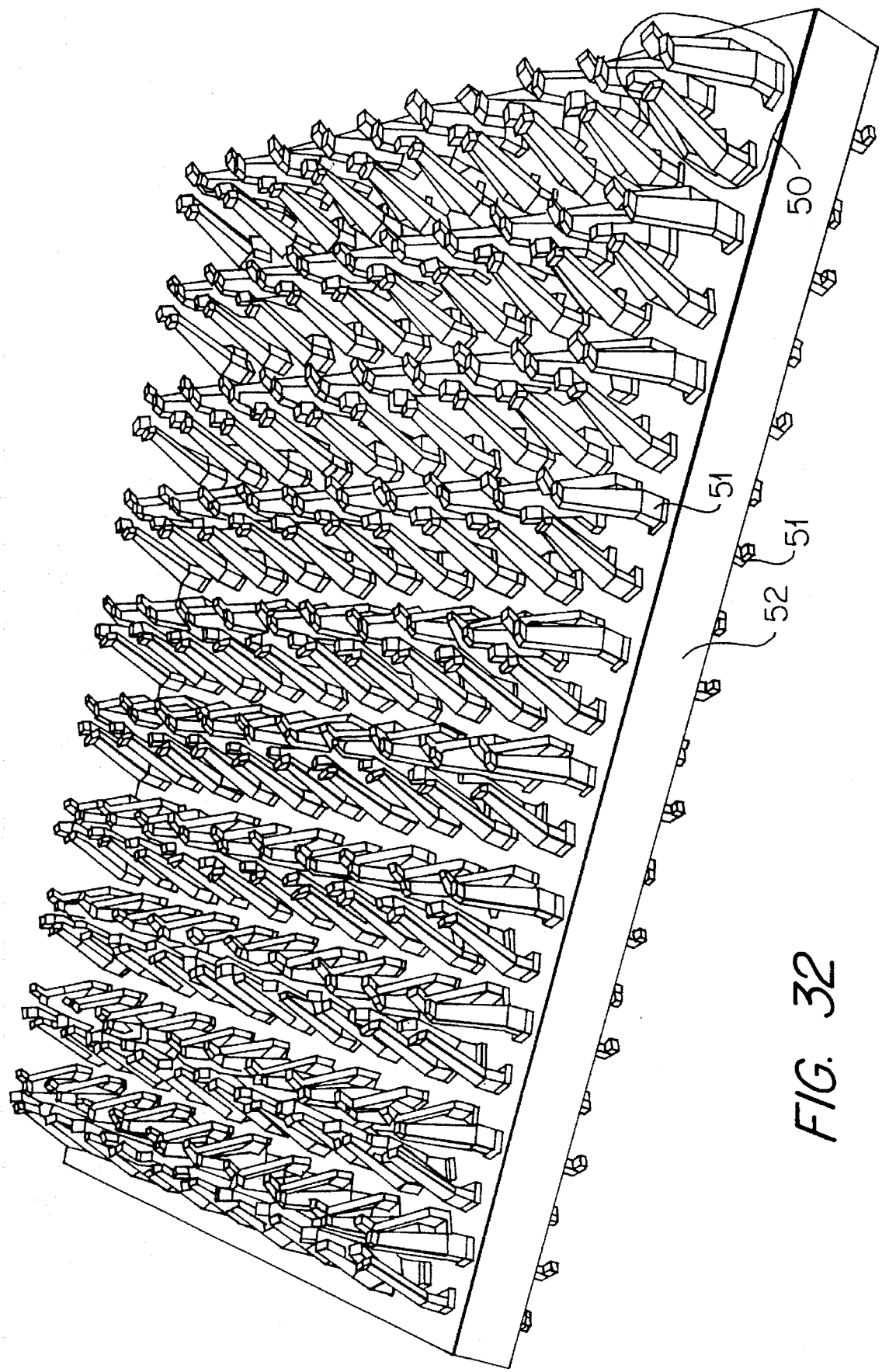
FIG. 32 is a view of an arrangement of electrical interconnect components arranged on an SMT-compatible socket in accordance with the present invention.

FIG. 32 shows a socket including a plurality of receiving-type electrical interconnect components 50, each including a plurality (e.g., four) of conductive contacts or beams 51, arranged on an insulative substrate 52. The foot parts of the beams 51, shown extending below the substrate 52, are mounted to a PCB or other interface surface using the SMT methodology. Thereafter, a semiconductor die carrier including projection-type interconnect components may be plugged into the socket from above. While the socket of FIG. 32 is shown using a plurality of receiving-type electrical interconnect components, alternatively, such components could be projection-type components, hybrid-type interconnect components, or the like. Regardless of the type of interconnect component that is used, the interconnect components of the socket, and the interconnect components of the die carrier with which it mates, may be arranged in a nested configuration, such as the nested configuration of FIG. 20 or in a configuration such as that shown in FIG. 23.

Figure 33:
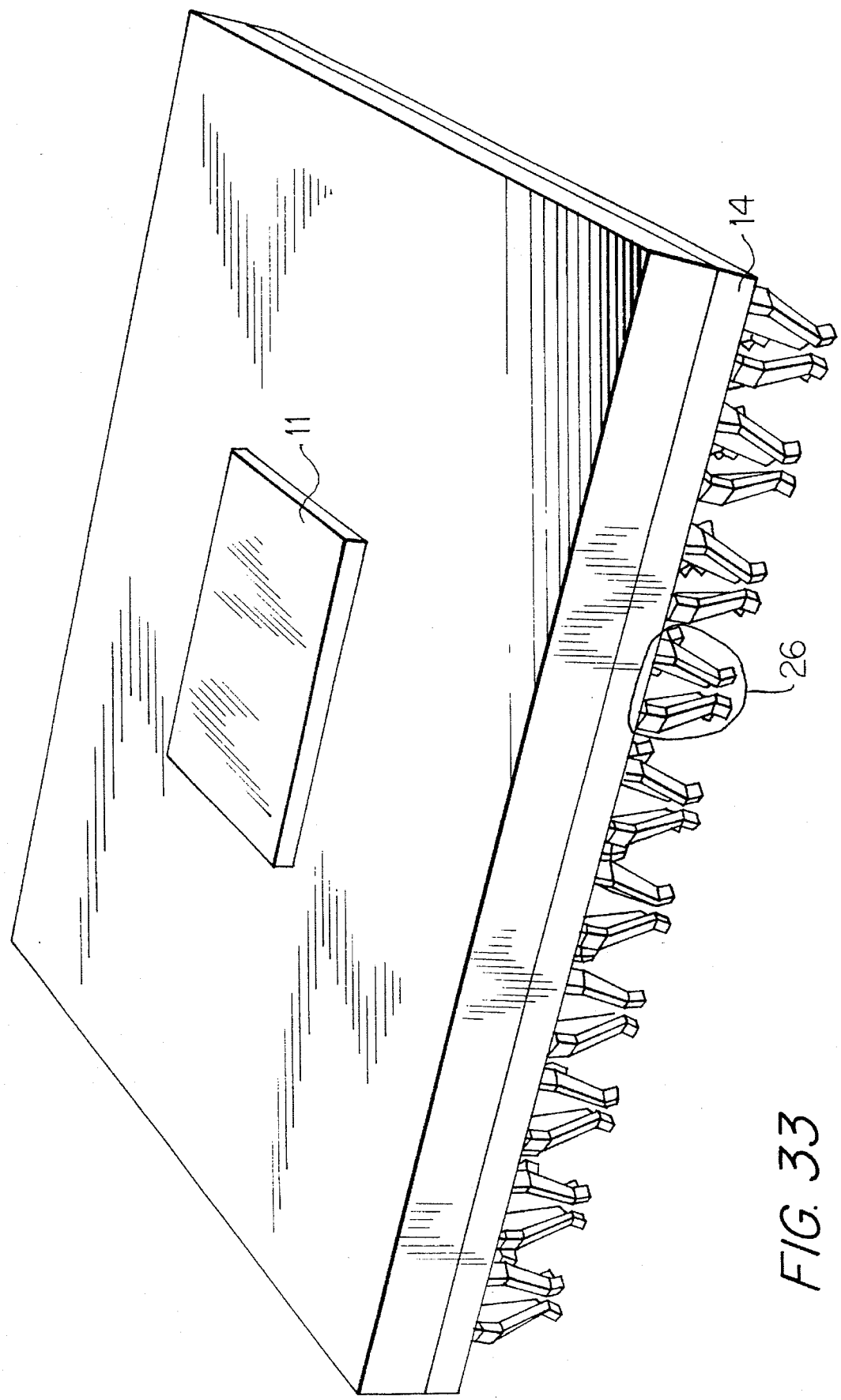
FIG. 33 is a view of a semiconductor die carrier including an arrangement of electrical interconnect components in accordance with the present invention.
Figure 34:
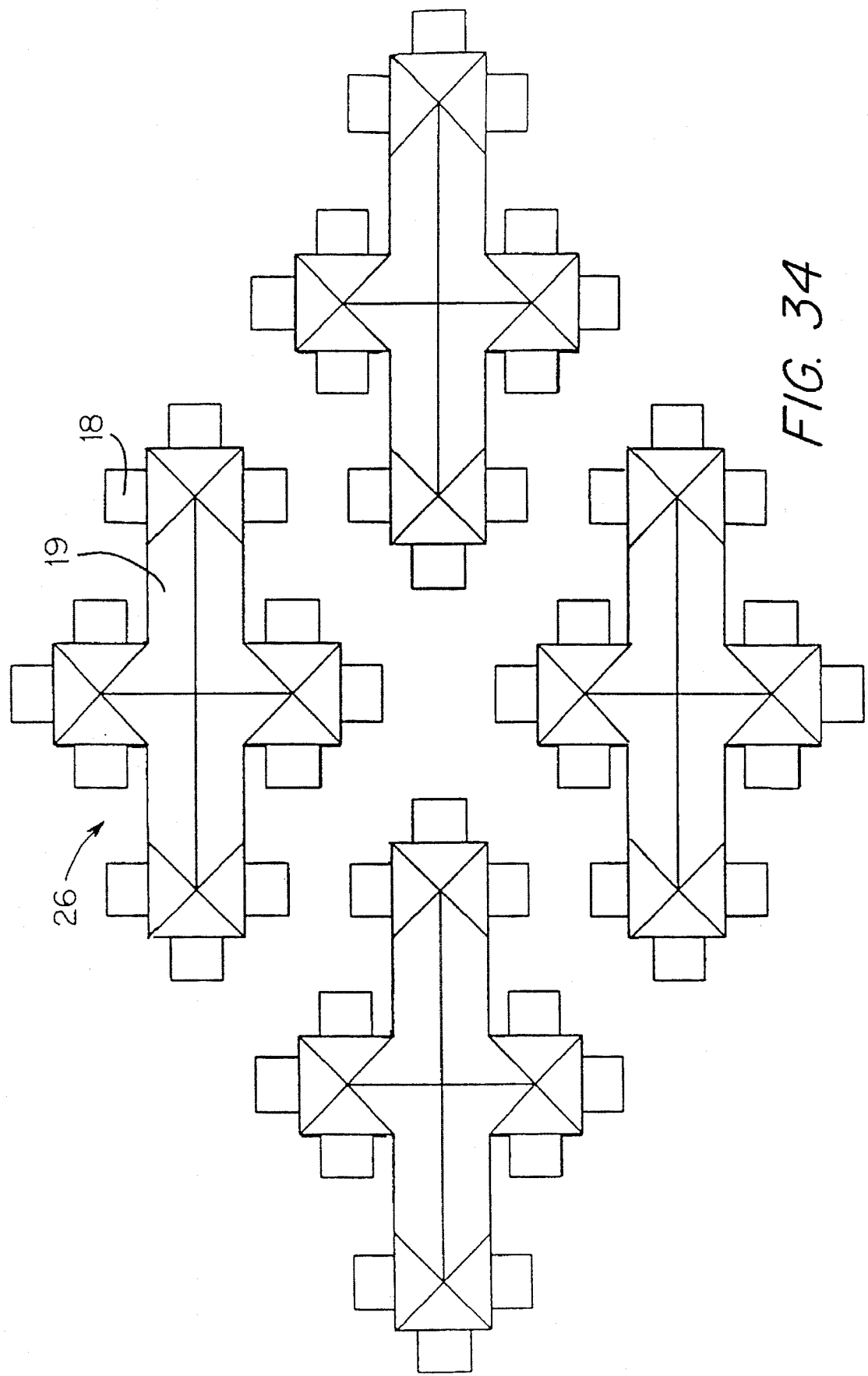
FIG. 34 is a view of a nested arrangement of electrical interconnect components in accordance with the present invention.
Figure 35:
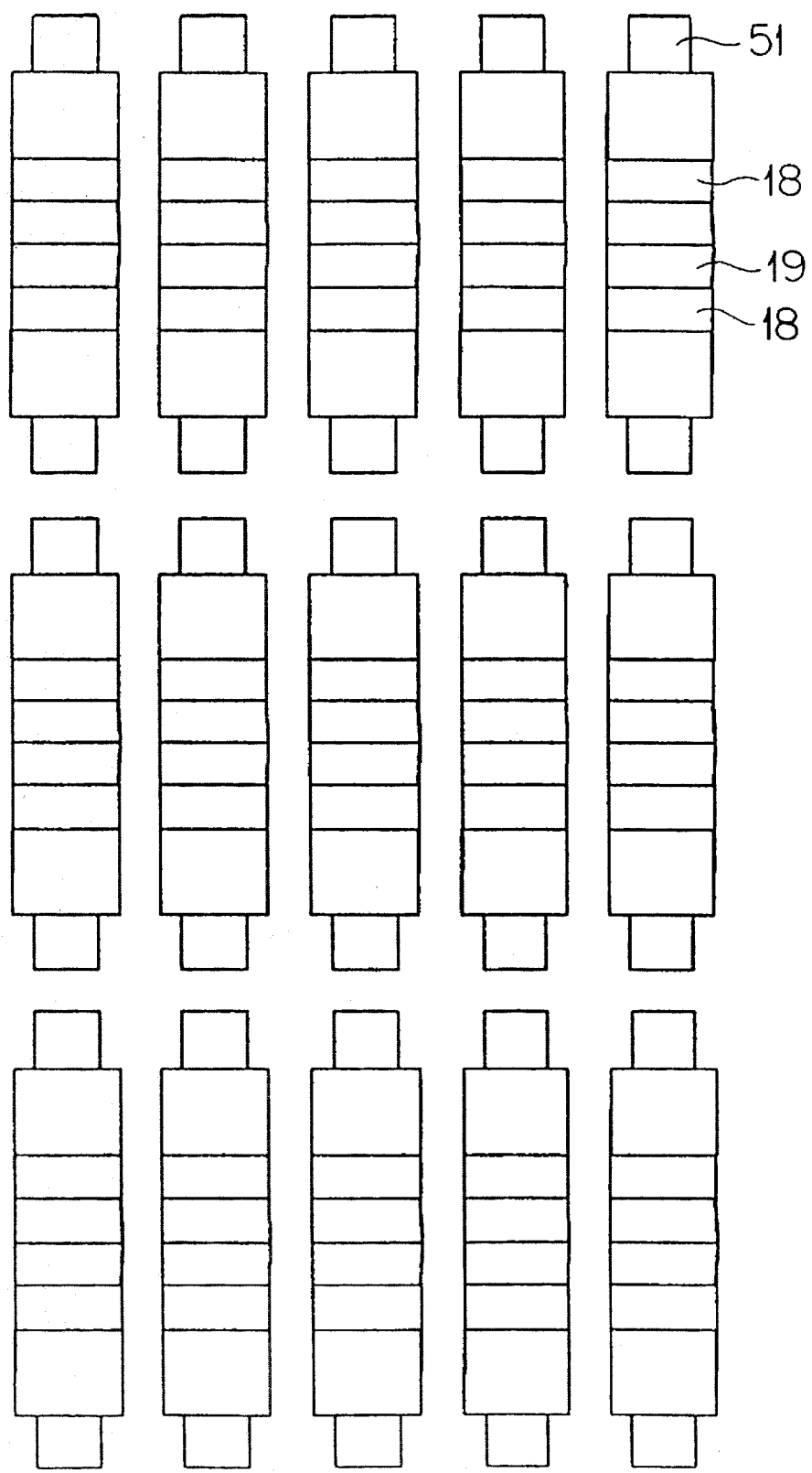
FIG. 35 is a view of an arrangement of electrical interconnect components in accordance with the present invention.
Figure 36:
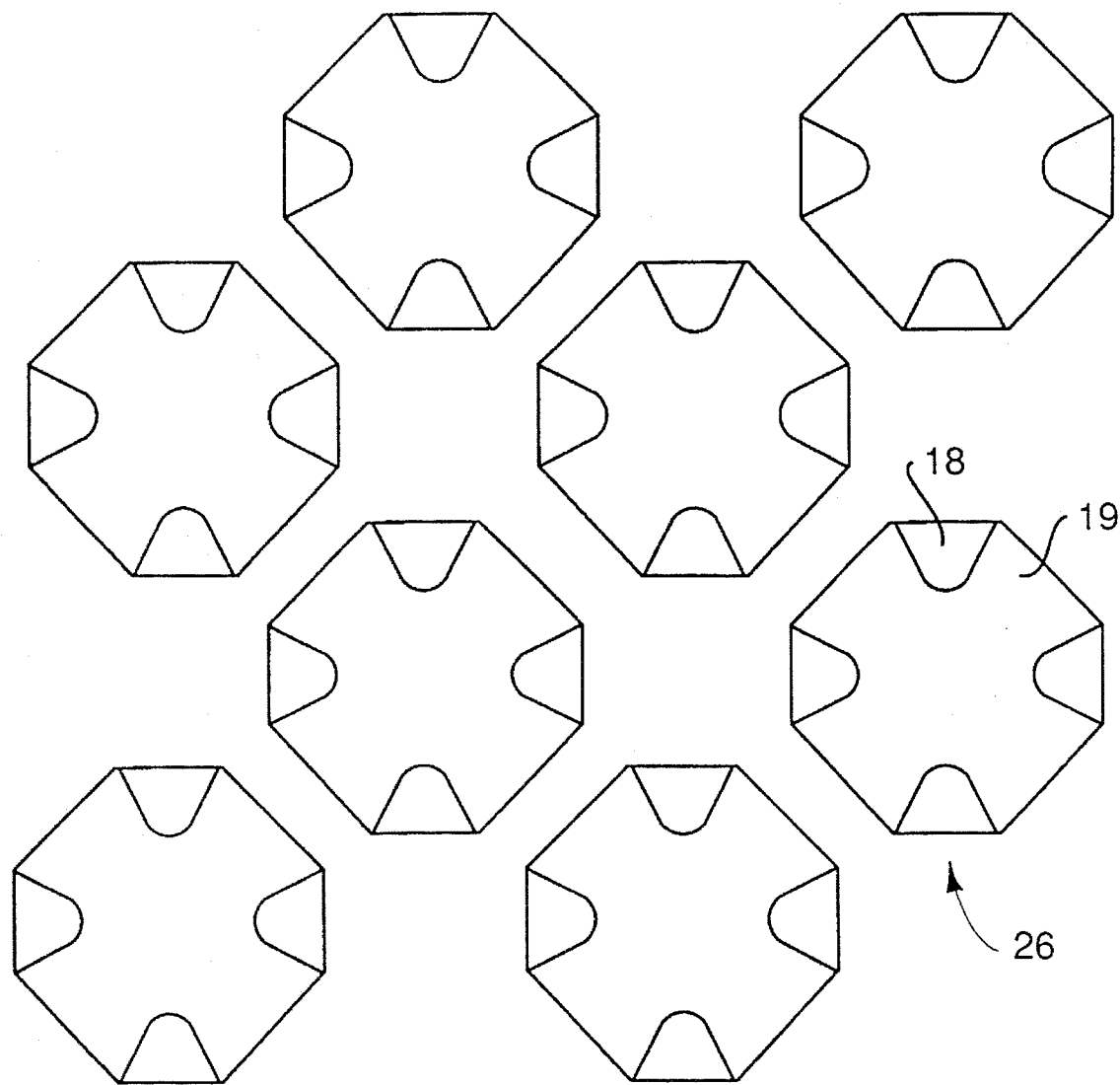
FIG. 36 is a view of a nested arrangement of electrical interconnect components in accordance with the present invention.

FIG. 33 illustrates that the electrical interconnect components 26 of the semiconductor die carrier, like the electrical interconnect components 50 of the socket shown in FIG. 32, may be receiving-type electrical interconnect components. FIG. 34 illustrates that the electrical interconnect components 26 of the nested arrangement of a semiconductor die carrier may be projection-type interconnect components each including twelve contacts or posts 18 and, optionally, a twelve sided buttress 18. FIG. 35 shows an 837-contact per square inch arrangement of electrical interconnect components 26 of a semiconductor die carrier each including two contacts or posts 18 and, optionally, a four-sided buttress 19. FIG. 36 depicts an arrangement of octagonal electrical interconnect components 26 of a semiconductor die carrier each including four contacts 18 and, optionally, an insulative buttress 19.

Figure 37A:
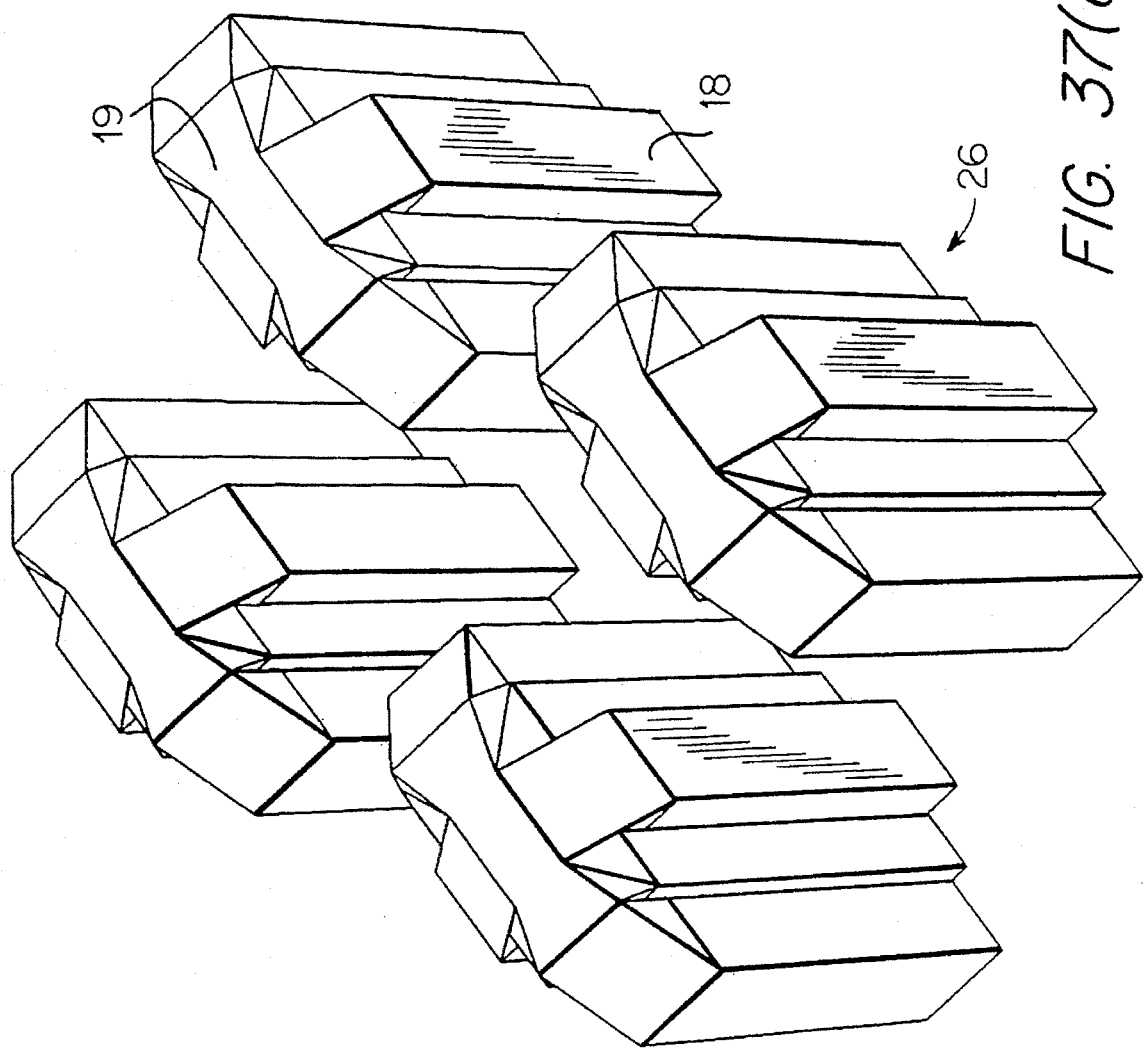
FIG. 37(*a*) is a view of an arrangement of electrical interconnect components in accordance with the present invention.
Figure 37B:
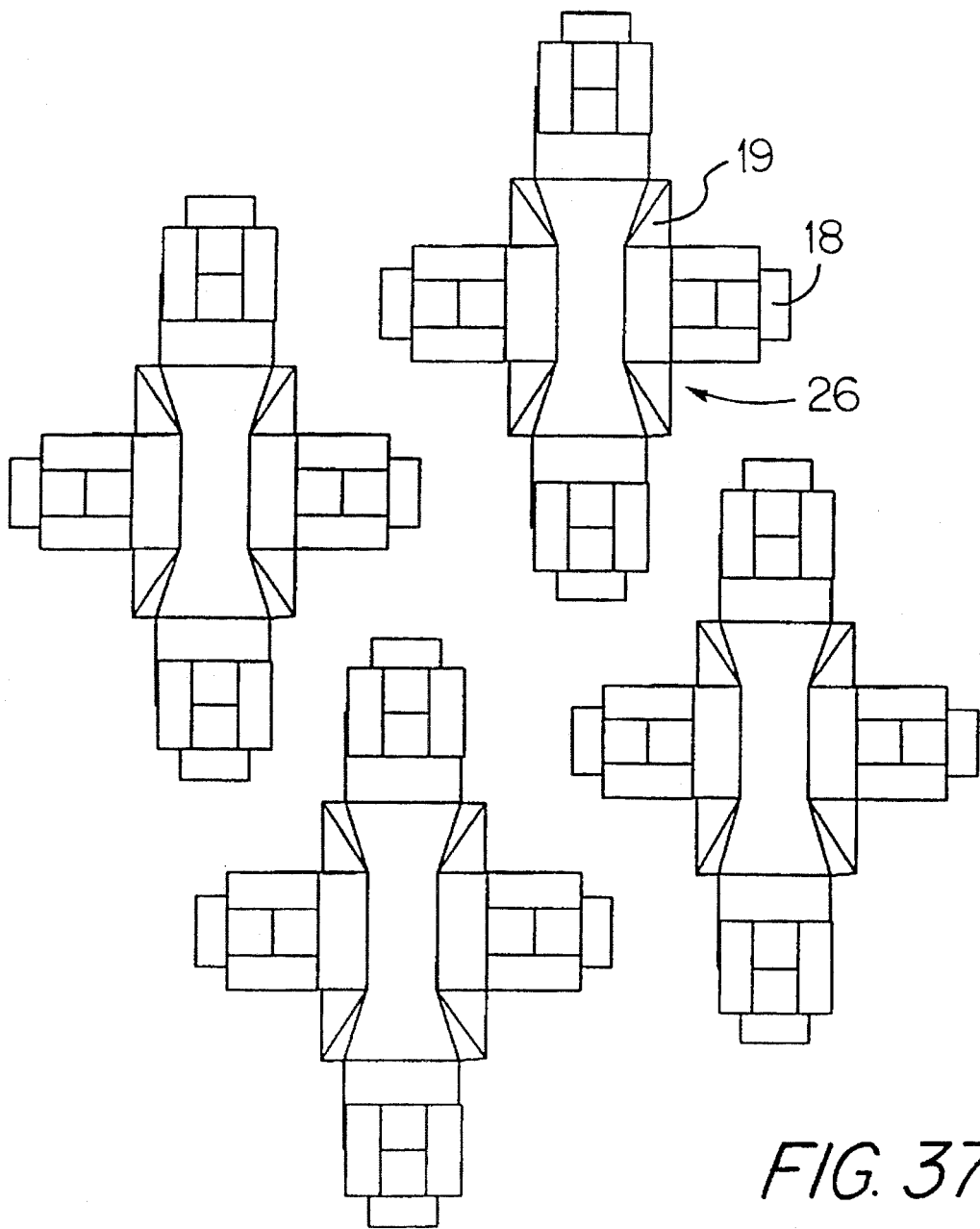
Figure 37D:
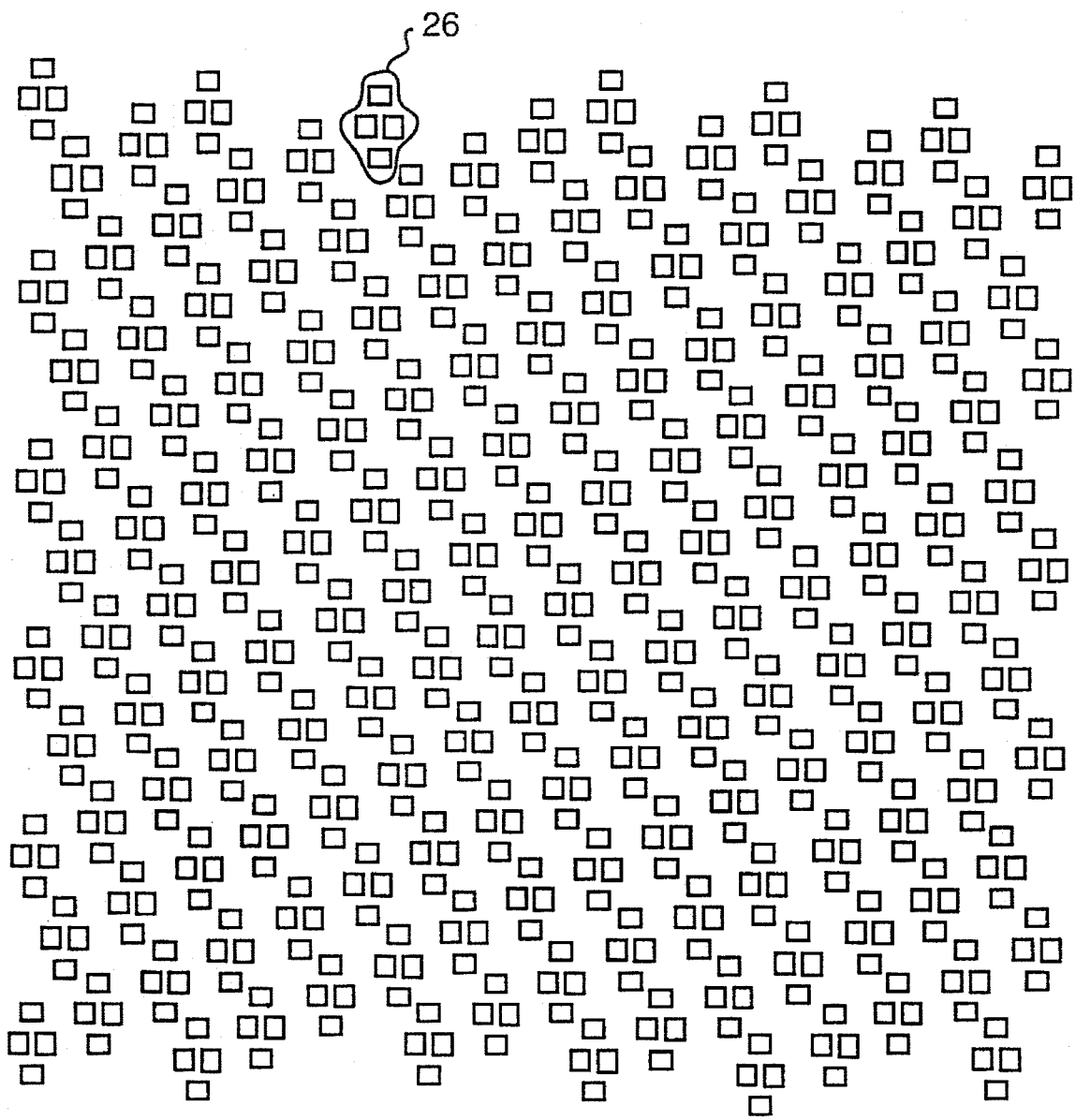

FIG. 37, which incorporates FIGS. 37(a) through 37(d), depicts arrangements for H-version projection-type electrical interconnect components 26 of a semiconductor die carrier. Such interconnect components are referred to herein as H-version interconnect components because, when a buttress is used in connection with such components, the buttress is H-shaped. Dimensions for the arrangements of H-version components are shown in FIGS. 37(c) and 37(d). The arrangement of FIG. 37(c) can provide a density of 716 contacts per square inch. The arrangement of FIG. 37(d), on the other hand, can provide a density of 636 contacts per square inch.

Figure 38:
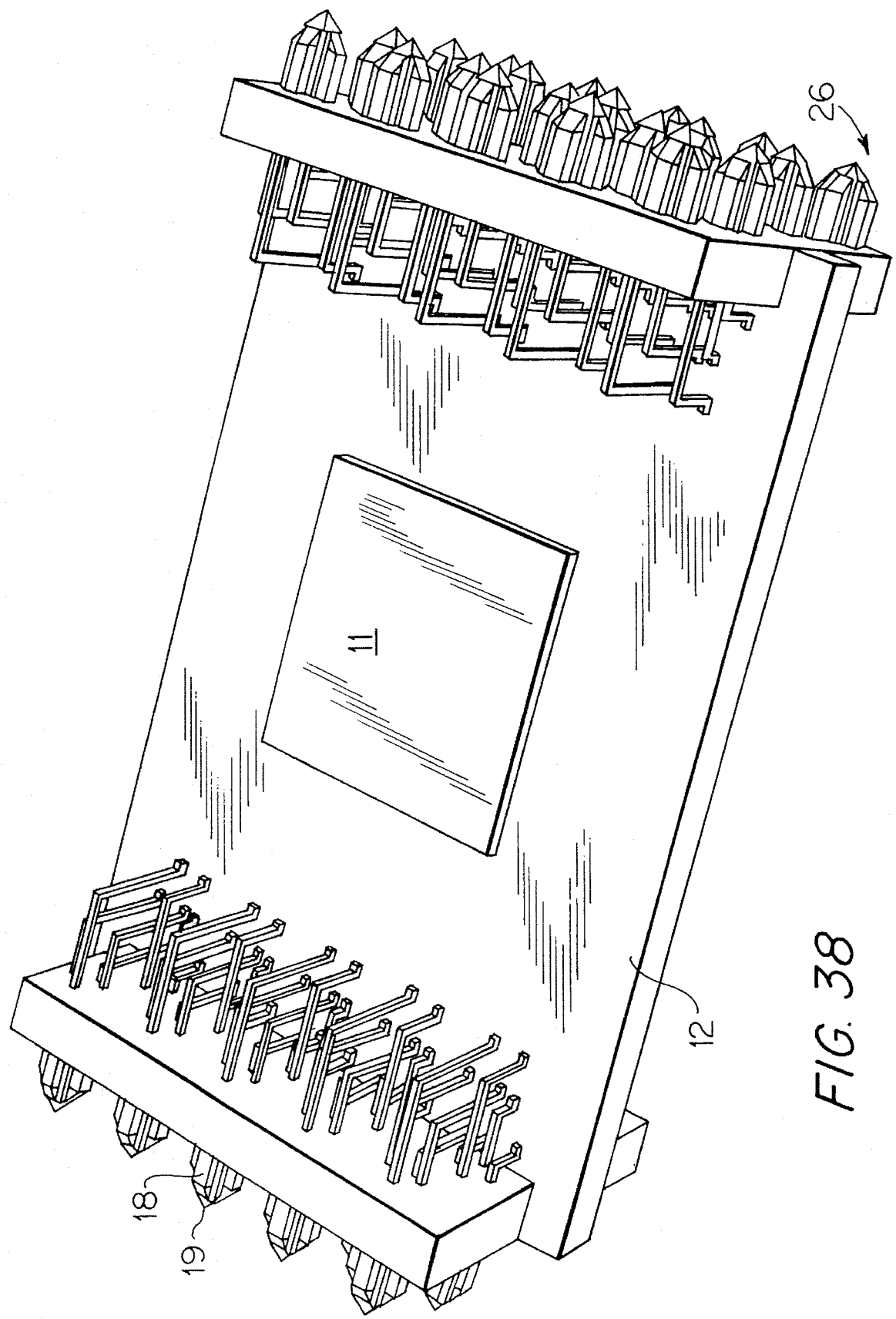
FIG. 38 is a perspective view of another embodiment of a semiconductor die carrier in accordance with the present invention.

A perspective view of another embodiment of a semiconductor die carrier in accordance with the present invention is shown in FIG. 38. In accordance with the embodiment of FIG. 38, the semiconductor die carrier may include a semiconductor die 11; a multi-layer conductive substrate 12, such as a hybrid or high-speed printed wire board, including insulative material having multiple levels of conductive traces formed therein; a plurality of electrical interconnect components 26, each comprising a plurality of electrically conductive contacts 18 and, optionally, if the electrical interconnect components are projection-type interconnect components, as depicted in FIG. 38, an insulative buttress 19; and an encapsulation material or a molding compound (not shown in FIG. 38) for sealing the semiconductor die 11 within the semiconductor die carrier.

For the embodiment of FIG. 38, the semiconductor die 11 may be bonded to the conductive contacts 18 using any of the C4, wire bond, and TAB technologies. In the event C4 technology is used, the semiconductor die 11 may be bonded to the multi-layer conductive substrate 12 via C4 interconnections formed from melted balls of solder (not shown in FIG. 38), thereby providing conductive paths between the semiconductor die and the conductive contacts 18. In the event wire bonding or TAB technology is used, the semiconductor die 11 may be bonded to the multi-layer conductive substrate 12, or bonded directly to the conductive contacts 18, via bonding pads formed on the die and corresponding bonding wires (not shown in FIG. 38), thereby providing conductive paths between the semiconductor die and the conductive contacts.

In the embodiment of FIG. 38, each of the conductive contacts 18 includes a section that extends in a horizontal direction and then turns in a vertical direction toward the multi-layer conductive substrate 12. The conductive contacts 18 are mounted upon or within the multi-layer conductive substrate 12 using the SMT methodology, PTH technology, or the like. The electrical interconnect components 26 can be projection-type interconnect components, such as those shown in FIG. 38, receiving-type interconnect components, hybrid-type interconnect components, or SMT-compatible interconnect components. In other words, in accordance with the embodiment illustrated in FIG. 38, a semiconductor die carrier in accordance with the present invention may be pluggable, as illustrated, or SMT-compatible. The arrangements of FIGS. 20 or 23 can be applied to the laterally-extending electrical interconnect components of the embodiment depicted in FIG. 38.

Figure 39A:
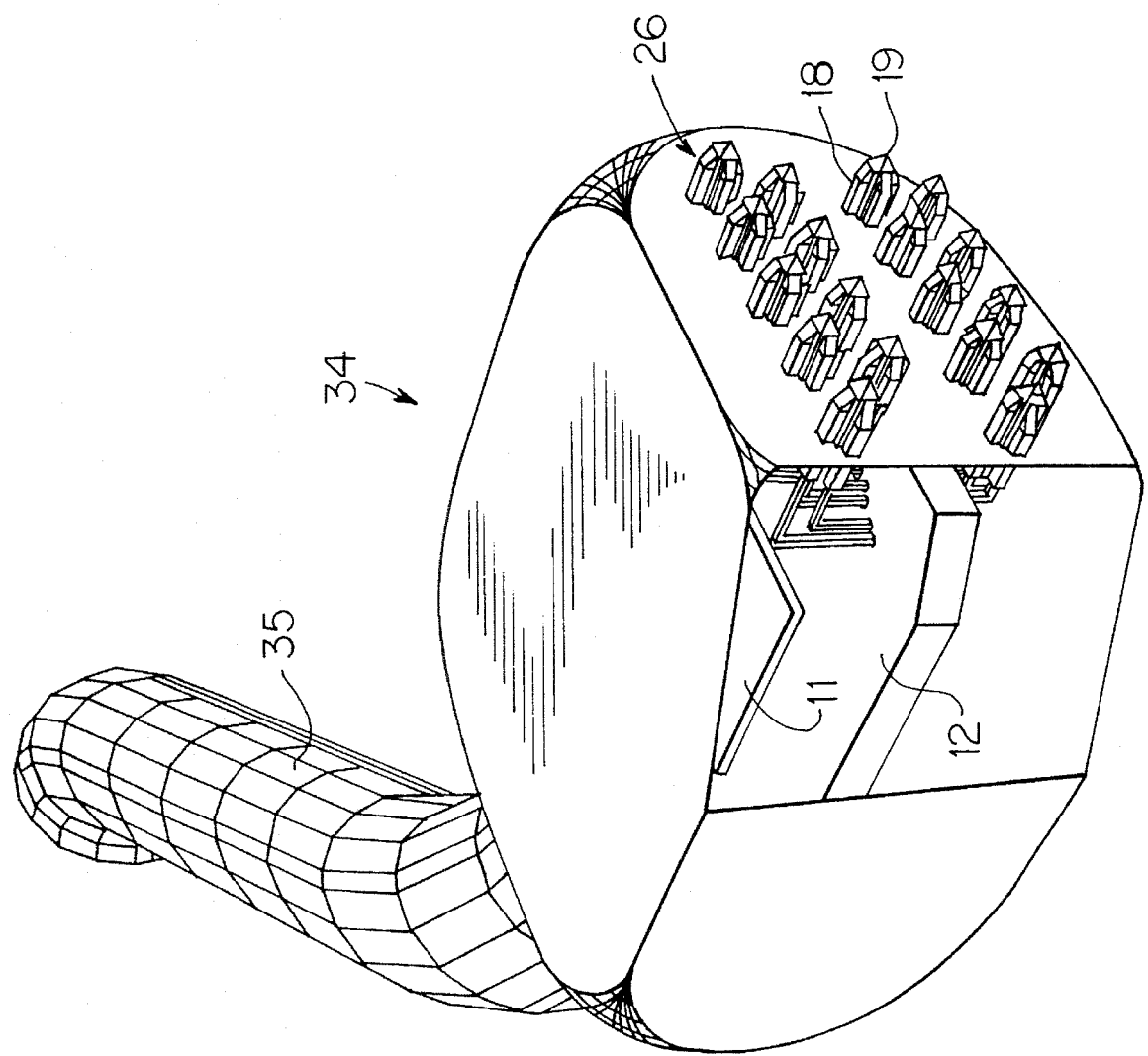
FIG. 39(*a*) is a perspective view of an embodiment of a semiconductor die carrier in accordance with the present invention housed within a cable environment.
Figure 39B:
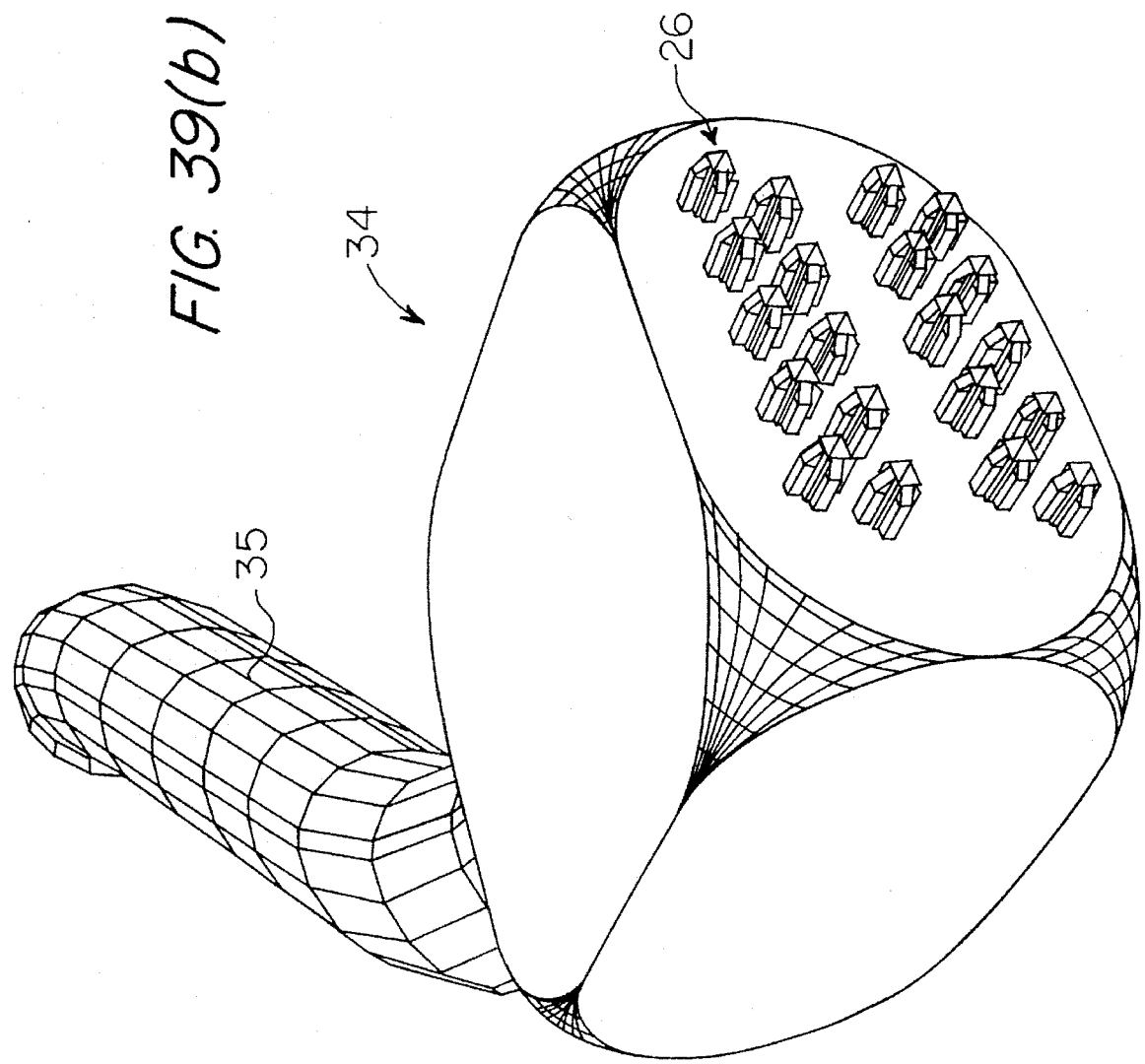

The embodiment of the semiconductor die carrier shown in FIG. 38 is particularly suitable for use within a cable environment, as shown in FIGS. 39(a) and 39(b) (collectively referred to herein as FIG. 39). As seen in FIG. 39, a semiconductor die carrier in accordance with the present invention can be housed within a terminating portion of a cable device 34 to facilitate the performance of interconnections and to reduce the distance between the semiconductor die 11 and the various components with which it communicates. In accordance with the configuration depicted in FIG. 39, the wires 35 of the cable device 34 can be directly bonded to the multi-layer conductive substrate 12 or, alternatively, can be attached to the multi-layer conductive substrate via additional electrical interconnect components 26 in accordance with the illustration presented in FIG. 38.

Figure 40:
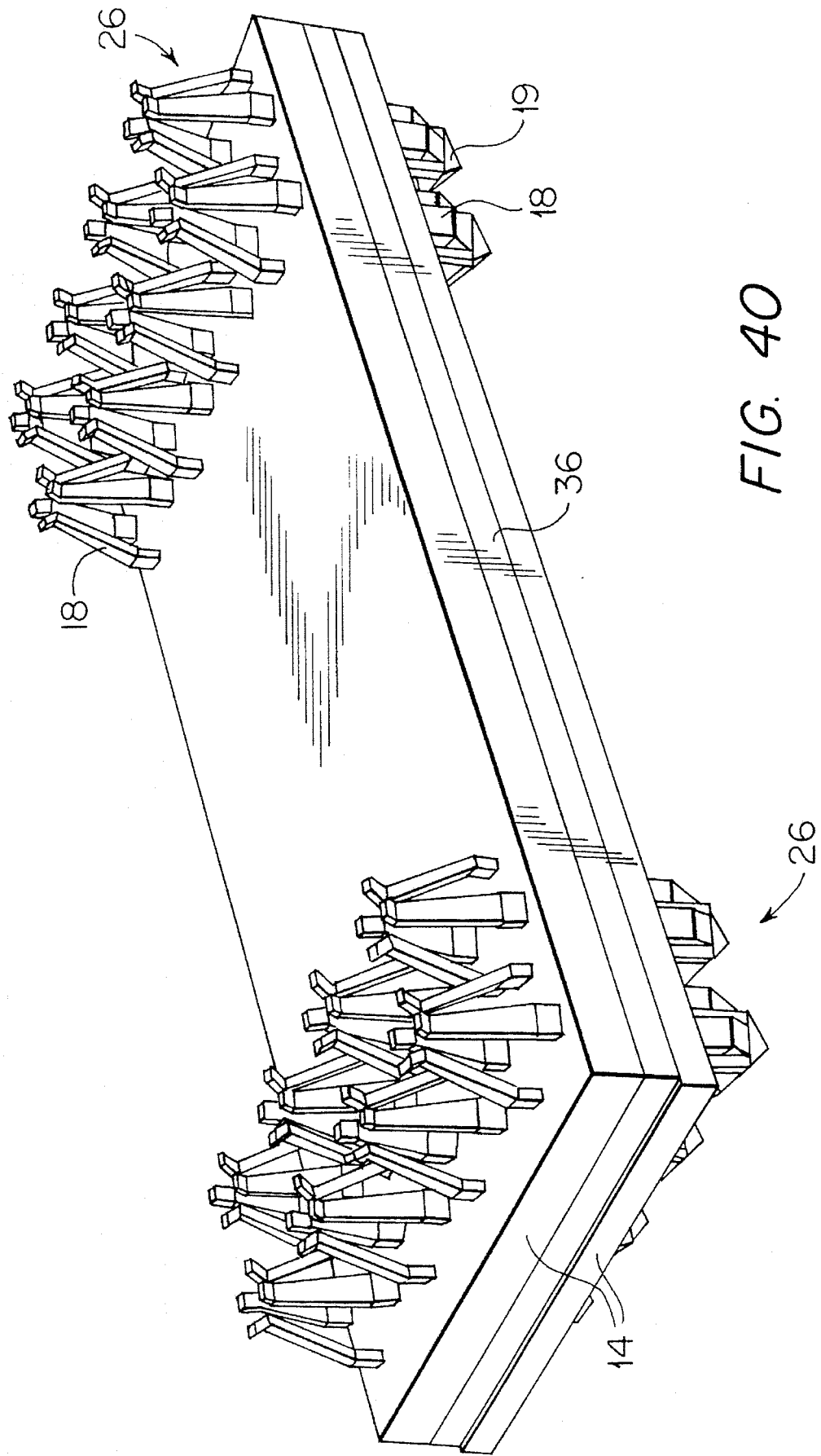
FIG. 40 is a perspective view of another embodiment of a semiconductor die carrier in accordance with the present invention.

FIG. 40 is a view of another embodiment of a semiconductor die carrier in accordance with the present invention. In accordance with the embodiment of FIG. 40, a semiconductor die is mounted between two insulative substrates 14 with the bonding pads of the die being connected to conductive contacts 18 of electrical interconnect components 26 using wire bond, TAB, or like bonding technology. Alternatively, the insulative substrates 14 could each be replaced by a multi-layer conductive substrate, thereby allowing the bonding between semiconductor die and the contacts 18 of the electrical interconnect components 26 to be connected via C4 interconnections. After bonding of the semiconductor die to the conductive contacts 18 of the electrical interconnect components 26, the semiconductor die is sealed within the semiconductor die carrier using an encapsulation material or molding compound 36.

Figure 41:
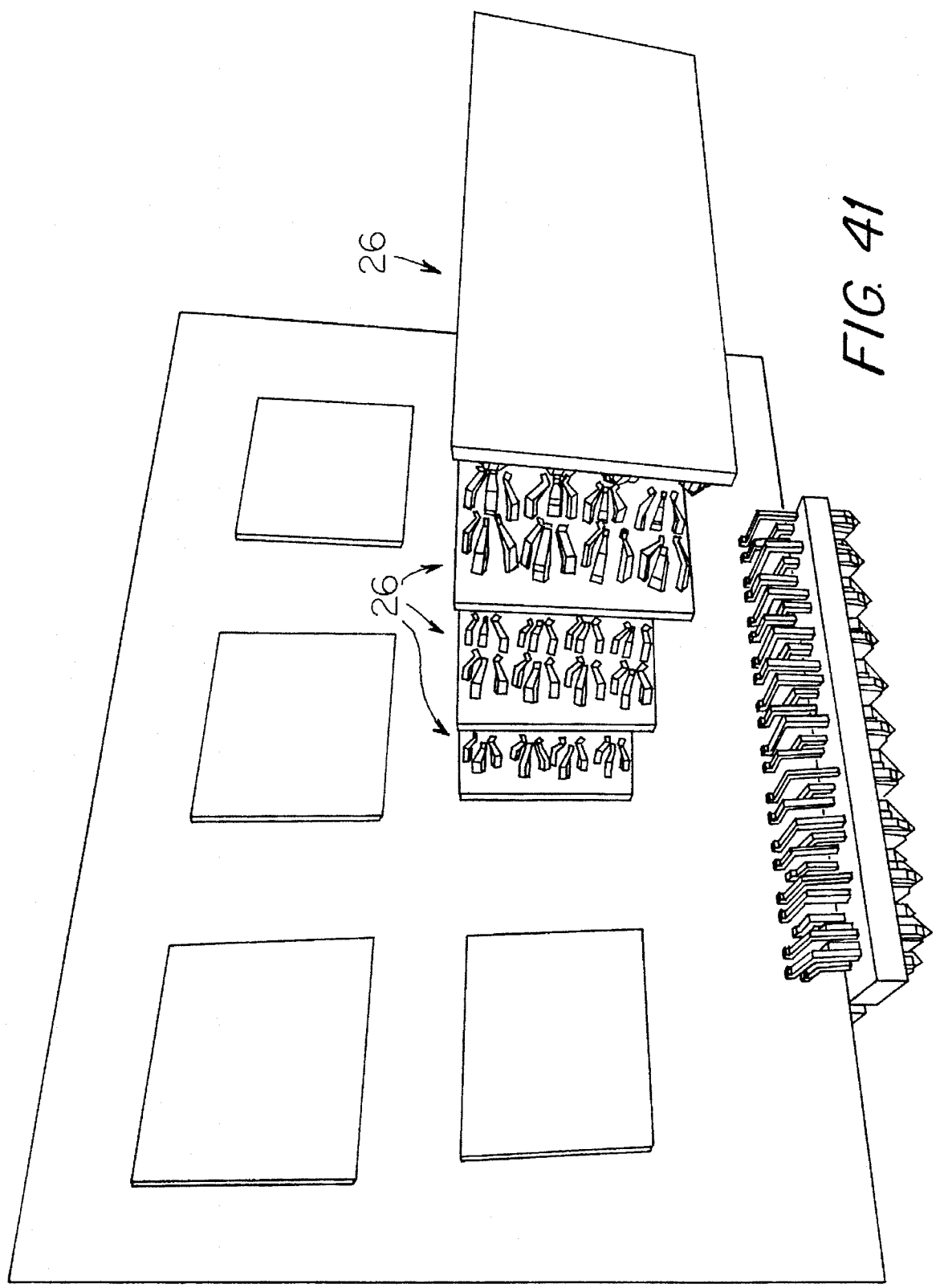
FIG. 41 is a perspective view of a plurality of semiconductor die carriers stacked upon one another in accordance with the present invention.

The formation of electrical interconnect components 26 on both the top and bottom surfaces of the semiconductor die carrier allows a plurality of such carriers to be stacked upon each other, as illustrated in FIG. 41, thereby allowing the provision of a multi-die module having stacked dies. Although the electrical interconnect components 26 of the embodiment in FIG. 40 are depicted as being arranged in accordance with the arrangement of FIG. 23, the nested arrangement of FIG. 20 is also applicable to this embodiment.

Figure 42:
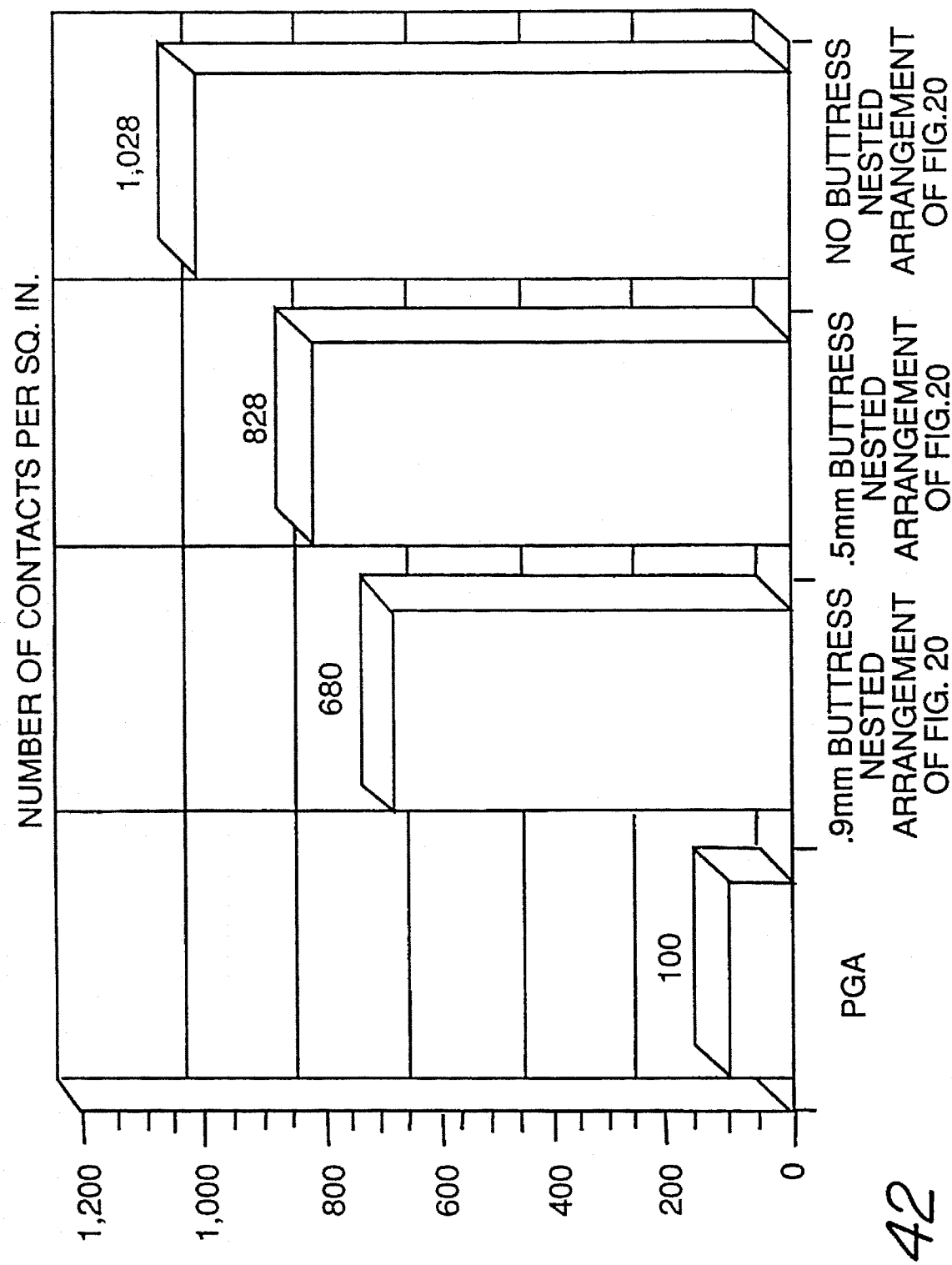
FIG. 42 is a chart comparing a conventional PGA package with semiconductor die carriers in accordance with the present invention.
Figure 43:
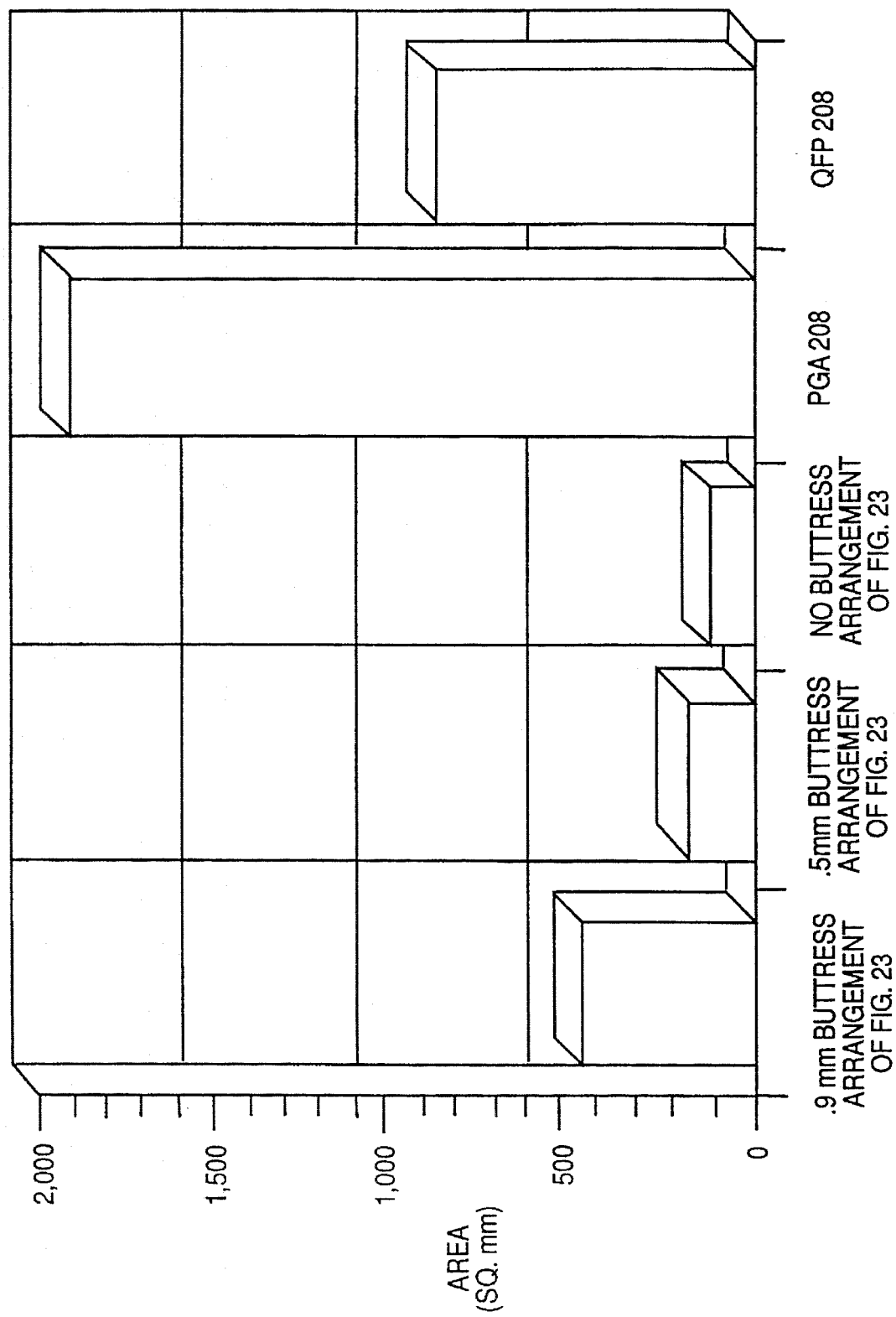
FIG. 43 is a chart comparing conventional PGA and quad-flat-package (QFP) type packages with semiconductor die carriers in accordance with the present invention.

FIGS. 42 and 43 compare conventional semiconductor packages and semiconductor die carriers configured in accordance with the present invention. FIG. 42 illustrates that while conventional PGA-type packages generally provide 100 contacts per square inch, using 0.9 mm×0.9 mm buttresses and 0.5 mm×0.5 mm buttresses, semiconductor die carriers in accordance with the present invention can provide densities of 680, 828, or 1,028 contacts per square inch. Moreover, FIG. 43 illustrates that conventional PGA and QFP packages require far more area than the semiconductor die carriers of the present invention to provide 208 conductive contacts for external interfacing. From the foregoing, it should be understood that the present invention, as compared to conventional semiconductor packages, has a reduced side, affords an external interface having a high-density of electrically conductive contacts concentrated within a very small area, and can provide a package having an increased number of leads.

Additional details relating to the electrical interconnect components for use with the semiconductor die carrier of the present invention will now be discussed. For the sake of clarity, the conductive contacts for projection-type interconnect components will be referred to as "posts," and the conductive contacts for receiving-type interconnect components will be referred to as "beams." Each hybrid-type interconnect component in accordance with the present invention has both posts and beams for its contacts.

The projection-type interconnect components for use with the present invention include several electrically conductive posts attached to an electrically insulative substrate. Each projection-type interconnect component may also include an electrically insulative buttress around which the conductive posts are positioned. The substrate and the buttress insulate the conductive posts from one another so that a different electrical signal may be transmitted on each post.

Figure 44:
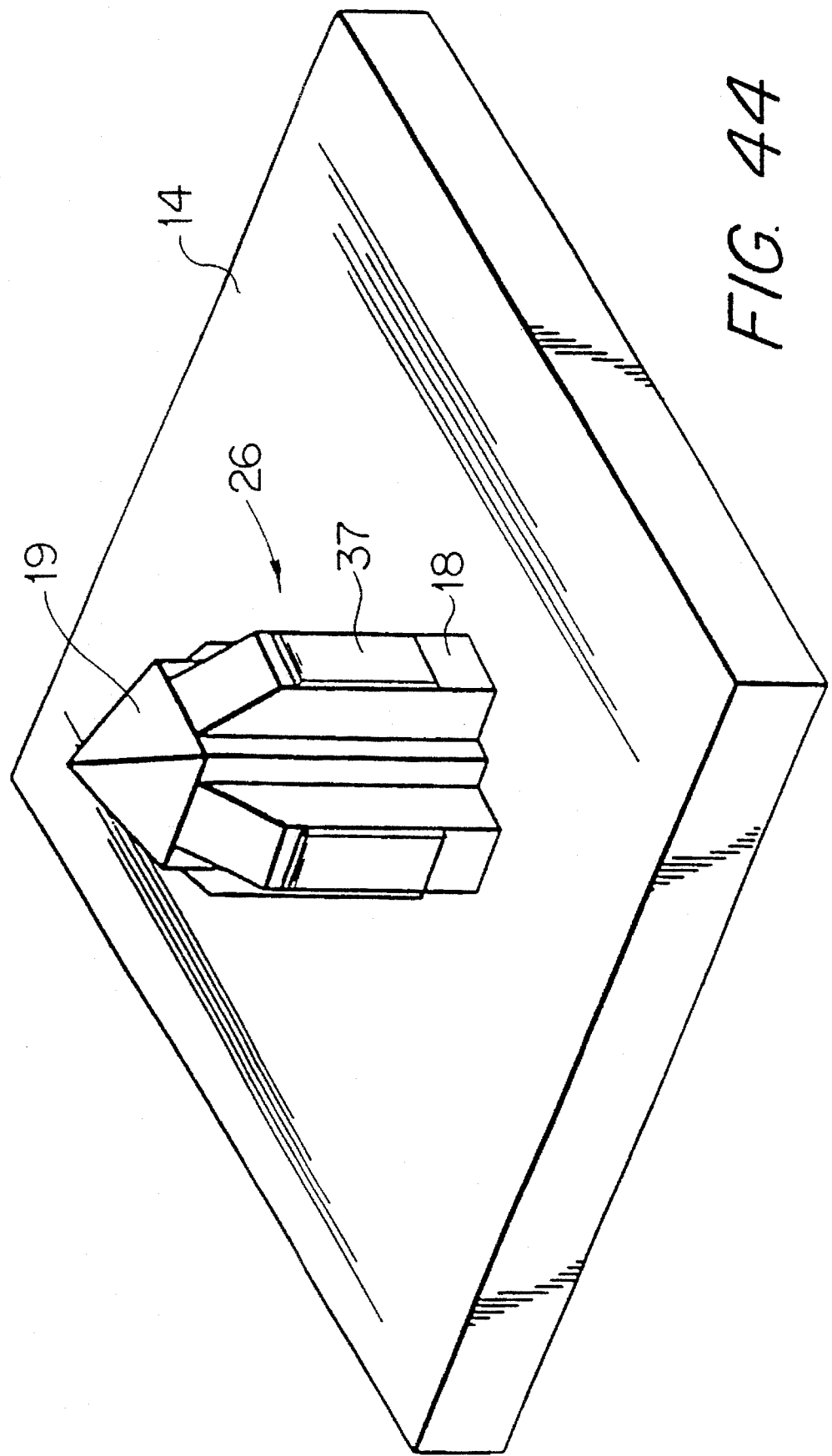
FIG. 44 is a perspective view of a portion of a projection-type interconnect component in accordance with the present invention.

FIG. 44 is a perspective view of a portion of a projection-type interconnect component 26 extending from the insulative substrate 14 of a semiconductor die carrier. The depicted projection-type interconnect component includes conductive posts 18 and a buttress 19. A selected portion of each post 18 is designated with the reference numeral 37 in FIG. 44.

Figure 45:
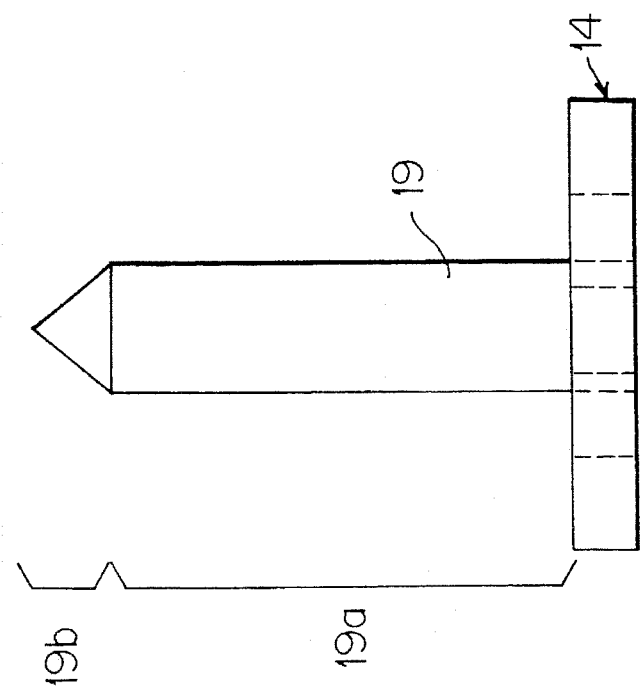
FIG. 45 is a side view of a buttress portion of a projection-type interconnect component in accordance with the present invention.

FIG. 45 is a side view of the buttress 19 and the insulative substrate 14. The buttress 19 and the substrate 14 may be integrally molded from a single unit of insulative material. Preferably, the material of the buttress and the substrate is an insulative material that does not shrink when molded, such as VECTRA (trademark). The conductive posts 18 are inserted into the substrate 14 through holes in the substrate represented by the dotted lines in FIG. 45 or, alternatively, molded within the substrate is an insert molding process.

As seen from FIG. 45, the buttress 19 includes an elongated portion 19a having a rectangular (e.g., square) cross-section, and a tip portion 19b located at the top of the elongated portion. The buttress dimensions shown in FIG. 45 are exemplary and, accordingly, other dimensions for buttress 19 may be used. For example, the cross-section of the buttress 19 may be 0.5 mm×0.5 mm or some other dimension rather than the illustrated dimensions of 0.9 mm×0.9 mm.

Figure 46:
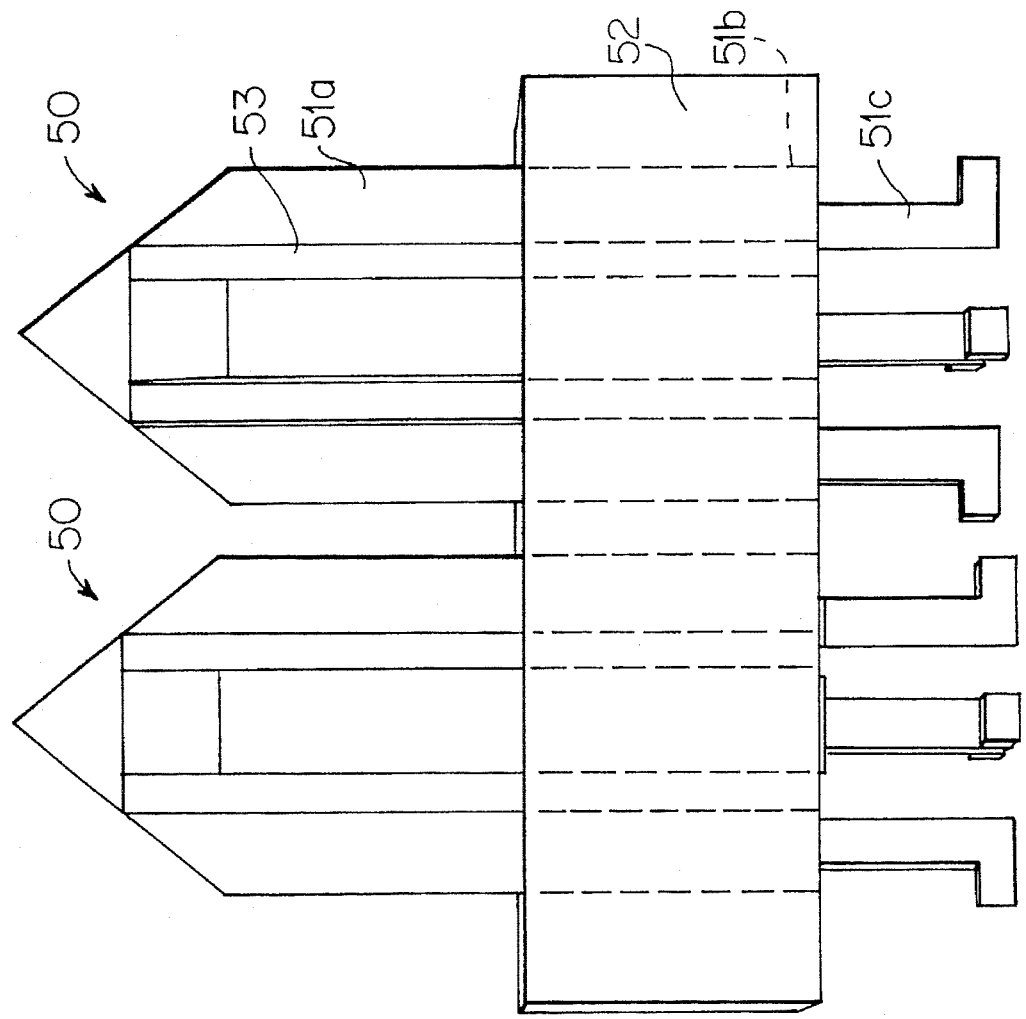
FIG. 46 is a side view of two projection-type interconnect component in accordance with the present invention.

FIG. 46 shows two projection-type interconnect components 50 and an insulative substrate 52, which are components of a socket that may be attached to a PCB or other interface device using the SMT methodology. The depicted projection-type interconnect components are suitable for mating with receiving-type interconnect components from a semiconductor die carrier.

Each conductive post 51 of each socket includes three sections: a contact portion, a stabilizing portion, and a foot portion. On the other hand, each conductive post of the die carrier includes a contact portion, a stabilizing portion, and a bonding portion (if the post is from a projection-type, or hybrid-type interconnect component, for example); or a foot portion, a stabilizing portion, and a bonding portion (if the post is from an SMT-compatible interconnect component, for example). The comments hereinbelow on contact portions, stabilizing portions, and foot portions are applicable to both socket posts and die carriers posts.

In FIG. 46, the contact portion 51a of each conductive post is shown in a position adjacent a buttress 53. The stabilizing portion 51b is the portion of each post that is secured to the substrate. The foot portion 51c extends from the side of the substrate opposite the contact portion. The conductive posts may have a rectangular (e.g., square) cross-section, or a cross-section that is triangular, semicircular, or some other shape. When the projection-type interconnect component 50 of a socket is received within a receiving-type interconnect component 26 (see FIG. 33, for example) from a semiconductor die carrier, electrical signals may be transferred from the foot portion 51c of each conductive post 51 through the stabilizing and contact portions of that post to the receiving-type interconnect component 26, and vice-versa.

Each conductive post in accordance with the present invention may be formed of beryllium copper, phosphor bronze, brass, a copper alloy, tin, gold, palladium, or any other suitable metal or conductive material. In a preferred embodiment, each conductive post is formed of beryllium copper, phosphor bronze, brass, or a copper alloy, and plated with tin, gold, palladium, nickel, or a combination including at least two of tin, gold, palladium, and nickel. The entire surface of each post may be plated, or just a selected portion 37 (see FIG. 44, for example) corresponding to the portion of conductive post that will contact a conductive beam of a corresponding interconnect component after mating has occurred.

Figure 47:
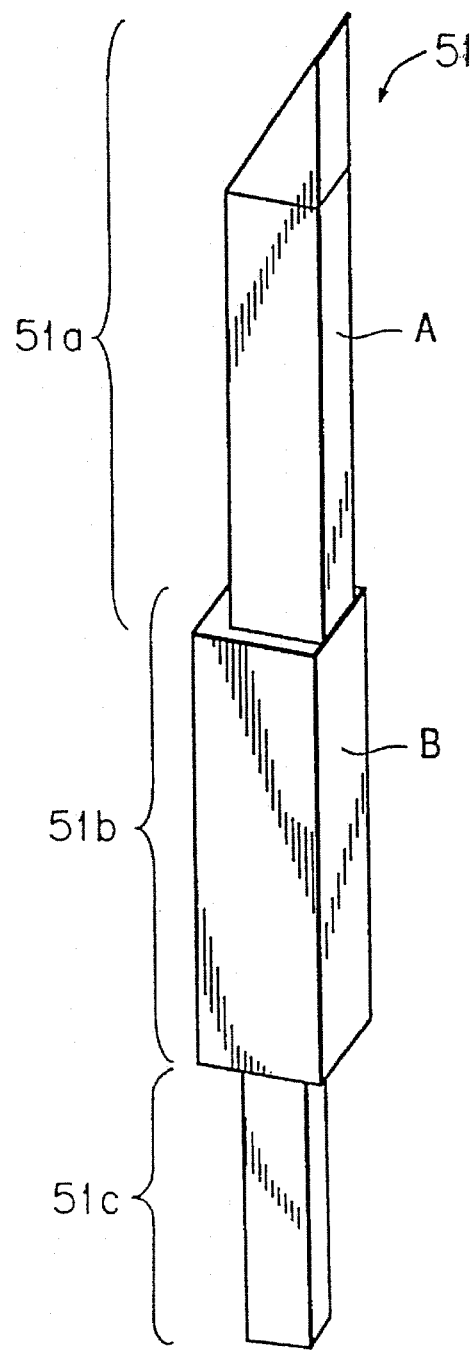
FIG. 47 is a perspective view of a straight conductive post that may be used in accordance with the present invention.

A conductive post 51 that may be used in an electrical interconnect system in accordance with the present invention is shown in FIG. 47. The post 51 of FIG. 47 is a non-offset or straight post, so-called because the respective surfaces A and B of the contact portion 51a and stabilizing portion 51b which face forward the interior of the projection-type interconnect component for that post are in alignment (i.e., surfaces A and B are coplanar). The post 51 of FIG. 47 may be used in an interconnect component having a 0.9 mm×0.9 mm buttress, for example.

Another conductive post that may be used in the electrical interconnect system of the present invention is shown in FIG. 48. The conductive post 51 of FIG. 48 is called an offset post because the surface A of the contact portion 51a which faces toward the interior of the projection-type interconnect component for that post is offset in the direction of the interior as compared to the surface B of the stabilizing portion 51b which faces in the direction of the interior. In the post 51 of FIG. 48, surfaces A and B are not coplanar. The post 51 of FIG. 48 may be used in an interconnect component having a 0.5 mm×0.5 mm buttress, for example.

The offset post of FIG. 48 may be used in situations where the buttress of a projection-type interconnect component is extremely small, or the projection-type interconnect component does not include a buttress, to achieve an ultra high-density. In situations other than these, the straight post of FIG. 47 may be used.

The different portions of each conductive post each perform a different function. The contact portion 51a establishes contact with a conductive beam of the receiving-type interconnect component when the projection-type and receiving-type interconnect components are mated. The stabilizing portion 51b secures the conductive post to the substrate during handling, mating, and manufacturing. The stabilizing portion 51b is of a dimension that locks the post into the substrate while allowing an adequate portion of the insulative substrate to exist between adjacent conductive posts. The foot portion 51c connects to an interface device (e.g., a semiconductor package, a printed wiring board, a wire, or a round, flat, or flex cable) using the electrical interconnect system as an interface. For example, the foot portions of contacts on a semiconductor die carrier can be configured for direct connection to a wire or a round, flat, or flex cable. The contact and foot portions may be aligned or offset with respect to the stabilizing portion to provide advantages that will be discussed below.

The configuration of the foot portion 51c of each conductive post 51 depends on the type of device with which that foot portion is interfacing. For example, the foot portion 51c will have a rounded configuration (FIG. 49) if interfacing with a through-hole of a printed wiring board. The foot portion 51c will be configured as in FIG. 46 if interfacing with a printed wiring board through an SMT process. If interfacing with a round cable or wire, the foot portion 51c may be configured as in FIG. 50. Other configurations may be used depending on the type of device with which the foot portion 51c is interfacing. Such configurations apply to the foot portions of interconnect components on both the semiconductor die carrier and the socket for receiving the semiconductor die carrier.

FIG. 51 shows that each projection-type component 26 of a semiconductor die carrier in accordance with the present invention may include a cross-shaped buttress 19 surrounded by a plurality of conductive posts 18. Although twelve conductive posts are illustrated in FIG. 51, one for each vertical surface of the buttress 19, either more or less than twelve conductive posts may be positioned around the buttress. Except for the arrangement and number of the conductive posts and the shape of the buttress, the projection-type electrical interconnect component of FIG. 51 is essentially identical to each of the ones shown in FIG. 10. Thus, as with the embodiment of FIG. 10, the projection-type interconnect component of FIG. 51 may be used without a buttress 19. A nested arrangement using projection-type interconnect components such as the one shown in FIG. 51 is depicted in FIG. 34.

FIG. 52 shows an H-version embodiment for a projection-type interconnect component 26 from a semiconductor die carrier in accordance with the present invention. In this embodiment, the opposing ones of the posts 18 are closer than the other two opposing ones of the posts. Although four conductive posts are illustrated in FIG. 52, either more or less than four posts may be positioned around the buttress. Except for the arrangement and number of the conductive posts and the shape of the buttress, the projection-type component of FIG. 52 is essentially identical to each of the ones shown in FIG. 10 and, therefore, may be used without a buttress. Interconnect arrangements using projection-type interconnect components such as the one shown in FIG. 52 are depicted in FIG. 37.

FIG. 53 shows another configuration for a projection-type component 26 of a semiconductor die carrier in accordance with the present invention wherein the tip portion of the buttress 19 has two sloped surfaces instead of four sloped surfaces, and each conductive post 18 has the same width as a side of the buttress. Except for the shape of the tip portion and the number and width of the conductive posts 18 surrounding the buttress 19, the projection-type interconnect component is essentially identical to the one shown in FIG. 10. Consequently, although two conductive posts are illustrated in FIG. 53, either more or less than two conductive posts may be positioned around the buttress 19. Further, as with the embodiment of FIG. 10, the projection-type interconnect component of FIG. 53 may be used without a buttress. Also, the width of each conductive post 18 may be greater or lesser than the width of a side of the buttress 19. An arrangement using projection-type interconnect components such as the one shown in FIG. 53 is depicted in FIG. 35. In FIG. 35, each interconnect component has its own buttress 19, although it is contemplated that a plurality of such interconnect components aligned in a row could have a single elongated and continuous buttress passing between the posts 18 of each of the interconnect components.

The leftward portion of FIG. 54 shows a projection-type interconnect component 26 from a semiconductor die carrier in accordance with the embodiment of the present invention illustrated in FIG. 10. The rightward portion of FIG. 55 shows a projection-type interconnect component 26 from a semiconductor die carrier in accordance with still another embodiment of the present invention.

FIG. 54(b) shows a portion of the rightward interconnect component in FIG. 54(a) with the tip portion of the component removed. The interconnect component of FIG. 54(b) has several conductive posts 18 each including a contact portion having a triangular cross-section. The interconnect component of FIG. 54(b) may also include a buttress 19 having a substantially cross-shaped, X-shaped, or H-shaped cross-section, although the buttress may be eliminated if desired. The embodiment of FIG. 54(b) allows close spacing between the posts 18 and may use a buttress 19 having a reduced thickness as compared to buttresses which may be used in connection with other embodiments of the present invention. A nested arrangement using projection-type interconnect components such as the one partially shown in FIG. 54(b) is depicted in FIG. 36.

The projection-type interconnect components shown in the drawings are exemplary of the types of interconnect components that may be used in the electrical interconnect system of the present invention. Other projection-type interconnect components are contemplated.

The receiving-type electrical interconnect components of the present invention each include several electrically conductive beams attached to an insulative substrate. Each receiving-type electrical interconnect component is configured to receive a projection-type electrical interconnect component within a space between the conductive beams. The substrate insulates the conductive beams from one another so that a different electrical signal may be transmitted on each beam.

FIG. 55 illustrates a receiving-type interconnect component 50 from a socket that may be attached to a PCB or other interface surface using the SMT methodology. The depicted receiving-type component is suitable for mating with a projection-type interconnect component from a semiconductor die carrier in accordance with the present invention.

Each receiving-type component in accordance with the present invention comprises several electrically conductive, flexible beams 18 attached to an electrically insulated substrate (not shown in FIG. 55). Preferably, the material of the substrate is an insulative material that does not shrink when molded, such as VECTRA (trademark). Portions of the conductive beams 18 bend away from each other to receive a corresponding projection-type interconnect component within the space between the conductive beams.

Each conductive beam may be formed from the same materials used to make the conductive posts of the projection-type electrical interconnect components. For example, each conductive beam may be formed of beryllium copper, phosphor bronze, brass, or a copper alloy, and plated with tin, gold, palladium, or nickel at a selected portion of the conductive beam which will contact a conductive post of the projection-type interconnect component when the projection-type interconnect component is received within the receiving-type interconnect component.

An example of a conductive beam 51 that may be used in the electrical interconnect system of the present invention is shown in FIG. 56. With reference to FIG. 56, each conductive beam 51 of each socket in accordance with the present invention includes three sections: a contact portion 51a; a stabilizing portion 51b; and a foot portion 51c. On the other hand, each conductive beam of the die carrier includes a contact portion, a stabilizing portion, and a bonding portion (if the contact is from a receiving-type or hybrid-type interconnect component, for example); or a foot portion, a stabilizing portion, and a bonding portion (if the beam is from an SMT-compatible interconnect component, for example). Comments hereinbelow on contact portions, stabilizing portions, and foot portions are applicable to both socket beams and die carrier beams.

As seen from FIG. 56, the contact portion 51a of each conductive beam 51 contacts a conductive post of the projection-type receiving component when the projection-type receiving component is received within the receiving-type interconnect component. The contact portion 51a of each conductive beam includes an interface portion 51d and a lead-in portion 51e. The interface portion 51d is the portion of the conductive portion which contacts a conductive post when the projection-type and receiving-type interconnect components are mated. The lead-in portion 51e comprises a sloped surface which initiates separation of the conductive beams during mating upon coming into contact with the tip portion of the buttress of the projection-type interconnect component (or, when a buttress is not used, upon coming into contact with one or more posts of the projection-type interconnect component).

The stabilizing portion 51b is secured to the substrate that supports the conductive beam. The stabilizing portion 51b of each conductive beam prevents that beam from twisting or being dislodged during handling, mating, and manufacturing. The stabilizing portion 51b is of a dimension that locks the beam into the substrate while allowing an adequate portion of the insulative substrate to exist between adjacent conductive beams.

The foot portion 51c is very similar to the foot portion of the conductive post described above in connection with the projection-type interconnect component. Like the foot portion of a projection-type interconnect component, the foot portion 51c of the receiving-type interconnect component connects to an interface device (e.g., a semiconductor package, a printed wiring board, a wire, or a round, flat, or flex cable) which uses the electrical interconnect system as an interface.

In the same manner as the foot portion for a conductive post, the configuration of the foot portion 51c for a conductive beam depends on the type of device with which it is interfacing. Possible configurations of the foot portion 51c of the conductive beam are the same as the possible configurations discussed above in connection with the foot portion of the conductive post. For example, FIGS. 57 and 58 show the configuration of a foot portion 51c of a beam from a socket used when interfacing with a round cable or wire 54. In particular, FIG. 57 shows a receiving-type component 50 from a socket prior to mating with a projection-type component 26 of a semiconductor die carrier, with the conductive beams 51 attached to an insulative substrate 52, and the foot portion 51c of each beam positioned for interfacing with round wire or cable 54.

FIG. 59 illustrates an alternate configuration for the receiving-type interconnect component 50. Like the configuration of FIG. 55, the receiving-type interconnect component in FIG. 59 includes several electrically conductive, flexible beams. In the configuration of FIG. 59, however, the contact portion 51a for two of the beams is longer than the contact portion 51b for the other two beams.

It should be noted that the configuration of the receiving-type component depends on the configuration of the projection-type interconnect component, or vice versa. For example, if the projection-type interconnect component comprises a cross-shaped buttress surrounded by conductive posts, then the receiving-type component should be configured to receive that type of projection-type interconnect component.

FIG. 60 shows a projection-type interconnect component 26 from a semiconductor die carrier received within the conductive beams of a receiving-type interconnect component 50 from, for example, a socket. When the projection-type interconnect component is received within the receiving-type interconnect component in this fashion, such interconnect components are said to be mated or plugged together. When the projection-type and receiving-type interconnect components are mated, the contact portions 51a of the conductive beams bend or spread apart to receive the projection-type interconnect component within the space between the contact portions of the conductive beams.

The mated position shown in FIG. 60 is achieved by moving the projection-type interconnect component 26 and the receiving-type interconnect component 50 toward one another in the direction of arrow Y shown in FIG. 60. In the mated position, the contact portion of each conductive beam exerts a normal force against a contact portion of a corresponding one of the conductive posts in a direction within plane XZ. In FIG. 60, arrow Y is perpendicular with respect to plane XZ.

FIGS. 44 and 55, respectively, show the state of projection-type interconnect component 26 and a corresponding receiving-type interconnect component 50 prior to mating.

As can be seen from FIG. 55, the contact portions 51a of the beams of the receiving-type interconnect component are clustered together before mating with the projection-type interconnect component. Such clustering may involve contact between two or more of the beams.

To achieve mating, the projection-type and receiving-type interconnect components are moved toward one another in the direction of the arrow Y shown in FIG. 60. Eventually, the lead-in portions 51e (FIG. 56) of each conductive beam 51 contact the tip portion of the buttress 19 (when used). Upon further relative movement of the interconnect components toward one another, the sloped configuration of the tip portion causes the contact portions 51a of the conductive beams to start to spread apart. Further spreading of the contact portions 51a occurs with additional relative movement between the interconnect components due to the sloped upper surfaces of the conductive posts 18 of the projection-type component. Such spreading causes the conductive beams 51 to exert a normal force against the conductive posts 18 in the fully mated position (FIGS. 61 and 62), thereby ensuring reliable electrical contact between the beams and posts. In FIG. 61, solid lines are used to show the condition of the conductive beams in the mated position, while the dotted line shows one of the conductive beams in its condition prior to mating. FIG. 61 depicts exemplary dimensions for electrical interconnect components. Other dimensions may be used. It should be noted that when a buttress is not used, the initial spreading of the contact portions 51a is caused by one or more posts 18 of the projection-type interconnect component rather than a buttress tip portion.

The insertion-force required to mate the projection-type interconnect 26 within the receiving-type interconnect component 50 is highest at the point corresponding to the early phases of spreading of the conductive beams 51c. The subsequent insertion-force is less as it relates to frictional forces rather than spreading forces. The insertion-force required to mate the projection-type and receiving-type interconnect components can be reduced (and programmed mating, wherein one or more interconnections are completed before one or more other interconnections, may be provided) using a projection-type interconnect component having conductive posts which vary in height. An example of such a projection-type interconnect component is shown in FIG. 62.

As seen in FIG. 62, conductive posts 18 can be arranged so that one pair of opposing posts has a first height, and the other pair of opposing posts has a second height. In essence, the configuration of FIG. 62 breaks the peak of the initial insertion-force into separate components occurring at different times so that the required insertion-force is spread out incrementally over time as the mating process is carried out.

FIG. 63 illustrates another way in which the required insertion-force can be spread out over time as mating occurs (and in which programmed mating can be provided). With reference to FIG. 63, different rows of projection-type interconnect components 26 can have different heights so that mating is initiated for different rows of the interconnect components at different times. The rows may can be alternately high and low in height, for example, or the height of the rows can increase progressively with each row. Also, the components within a given row may have different heights. Further, the arrangements of FIGS. 62 and 63 may be combined to achieve an embodiment wherein different rows of interconnect components vary in height, and the conductive posts of each interconnect component within the different rows also vary in height. Also, the conductive beams 51 or the contact portions 51a of each receiving-type interconnect component could vary in length as in FIG. 59 to similarly reduce the insertion-force or provide programmed mating.

The spreading of the conductive beams 51 during mating performs a wiping function to wipe away debris and other contaminants that may be present on the posts, the buttress (if used), and the beams. Such wiping allows for more reliable electrical interconnect and the provision of a greater contact area between mated conductive elements.

The insertion-force can essentially be entirely eliminated using a zero-insertion-force receiving-type interconnect component. FIGS. 64(a), 64(b), and 64(c) (collectively referred to herein as FIG. 64) show a first type of zero-insertion-force component, while FIGS. 65(a), 65(b), and 65(c) (collectively referred to herein as FIG. 65) show a second type of zero-insertion-force component. Zero-insertion-force components and very-low-insertion-force components, the latter being discussed in greater detail below, are especially important because as the number of contacts increases, it is desirable to reduce or eliminate the insertion-force required for mating. Zero-insertion-force and very-low-insertion-force components may be found on the semiconductor die carrier, on a socket for receiving a semiconductor die carrier, or elsewhere as appropriate.

With reference to FIGS. 64(a) and 64(b), a zero-insertion-force interconnect component 50 includes a plurality (e.g., four) of conductive beams 51 supported by an insulative substrate 52a. The interconnect component 50 also includes a movable substrate 52b and a bulbous member 55 fixed to the movable substrate. The movable substrate may be manually operated, or operated by machine. Also, the bulbous member may be replaced by a straight member with no bulb, as shown in FIG. 64(c).

FIG. 64(a) shows the initial state of the interconnect component 50. Prior to mating the interconnect component 50 with a projection-type interconnect component, the movable substrate 52b is moved upward as depicted in FIG. 64(b) causing bulbous member 55 to spread apart the conductive beams 51 to a distance wider than the mating projection-type component. By spreading the conductive beams 51 prior to mating, the insertion-force normally associated with the insertion of the projection-type interconnect component is essentially eliminated. The bulbous member 55 moves back into its original position in response to insertion of the projection-type interconnect component or under the control of a separate mechanical device such as a cam, thereby releasing the beams of the receiving-type interconnect component.

The component 50 in FIG. 64 may be modified so that prior to receiving a projection-type interconnect component, the member 55 does not fully spread the conductive beams 51. In this modification, with the beams 51 spread only part of the way prior to mating, only a very-low-insertion-force is required, while at the same time, the ability of the system to perform wiping is provided. This wiping cleans the contact surfaces to assure good contact.

With reference to FIGS. 65(a) and 65(b), a zero-insertion-force interconnect component 50 includes a plurality (e.g., four) of conductive beams 51 supported by an insulative substrate 52a. Further, the interconnect component 50 includes a movable substrate 52b and a bulbous member 55 fixed to the movable substrate. The movable substrate may be manually operated, or operated by machine. Also, the bulbous member may be replaced by a straight member with no bulb, as shown in FIG. 65(c).

The zero-insertion-force interconnect component of FIG. 65 is essentially the same as the component shown in FIG. 64 except that the movable substrate is located below the fixed substrate and the fixed substrate includes an aperture to allow movement of the bulbous member within that substrate.

FIG. 65(a) shows the initial state of the interconnect component 50. Prior to mating the interconnect component 50 with a projection-type interconnect component, the movable block 52b is moved upward as depicted in FIG. 65(b) causing member 55 to spread apart the conductive beams 51. By spreading the conductive beams 51 prior to mating, the insertion-force normally associated with the insertion of the projection-type interconnect component is essentially eliminated. The bulbous member 55 moves back into its original position in response to insertion of the projection-type interconnect component or under the control of a separate mechanical device such as a cam, thereby releasing the beams of the receiving-type interconnect component.

The electrical interconnect component 50 of FIG. 65 may be modified so that prior to receiving a projection-type interconnect component, the member 55 only partially spreads the conductive beams 51. In this modification, with the beams 51 only spread part of the way prior to mating, only a very-low-insertion-force is required, while at the same time the ability of the system to perform wiping is provided to assure good contact.

FIGS. 66(a) and 66(b) (collectively referred to herein as FIG. 66) show a third type of zero-insertion-force or very-low-insertion-force interconnect system in accordance with the present invention. In the system of FIG. 66, the projection-type interconnect component 26 of the semiconductor die carrier includes several (e.g., three) conductive posts 18 attached to an insulative substrate 14, and the receiving-type component 50 (from a socket, for example) includes several (e.g., three) conductive beams 51 attached to another insulative substrate 52. The leftward post 18 in FIGS. 66(a) and 66(b) is from a projection-type interconnect component other than the projection-type interconnect component associated with the remaining posts shown in FIGS. 66(a) and 66(b). Similarly, the leftward beam 51 in FIGS. 66(a) and 66(b) is from a receiving-type interconnect component other than the receiving-type interconnect component associated with the remaining beams shown in FIGS. 66(a) and 66(b).

FIG. 66(a) shows the interconnect system during the mating process, and FIG. 66(b) shows the interconnect system in the mated condition. Mating through use of the system of FIG. 66 is performed as follows. First, substrate 14 and substrate 52 are moved toward one another in the X plane until the condition shown in FIG. 66(a) is achieved. Next, the substrates 14 and 52 are moved parallel to one another (for example, by a cam or other mechanical device) in the X plane until the contact portions of the posts 18 and the contact portions of the beams 51 contact or mate, as shown in FIG. 66(b). Essentially no insertion-force is required to achieve the condition shown in FIG. 66(b) because the posts 18 and beams 51 do not contact one another until after the condition shown in FIG. 66(b) is achieved.

FIGS. 67(a) and 67(b) illustrate the mating of the cross-shaped projection-type interconnect component of FIG. 51 within a corresponding receiving-type interconnect component 50 embedded in a substrate 52. The receiving-type interconnect component 50 of FIGS. 67(a) and 67(b) includes, for example, twelve conductive beams 51 for mating with the conductive posts of the projection-type interconnect component. FIG. 67(a) shows the interconnect system prior to mating, and FIG. 67(b) shows the interconnect system in the mated condition.

FIGS. 68(a), 68(b), and 68(c) illustrate the mating of at least one projection-type interconnect component configured in accordance with FIG. 53 within a corresponding receiving-type interconnect component 50. Each receiving-type interconnect component 50 of FIGS. 68(a), 68(b), and 68(c) includes two conductive beams 51 for mating with the two conductive posts 18 of the projection-type interconnect component. FIG. 68(a) shows the interconnect system wherein the projection-type interconnect components are arranged in a diamond-shaped or offset configuration. FIG. 68(b) shows the interconnect system wherein the projection-type interconnect components are located side-by-side. FIG. 68(c) shows the interconnect system in a mated position. The lead-in portions of the conductive beams 51 in FIG. 68(c) are at different heights to allow for beam clearance and an arrangement having an even higher density.

The conductive posts of the projection-type interconnect component are attached to an insulative substrate 14 of the semiconductor die carrier, or such posts could be attached to another substrate 52 (from a socket, for example) if the electrical interconnect components for the semiconductor die carrier are receiving-type interconnect components. The conductive beams of the receiving-type component are attached to an insulative substrate 52 (from a socket, for example) for receiving projection-type interconnect components of the semiconductor die carrier, or such beams could be attached to the insulative substrate 14 of the semiconductor carrier if the electrical interconnect components for the semiconductor die carrier are receiving-type interconnect components.

When used for SMT-mounting to a PCB, printed wire board, or other interface surface, for example, the foot portion of each post and/or beam being surface mounted preferably extends beyond the furthest extending portion of the substrate by approximately 0.2 mm, 0.3 mm, or some other dimension. This compensates for inconsistencies on the interface surface, and makes the electrical interconnect system more flexible and compliant.

Heretofore, projection-type electrical interconnect components having a plurality of posts have been discussed. Receiving-type electrical interconnect components having a plurality of conductive beams have also been discussed. FIG. 69(a) shows a pair of hybrid-type electrical interconnect components 70. Each of the hybrid-type electrical interconnect components 70 includes a plurality of conductive posts 71 and a plurality of conductive beams 72 formed or inserted with an insulative substrate 73a or 73b. For the upper hybrid-type electrical interconnect component 70 in FIG. 69(a), the conductive beams 72 are closer to one another than are the conductive posts 71. For the lower hybrid-type electrical interconnect component 70 in FIG. 69(a), the conductive posts 71 are closer to one another than are the conductive beams 72. The hybrid-type electrical interconnect components 70 may include a buttress (not shown in FIG. 69(a)) if desired. The hybrid-type electrical interconnect components 70 may be the electrical interconnect components for a semiconductor die carrier, or for a socket or the like which mates with a semiconductor die carrier.

FIG. 69(b) shows the various portions which make up the conductive posts 71 and the conductive beams 72 used in the hybrid-type electrical interconnect components 70. Foot portions for the conductive posts 71 and conductive beams 72 are not shown in FIGS. 69(a) and 69(b), although foot portions are applicable to the hybrid-type electrical interconnect 70 (for example, when the hybrid-type electrical interconnect component is from a socket which mates with a semiconductor die carrier).

FIGS. 70(a) and 70(b) show a variation on the previously-discussed projection-type electrical interconnect component 26. In FIGS. 70(a) and 70(b), opposing posts 18 are of the same width, but the posts 18 that are next to one another around the periphery of the interconnect component are of different widths. Moreover, the conductive posts 18 have contact portions 18a that are offset toward one another as compared to the stabilizing portions 18b of such posts. As with other projection-type interconnect components, the component shown in FIGS. 70(a) and 70(b) may have an insulative buttress (not shown in these figures), and is configured for receipt within a corresponding receiving-type interconnect component.

The present invention holds a distinct advantage over prior art semiconductor die carriers because, for example, the interconnect components of the present invention can be arranged in a nested configuration far more dense than typical pin grid arrays (PGAs) and the like. Such a configuration is not contemplated by existing prior art semiconductor packages.

The arrangements of FIGS. 20 and 23, for example, allow extremely high-density interconnect arrangements to be achieved. As shown in FIGS. 20 and 23, each group or electrical interconnect component may be formed in the shape of a cross. However, other shapes, such as would result from the various electrical interconnect components discussed above, or other shapes such as those that may be easily nested, are contemplated.

Conductive posts, discussed previously, fit within the holes or passages of the interconnect arrangements shown in FIGS. 20 and 23, and connect to corresponding beams, discussed previously, of corresponding receiving-type interconnect components. Alternatively, the arrangements of FIGS. 20 and 23 could be made up of receiving-type interconnect components configured to receive corresponding projection-type interconnect components, or a hybrid-type or SMT-type components. The separate contact, stabilizing, and foot portions of the conductive contacts operate to maximize the effectiveness of the interconnect arrangement.

For example, as shown in FIG. 71, the contact portion 51a of each conductive beam may be offset away from the projection-type interconnect component for that beam. By offsetting the contact portion in this fashion, a smaller buttress may be used, or the buttress may be eliminated entirely. Accordingly, the density of the electrical interconnect arrangements discussed above may be increased using an offset beam such as shown in FIG. 71.

When an offset type post (e.g., as in FIG. 48) is used, the contact portion of the corresponding conductive beam may also be offset. However, as shown in FIG. 71, the contact portion 51a of each conductive beam is generally offset away from the interior of that interconnect component to decrease the amount of stress exerted on the conductive beam and to minimize space used. Through use of the offset post of FIG. 48 in connection with the offset beam of FIG. 71, higher electrical interconnect densities may be achieved Like the contact portion, the foot portion of a conductive post or conductive beam may be aligned with or offset from its corresponding stabilizing portion. FIG. 72(a) shows a conductive post 51 having a foot portion 51c aligned about the central axis of the stabilizing portion 51b, while FIG. 72(b) shows a conductive post 51 having a foot portion 51c offset from its stabilizing portion 51b. The alignment and offset shown in FIGS. 72(a) and 72(b), respectively, are equally applicable to each conductive beam.

The configuration of FIG. 72(a) is used, for example, when the substrate 52 is arranged perpendicularly with respect to the device with which the foot portion 51c is interfacing. The configuration of FIG. 72(b), on the other hand, may be used when a straight interconnect is being made between a foot portion and the interface device, and there is little room on the interface device for making a connection to the foot. It should be noted that the foot portion of a post may be aligned or offset with its corresponding stabilizing portion to fit within a foot interface pattern normally associated with a beam, or the foot portion of a beam may be aligned or offset with its corresponding stabilizing portion to fit within a foot interface pattern normally associated with a post.

FIG. 73(a) is a partial perspective view of a semiconductor die carrier in accordance with the present invention having electrical interconnect components 17 positioned around the periphery of the semiconductor die area. The bonding portions of the contacts 18 of the interconnect components (that is, the portions of the contacts extending above the insulative substrate 14) are of different heights to facilitate wire bonding. FIG. 73(b), for example, illustrates the manner in which the tiered bonding portions of FIG. 73(a) may be connected to bonding wires 22 which are connected to bonding pads 38 of the semiconductor die 11. To further facilitate wire bonding, an insulating separator 39 may be mounted or formed on the insulative substrate 14, as seen in FIG. 73(c). The insulating separator 39 provides support for the bonding wires 22 and helps to prevent shorting. The insulating separator 39 may be formed of insulative material such as a thin sheet of polyester film or MYLAR (a trademark of E.I. DuPont de Nemours & Co.). The semiconductor die carrier shown in FIGS. 73(a), 73(b), and 73(c) allows multi-wire direct bonding to the contacts 18 and, therefore, use of a multi-layer ceramic component and/or BGA is not required for that structure, although such components may be used in accordance with the present invention.

FIG. 74 is a perspective view illustrating that a plurality (e.g., four) of semiconductor dies 11 may be incorporated within a prefabricated semiconductor die carrier in accordance with the present invention, thus allowing an even more efficient usage of materials and board space. In FIG. 74, a multi-layer ceramic component 12 is connected to the bonding portions of the contacts 18 using a BGA (not shown in FIG. 74), for example, and the plurality of semiconductor dies 11 are electrically connected to the multi-layer ceramic component 12 using bonding wires attached to bonding pads 38 formed on the dies and/or are electrically connected to the multi-layer ceramic component 12 using C4 interconnects coupled to both the bonding portions 18 and conductive lands formed on the bottom surface of one or more of the dies. The multi-layer ceramic component 10 has a plurality of levels of electrically conductive material therein to allow for the transmission of signals between the dies 11 and the contacts 18.

While FIG. 74 shows the incorporation of four semiconductor dies within a single prefabricated semiconductor die carrier, in accordance with the present invention, either more or less dies per semiconductor die carrier are contemplated. As stated previously, the incorporation of a plurality of semiconductor dies within a single die carrier allows more effective usage of materials and board space.

FIG. 75 is a partial perspective view illustrating yet another aspect of the present invention. In FIG. 75, in addition to having leads or contacts 18 extending downward in a vertical direction from the floor of insulative substrate 14, the prefabricated semiconductor carrier of the present invention may also have leads 40 extending sidewise in a horizontal direction from one or more of its side walls. This configuration allows for more leads on a single semiconductor die carrier and provides increased design flexibility and versatility. The top portions of the leads 18 and 40 may have plated (gold-plated, for example) tips 41 to facilitate bonding with the bonding wires 22.

The downwardly-extending leads 18 and sideways-extending leads 40 may be SMT-compatible, as shown in FIG. 75. Further details relating to the sideways-extending leads 40 can be understood from a related U.S. patent application Ser. No. 08/208,586 to Stanford W. Crane, Jr. et al., filed on even date herewith, entitled "PREFABRICATED SEMICONDUCTOR CHIP CARRIER," and expressly incorporated herein by reference. Moreover, the prefabricated semiconductor die carrier of the present invention is suitable for use in connection with multi-layer PCBs and other multi-layer substrates such as those described in a related U.S. patent application Ser. No. 08/208,579 to Stanford W. Crane, Jr. et al., filed on even date herewith, entitled "APPARATUS HAVING INNER LAYERS SUPPORTING SURFACE-MOUNT COMPONENTS," and expressly incorporated herein by reference. Details on the electrical interconnect components of the present invention, and the manner in which such interconnect components may be arranged with respect to one another, can be understood from a related U.S. patent application Ser. No. 08/209,219 to Stanford W. Crane, Jr., filed on even date herewith, entitled "HIGH-DENSITY ELECTRICAL INTERCONNECT SYSTEM," and expressly incorporated herein by reference, and from a related U.S. patent application Ser. No. 07/983,083, to Stanford W. Crane, Jr., filed on Dec. 1, 1992, entitled "HIGH-DENSITY ELECTRICAL INTERCONNECT SYSTEM," and expressly incorporated herein by reference.

FIG. 76 is a side view illustrating still another aspect of the present invention. In FIG. 76, the die 11 may be electrically connected to a BGA including solder balls 13. Such electrical connection may be through conductive lands formed on the lower surface of the die 11, C4 interconnects formed from solder balls 23, for example, and a multi-layer conductive substrate 12 (formed of ceramic, for example) resting in a VECTRA (trademark) base. The die 11 may also be electrically connected to SMT-compatible, sideways-extending leads 40 via bonding pads 38 formed on the upper surface of the die 11 and bonding wires 22. The BGA formed from solder balls 13 and the sideways-extending leads 40, in turn, may be soldered or electrically connected in like fashion to a single or multi-layer substrate such as a PCB to allow the transmission of electrical signals between the die 11 and the substrate. In FIG. 76, electrical signals may be conducted through both the upper and lower surfaces of the die 11 and, consequently, die connectivity is not limited to a single die surface.

FIG. 77 is a side view illustrating yet another aspect of the present invention. The structure depicted in FIG. 77 has a similar configuration to that depicted in FIG. 76, except that electrical signals are conducted out from the lower surface of the die 11 through a path including C4 interconnects formed from solder balls 23 and through electrical interconnect components 17 rather than through a path including C4 interconnects and a BGA. The result is that the semiconductor die carrier of FIG. 77 offers pluggability (for example, the projection-type electrical interconnect components 17 may be plugged into a corresponding set of receiving-type electrical interconnect components and the sideways-extending leads 40 may be plugged into a socket) as well as stacking options. The height of the sideways-extending leads 40 may be such that these leads may be plugged into a socket or, alternatively, SMT-mounted to one or more layers of a substrate such as a PCB.

FIG. 78 is a side view illustrating still another aspect of the present invention. The structure depicted in FIG. 78 has a similar configuration to that depicted in FIG. 77, except that the electrical interconnect components 17 are electrically connected to the die 11 through C4 interconnects including solder balls 23 formed on the upper surface of the die rather than the lower surface of the die. In FIG. 78, the electrical interconnect components 17 extend upwardly rather than downwardly, with the bonding to the die for both the electrical interconnect components and the sideways-extending leads 40 occurring on the same surface (that is, the upper surface) of the die. The semiconductor die carrier of FIG. 78 is particularly well-suited to allow for the direct stacking of semiconductor die carrier packages.

FIG. 79 is a side view illustrating yet another aspect of the present invention. The semiconductor die carrier of FIG. 79 is a flip-chip version wherein the die 11 is mounted to the cap 21 and the bonding to the die for both the electrical interconnect components 17 and the sideways-extending leads 40 occurs on the same surface (that is, the lower surface) of the die. In FIG. 79, the height of the sideways-extending leads 40 may be such that these may be plugged into a socket or, alternatively, SMT-mounted to one or more layers of a substrate such as a PCB.

FIG. 80 is a partial perspective view illustrating still another aspect of the present invention. As seen from FIG. 80, some of the sideways-extending leads 40a may be oriented in an upward direction, while others of the sideways-extending leads 40b may be oriented in a downward direction. The number of rows of upwardly-oriented and downwardly-oriented leads may be the same, as depicted in FIG. 80, or the number of upwardly-oriented leads may be greater than or less than the number of downwardly-oriented leads. The configuration of FIG. 80 allows the mounting of the leads to one or more substrates located above the semiconductor die carrier and also to one or more substrates located below the die carrier and, therefore, is particularly useful for the purpose of creating stacks of PCBs or other such substrates.

Advantages in addition to those discussed above result from the use of a post and/or beam including separate contact, stabilizing, and foot portions, and configurations of such portions other than those discussed above are contemplated. For example, the contact portion of a post or beam may be the same size as the stabilizing portion of that post or beam as in FIG. 49 for ease of manufacturing, or the contact portion may be smaller (i.e., narrower) than the stabilizing portion as in FIG. 47 to increase the density of the interconnect system.

In the situation where the contact portion is made narrower than its corresponding stabilizing portion, the hole or passage in which the post or beam is secured may be configured to have a different width or diameter at different levels. For example, the width or diameter near the portion of the hole through which the contact portion protrudes may be narrower than the width or diameter at the other side of the substrate through which the foot portion protrudes. In this type of configuration, the post or beam is inserted into the hole with the contact portion entering first, and then pushed further into the hole until the shoulder of the stabilizing portion abuts the section of the hole having the narrower width or diameter. By configuring the hole in this manner, over-insertion (i.e., insertion of the post or beam to the extent that the stabilizing portion extends through the hole) as well as push-out due to mating forces, may be prevented.

Like the contact portion, the foot portion of each post or beam may be the same size as the stabilizing portion of that post or beam, or the foot portion may be smaller (i.e., narrower) than the stabilizing portion to interface with high-density interface devices and/or provide circuit design and routing flexibility. In the situation where the foot portion is made narrower than its corresponding stabilizing portion, the hole or passage in which the post or beam is secured may be configured to have a different width or diameter at different levels. For example, the width or diameter near the portion of the hole through which the foot portion protrudes may be narrower than the width or diameter at the other side of the substrate through which the contact portion protrudes. In this type of configuration, the post or beam is inserted into the hole with the foot portion entering first, and then pushed further into the hole until the shoulder of the stabilizing portion abuts the section of the hole having the narrower width or diameter. By configuring the hole in this manner, over-insertion (i.e., insertion of the post or beam to the extent that the stabilizing portion extends through the hole), as well as push-out due to mating forces, may be prevented.

It should be noted that when the contact portion of a post or beam is offset from the stabilizing portion (for example, as shown in FIG. 48), the post or beam must be inserted into the corresponding hole with the foot portion entering first. Similarly, when the foot portion of a post or beam is offset from the stabilizing portion, the post or beam must be inserted into the corresponding hole with the contact portion entering first.

The foot portion of each post or beam may be arranged in many different configurations. For example, the foot portion may have its central axis aligned with the central axis of the stabilizing portion, as in FIG. 72(a). Alternatively, the foot portion may be offset from the stabilizing portion so that a side of the foot portion is coplanar with a side of the stabilizing portion, as shown in FIG. 72(b).

Also, the foot portion of each post or beam may be attached to different portions of the stabilizing portion. For example, the foot portion may be attached to the middle, corner, or side of a stabilizing portion to allow trace routing and circuit design flexibility, and increased interface device density.

All of the comments herein pertaining to the foot portions of a post or beam are equally applicable to the bonding portions of a post or beam, and vice versa. Further variations of the foot and bonding portions of each post or beam are contemplated. Within a given projection-type or receiving-type interconnect component, the foot portions of that component can be configured to face toward or away from one another, or certain foot portions may face toward one another while other ones of the foot portions face away from one another. Likewise, the foot portions of a given interconnect component may be arranged so that each foot portion faces the foot portion to its immediate left, or so that each foot portion faces the foot portion to its immediate right.

Also, a secondary molding operation could be used to bind the foot portions of one or more interconnect components together. In this type of configuration, an insulative yoke or substrate could be formed around the foot portions just above the point at which the foot portions connect to the interface device to hold the foot portions in place, to aid in alignment, and to protect the foot portions during shipping.

Additionally, portions of the foot portions of the posts and/or beams may be selectively covered with insulative material to prevent shorting and to allow closer placement of the foot portions with respect to one another (e.g., the placement of the foot portions up against one another). Although the selective insulation of the foot portions helps to prevent shorting when closer placements are made, such closer placements may be made in the absence of the selective insulation.

As can be seen from the foregoing description, the use of posts and beams which include separate contact, stabilizing, and foot portions (or bonding portions) maximizes the efficiency and effectiveness of the interconnect arrangement of the present invention. Further, the selective structure of the conductive posts and beams allows flexibility in circuit design and signal routing not possible through the use of existing interconnect systems used for semiconductor die packaging.

The conductive posts and the conductive beams of the interconnect components may be stamped from strips or from drawn wire, and are designed to ensure that the contact and interface portions face in the proper direction in accordance with the description of the posts and beams above. Both methods allow for selective plating and automated insertion. The foot portions may protrude from the center of the stabilizing section, thereby allowing one pin die with different tail lengths to supply contacts for all sides and levels of the electrical interconnect system of the present invention. However, for maximum density, the foot portions may be moved away from the center of the stabilizing portion to allow maximum density while avoiding interference between adjacent foot portions.

The stamped contacts can be either loose or on a strip since the asymmetrical shape lends itself to consistent orientation in automated assembly equipment. Strips can either be between stabilizing areas, at the tips, or as a part of a bandolier which retains individual contacts. The different length tails on the right angle versions assist with orientation and vibratory bowl feeding during automated assembly.

The present invention is compatible with both stitching and gang insertion assembly equipment. The insulative connector bodies and packaging have been designed to facilitate automatic and robotic insertion onto PCBs or in termination of wire to connector. As an alternative to forming an insulative substrate and then inserting the contacts into the substrate, the insulative substrate may be formed around the contacts in an insert molding process. The completed parts are compatible with PCB assembly processes.

The semiconductor die carrier of the present invention is prefabricated, such that the carrier is largely constructed prior to the die attach step. This allows testing of the contacts and other components of the carrier before the die attach step, thereby eliminating waste and the performance of unnecessary testing.

The present invention provides a semiconductor die carrier that is higher in density, faster, less costly, and more efficient than existing semiconductor packages. Accordingly, the present invention is capable of keeping pace with the rapid advances that are currently taking place in the semiconductor and computer technologies. It should be noted again that while much of the discussion above was directed to the situation where the interconnect components for the semiconductor die carrier were projection-type interconnect components configured for receipt with corresponding receiving-type interconnect components, the interconnect components for the carrier could be receiving-type interconnect components configured to receive corresponding projection-type interconnect components, hybrid-type interconnect components each for mating with a corresponding hybrid-type interconnect component, or SMT-compatible components for surface-mounting to an interface surface such as a PCB.

It will be apparent to those skilled in the art that various modifications and variations can be made in the disclosed process and product without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A semiconductor die carrier configured to be pluggably connected to a first plurality of electrically conductive contacts secured to a first support element, each of the contacts of the first plurality of contacts having a contact section extending from a surface of the first support element, and the contact sections of the first plurality of contacts being arranged in a first array of groups of multiple contact sections positioned on the surface of the first support element, the semiconductor die carrier comprising:

a second support element;

a second plurality of electrically conductive contacts secured to the second support element, each of the contacts of the second plurality of contacts having a contact section extending from a surface of the second support element, the contact sections of the second plurality of contacts being arranged in a second array of groups of multiple contact sections positioned on the surface of the second support element, and each group of contact sections from the second array being configured to be pluggably connected to a corresponding single one of the groups of contact sections from the first array such that, when each group of contact sections from the second array is pluggably connected to a corresponding one of the groups of contact sections from the first array, each group of contact sections from the second array pluggably receives or is pluggably received within a corresponding one of the groups of contact sections from the first array and each contact section of the second array contacts a corresponding one of the contact sections of the first array;

a semiconductor die; and electrically conductive material providing electrical connection between the semiconductor die and at least one of the electrically conductive contacts of the semiconductor die carrier, the semiconductor die carrier being housed within a cable device.

2. A semiconductor die carrier configured to be pluggably connected to a first plurality of electrically conductive contacts secured to a first support element, each of the contacts of the first plurality of contacts having a contact section extending from a surface of the first support element, and the contact sections of the first plurality of contacts being arranged in a first array of groups of multiple contact sections positioned on the surface of the first support element, the semiconductor die carrier comprising:

a second support element;

a second plurality of electrically conductive contacts secured to the second support element, each of the contacts of the second plurality of contacts having a contact section extending from a surface of the second support element, the contact sections of the second plurality of contacts being arranged in a second array of groups of multiple contact sections positioned on the surface of the second support element, and each group of contact sections from the second array being configured to be pluggably connected to a corresponding single one of the groups of contact sections from the first array such that, when each group of contact sections from the second array is pluggably connected to a corresponding one of the groups of contact sections from the first array, each group of contact sections from the second array pluggably receives or is pluggably received within a corresponding one of the groups of contact sections from the first array and each contact section of the second array contacts a corresponding one of the contact sections of the first array;

a semiconductor die; and electrically conductive material providing electrical connection between the semiconductor die and at least one of the electrically conductive contacts of the semiconductor die carrier, wherein the contact sections of the second array are arranged in a configuration providing a density of at least 600 contacts per square inch on the surface of the second support element.

3. A semiconductor die carrier configured to be pluggably connected to a first plurality of electrically conductive contacts secured to a first support element, each of the contacts of the first plurality of contacts having a contact section extending from a surface of the first support element, and the contact sections of the first plurality of contacts being arranged in a first array of groups of multiple contact sections positioned on the surface of the first support element, the semiconductor die carrier comprising:

a second support element;

a second plurality of electrically conductive contacts secured to the second support element, each of the contacts of the second plurality of contacts having a contact section extending from a surface of the second support element, the contact sections of the second plurality of contacts being arranged in a second array of groups of multiple contact Sections positioned on the surface of the second support element, and each group of contact sections from the second array being configured to be pluggably connected to a corresponding single one of the groups of contact sections from the first array such that, When each group of contact sections from the second array is pluggably connected to a corresponding one of the groups of contact sections from the first array, each group of contact sections from the second array pluggably receives or is pluggably received within a corresponding one of the groups of contact sections from the first array and each contact section of the second array contacts a corresponding one of the contact sections of the first array;

a semiconductor die; and electrically conductive material providing electrical connection between the semiconductor die and at least one of the electrically conductive contacts of the semiconductor die carrier, wherein the contact sections of the second array are arranged in a configuration providing a density of at least 1,000 contacts per square inch on the surface of the second support element.

4. A semiconductor die carrier configured to be pluggably connected to a first plurality of electrically conductive contacts secured to a first support element, each of the contacts of the first plurality of contacts having a contact section extending from a surface of the first support element, and the contact sections of the first plurality of contacts being arranged in a first array of groups of multiple contact sections positioned on the surface of the first support element, the semiconductor die carrier comprising:

a second support element;

a second plurality of electrically conductive contacts secured to the second support element, each of the contacts of the second plurality of contacts having a contact section extending from a surface of the second support element, the contact sections of the second plurality of contacts being arranged in a second array of groups of multiple contact sections positioned on the surface of the second support element, and each group of contact sections from the second array being configured to be pluggably connected to a corresponding single one of the groups of contact sections from the first array such that, when each group of contact sections from the second array is pluggably connected to a corresponding one of the groups of contact sections from the first array, each group of contact sections from the second array pluggably receives or is pluggably received within a corresponding one of the groups of contact sections from the first array and each contact section of the second array contacts a corresponding one of the contact sections of the first array;

a semiconductor die; and electrically conductive material providing electrical connection between the semiconductor die and at least one of the electrically conductive contacts of the semiconductor die carrier, wherein each of the groups of contact sections of the second array forms an electrical interconnect component and wherein each of the electrical interconnect components is a projection-type electrical interconnect component comprising a plurality of contact sections of conductive posts formed around an insulative buttress, each buttress having a 0.5 mm×0.5 mm square cross-section.

5. A semiconductor die carrier configured to be pluggably connected to a first plurality of electrically conductive contacts secured to a first support element, each of the contacts of the first plurality of contacts having a contact section extending from a surface of the first support element, and the contact sections of the first plurality of contacts being arranged in a first array of groups of multiple contact sections positioned on the surface of the first support element, the semiconductor die carrier comprising:

a second support element;

a second plurality of electrically conductive contacts secured to the second support element, each of the contacts of the second plurality of contacts having a contact section extending from a surface of the second support element, the contact sections of the second plurality of contacts being arranged in a second array of groups of multiple contact sections positioned on the surface of the second support element, and each group of contact sections from the second array being configured to be pluggably connected to a corresponding single one of the groups of contact sections from the first array such that, when each group of contact sections from the second array is pluggably connected to a corresponding one of the groups of contact sections from the first array, each group of contact sections from the second array pluggably receives or is pluggably received within a corresponding one of the groups of contact sections from the first array and each contact section of the second array contacts a corresponding one of the contact sections of the first array;

a semiconductor die; and electrically conductive material providing electrical connection between the semiconductor die and at least one of the electrically conductive contacts of the semiconductor die carrier, wherein each of the groups of contact sections of the second array forms an electrical interconnect component and wherein each of the electrical interconnect components is a projection-type electrical interconnect component comprising a plurality of contact sections of conductive posts formed around an insulative buttress, each buttress having a 0.9 mm×0.9 mm square cross-section.

6. A semiconductor die carrier configured to be pluggably connected to a first plurality of electrically conductive contacts secured to a first support element, each of the contacts of the first plurality of contacts having a contact section extending from a surface of the first support element, and the contact sections of the first plurality of contacts being arranged in a first array of groups of multiple contact sections positioned on the surface of the first support element, the semiconductor die carrier comprising:

a second support element;

a second plurality of electrically conductive contacts secured to the second support element, each of the contacts of the second plurality of contacts having a contact section extending from a surface of the second support element, the contact sections of the second plurality of contacts being arranged in a second array of groups of multiple contact sections positioned on the surface of the second support element, and each group of contact sections from the second array being configured to be pluggably connected to a corresponding single one of the groups of contact sections from the first array such that, when each group of contact sections from the second array is pluggably connected to a corresponding one of the groups of contact sections from the first array, each group of contact sections from the second array pluggably receives or is pluggably received within a corresponding one of the groups of contact sections from the first array and each contact section of the second array contacts corresponding one of the contact sections of the first array;

a semiconductor die; and electrically conductive material providing electrical connection between the semiconductor die and at least one of the electrically conductive contacts of the semiconductor die carrier, wherein each of the groups of contact sections of the second array forms an electrical interconnect component and wherein each of the electrical interconnect components is a projection-type electrical interconnect component comprising a plurality of contact sections of conductive posts formed around an insulative buttress, each buttress having a cross-shaped cross-section.

7. A semiconductor die carrier according to claim 6, wherein opposing arms of the cross are equal in length, and adjacent arms of the cross are different in length.

8. A semiconductor die carrier configured to be pluggably connected to a first plurality of electrically conductive contacts secured to a first support element, each of the contacts of the first plurality of contacts having a contact section extending from a surface of the first support element, and the contact sections of the first plurality of contacts being arranged in a first array of groups of multiple contact sections positioned on the surface of the first support element, the semiconductor die carrier comprising:

a second support element;

a second plurality of electrically conductive contacts secured to the second support element, each of the contacts of the second plurality of contacts having a contact section extending from a surface of the second support element, the contact sections of the second plurality of contacts being arranged in a second array of groups of multiple contact sections positioned on the surface of the second support element, and each group of contact sections from the second array being configured to be pluggably connected to a corresponding single one of the groups of contact sections from the first array such that, when each group of contact sections from the second array is pluggably connected to a corresponding one of the groups of contact sections from the first array, each group of contact sections from the second array pluggably receives or is pluggably received within a corresponding one of the groups of contact sections from the first array and each contact section of the second array contacts a corresponding one of the contact sections of the first array;

a semiconductor die; and electrically conductive material providing electrical connection between the semiconductor die and at least one of the electrically conductive contacts of the semiconductor die carrier, wherein each of the groups of contact sections Of the second array forms an electrical interconnect component and wherein each of the electrical interconnect components is a projection-type electrical interconnect component comprising a plurality of contact sections of conductive posts formed around an insulative buttress, each buttress having an H-shaped cross-section.

9. A semiconductor die carrier configured to be pluggably connected to a first plurality of electrically conductive contacts secured to a first support element, each of the contacts of the first plurality of contacts having a contact section extending from a surface of the first support element, and the contact sections of the first plurality of contacts being arranged in a first array of groups of multiple contact sections positioned on the surface of the first support element, the semiconductor die carrier comprising:

a second support element;

a second plurality of electrically conductive contacts secured to the second support element, each of the contacts of the second plurality of contacts having a contact section extending from a surface of the second support element, the contact sections of the second plurality of contacts being arranged in a second array of groups of multiple contact sections positioned on the surface of the second support element, and each group of contact sections from the second array being configured to be pluggably connected to a corresponding single one of the groups of contact sections from the first array such that, when each group of contact sections from the second array is pluggably connected to a corresponding one of the groups of contact sections from the first array, each group of contact sections from the second array pluggably receives or is pluggably received within a corresponding one of the groups of contact sections from the first array and each contact section of the second array contacts a corresponding one of the contact sections of the first array;.

a semiconductor die; and electrically conductive material providing electrical connection between the semiconductor die and at least one of the electrically conductive contacts of the semiconductor die carrier, wherein each of the electrically conductive contacts of the semiconductor die carrier comprises a concave well for holding at least one ball of solder used to form a C4 interconnection.

10. A semiconductor die carrier configured to be pluggably connected to a first plurality of electrically conductive contacts secured to a first support element, each of the contacts of the first plurality of contacts having a contact section extending from a surface of the first support element, and the contact sections of the first plurality of contacts being arranged in a first array of groups of multiple contact sections positioned on the surface of the first support element, the semiconductor die carrier comprising:

a second support element;

a second plurality of electrically conductive contacts secured to the second support element, each of the contacts of the second plurality of contacts having a contact section extending from a surface of the second support element, the contact sections of the second plurality of contacts being arranged in a second array of groups of multiple contact sections positioned on the surface of the second support element, and each group of contact sections from the second array being configured to be pluggably connected to a corresponding single one of the groups of contact sections from the first array such that, when each group of contact sections from the second array is pluggably connected to a corresponding one of the groups of contact section from the first array, each group of contact sections from the second array pluggably receives or is pluggably received within a corresponding one of the groups of contact sections from the first array and each contact section of the second array contacts a corresponding one of the contact sections of the first array;

a semiconductor die; and electrically conductive material providing electrical connection between the semiconductor die and at least one of the electrically conductive contacts of the semiconductor die carrier, each of the electrically conductive contacts of the semiconductor die carrier having a foot portion configured for SMT-mounting to a substrate, wherein each of the foot portions is L-shaped.

11. A semiconductor die carrier configured to be pluggably connected to a first plurality of electrically conductive contacts secured to a first support element, each of the contacts of the first plurality of contacts having a contact section extending from a surface of the first support element, and the contact sections of the first plurality of contacts being arranged in a first array of groups of multiple contact sections positioned on the surface of the first support element, the semiconductor die carrier comprising:

a second support element;

a second plurality of electrically conductive contacts secured to the second support element, each of the contacts of the second plurality of contacts having a contact section extending from a surface of the second support element, the contact sections of the second plurality of contacts being arranged in a second array of groups of multiple contact sections positioned on the surface of the second support element, and each group of contact sections from the second array being configured to be pluggably connected to a corresponding single one of the groups of contact sections from the first array such that, when each group of contact sections from the second array is pluggably connected to a corresponding one of the groups of contact sections from the first array, each group of contact sections from the second array pluggably receives or is pluggably received within a corresponding one of the groups of contact sections from the first array and each contact section of the second array contacts a corresponding one of the contact sections of the first array;

a semiconductor die; and electrically conductive material providing electrical connection between the semiconductor die and at least one of the electrically conductive contacts of the semiconductor die carrier, wherein each of the groups of contact sections of the second array forms an electrical interconnect component and wherein the electrical interconnect components are arranged in clusters of at least four interconnect components, each of the clusters being separated from the other clusters by a distance greater than a distance between the electrical interconnect components within each cluster and wherein routing channels separate the clusters from one another.

12. A semiconductor die carrier configured to be pluggably connected to a first plurality of electrically conductive contacts secured to a first support element, each of the contacts of the first plurality of contacts having a contact section extending from a surface of the first support element, and the contact sections of the first plurality of contacts being arranged in a first array of groups of multiple contact sections positioned on the surface of the first support element, the semiconductor die carrier comprising:

a second support element;

a second plurality of electrically conductive contacts secured to the second support element, each of the contacts of the second plurality of contacts having a contact section extending from a surface of the second support element, the contact sections of the second plurality of contacts being arranged in a second array of groups of multiple contact sections positioned on the surface of the second support element, and each group of contact sections from the second array being configured to be pluggably connected to a corresponding single one of the groups of contact sections from the first array such that, When each group of contact sections from the second array is pluggably connected to a corresponding one of the groups of contact sections from the first array, each group of contact sections from the second array pluggably receives or is pluggably received within a corresponding one of the groups of contact sections from the first array and each contact section of the second array contacts a corresponding one of the contact sections of the first array;

a semiconductor die; and electrically conductive material providing electrical connection between the semiconductor die and at least one of the electrically conductive contacts of the semiconductor die carrier, wherein each of the groups of contact sections of the second array forms an electrical interconnect component and wherein each of the electrical interconnect components is a projection-type electrical interconnect component comprising a plurality of contact sections of conductive posts formed around an insulative buttress, and wherein the insulative buttresses from different ones of the electrical interconnect components have different heights.

13. A semiconductor die carrier comprising:

an insulative substrate;

an array of groups of multiple electrically conductive contacts wherein the groups are arranged in rows and columns on a surface of the insulative substrate, wherein the groups from adjacent rows are staggered as are the groups from adjacent columns, a portion of each group overlaps into at least one of an adjacent row and an adjacent column of the groups of the array, and each of the groups of electrically conductive contacts forms at least a portion of a projection-type electrical interconnect component comprising a plurality of electrically conductive posts positioned around an electrically insulative buttress having a 0.5 mm×0.5 mm square cross-section;

a semiconductor die; and electrically conductive material providing electrical interconnection between the semiconductor die and at least one of the electrically conductive contacts.

14. A semiconductor die carrier comprising:

an insulative substrate;

an array of groups of multiple electrically conductive contacts wherein the groups are arranged in rows and columns on a surface of the insulative substrate, wherein the groups from adjacent rows are staggered as are the groups from adjacent columns, a portion of each group overlaps into at least one of an adjacent row and an adjacent column of the groups of the array, and each of the groups of electrically conductive contacts forms at least a portion of a projection-type electrical interconnect component comprising a plurality of electrically conductive posts positioned around an electrically insulative buttress having a 0.9 mm×0.9 mm square cross-section;

a semiconductor die; and electrically conductive material providing electrical interconnection between the semiconductor die and at least one of the electrically conductive contacts.

15. A semiconductor die carrier comprising:

an insulative substrate;

an array of groups of multiple electrically conductive contacts wherein the groups are arranged in rows and columns on a surface of the insulative substrate, wherein the groups from adjacent rows are staggered as are the groups from adjacent columns, a portion of each group overlaps into at least one of an adjacent row and an adjacent column of the groups of the array, and each of the groups of electrically conductive contacts forms at least a portion of a projection-type electrical interconnect component comprising a plurality of electrically conductive posts positioned around an electrically insulative buttress having a cross-shaped cross-section;

a semiconductor die; and electrically conductive material providing electrical interconnection between the semiconductor die and at least one of the electrically conductive contacts.

16. A semiconductor die carrier according to claim 15, wherein the opposing arms of the cross are equal in length, and adjacent arms of the cross are different in length.

17. A semiconductor die carrier comprising:

an insulative substrate;

an array of groups of multiple electrically conductive contacts wherein the groups are arranged in rows and columns on a surface of the insulative substrate, wherein the groups from adjacent rows are staggered as are the groups from adjacent columns, a portion of each group overlaps into at least one of an adjacent row and an adjacent column of the groups of the array, and each of the groups of electrically conductive contacts forms at least a portion of a projection-type electrical interconnect component comprising a plurality of electrically conductive posts positioned around an electrically insulative buttress having an H-shaped cross-section;

a semiconductor die; and electrically conductive material providing electrical interconnection between the semiconductor die and at least one of the electrically conductive contacts.

18. A semiconductor die carrier comprising:

an insulative substrate;

an array of groups of multiple electrically conductive contacts wherein the groups are arranged in rows and columns on a surface of the insulative substrate, wherein the groups from adjacent rows are staggered as are the groups from adjacent columns, a portion of each group overlaps into at least one of an adjacent row and an adjacent column of the groups of the array, and each of the electrically conductive contacts comprises a concave well for holding at least one ball of solder used to form a C4 interconnection;

a semiconductor die; and electrically conductive material providing electrical interconnection between the semiconductor die and at least one of the electrically conductive contacts.

19. A semiconductor die carrier comprising;

an insulative substrate;

an array of groups of multiple electrically conductive contacts wherein the groups are arranged in rows and columns on a surface of the insulative substrate, wherein the groups from adjacent rows are staggered as are the groups from adjacent columns, a portion of each group overlaps into at least one of an adjacent row and an adjacent column of the groups of the array, and each of the electrically conductive contacts has an L-shaped foot portion configured for SMT-mounting to a substrate;

a semiconductor die; and electrically conductive material providing electrical interconnection between the semiconductor die and at least one of the electrically conductive contacts.

20. A semiconductor die carrier comprising:

an insulative substrate;

an array of groups of multiple electrically conductive contacts wherein the groups are arranged in rows and columns on a surface of the insulative substrate, wherein the groups from adjacent rows are staggered as are the groups from adjacent columns, a portion of each group overlaps into at least one of an adjacent row and an adjacent column of the groups of the array, each of the groups of electrically conductive contacts forms at least a portion of an electrical interconnect component, the electrical interconnect components are arranged in clusters of at least four interconnect components per cluster, each of the clusters is separated from the other clusters by a distance greater than a distance between the electrical interconnect components within each cluster, and routing channels separate the clusters from one another;

a semiconductor die; and electrically conductive material providing electrical interconnection between the semiconductor die and at least one of the electrically conductive contacts.

21. A semiconductor die carrier comprising:

an array of groups of multiple electrically conductive contacts wherein the groups are arranged in rows and columns on a surface of the insulative substrate, wherein the groups from adjacent rows are staggered as are the groups from adjacent columns, a portion of each group overlaps into at least one of an adjacent row and an adjacent column of the groups of the array, each of the groups of electrically conductive contacts forms at least a portion of a projection-type electrical interconnect component comprising a plurality of electrically conductive posts positioned around an electrically insulative buttress, and the electrically insulative buttresses from different ones of the electrical interconnect components have different heights;

a semiconductor die; and electrically conductive material providing electrical interconnection between the semiconductor die and at least one of the electrically conductive contacts.

22. A semiconductor die carrier comprising:

an insulative substrate;

an array of groups of multiple electrically conductive contacts wherein the groups are arranged in rows and columns on a surface of the insulative substrate, wherein the groups from adjacent rows are staggered as are the groups from adjacent columns, a portion of each group overlaps into at least one of an adjacent row and an adjacent column of the groups of the array, and each of the groups of electrically conductive contacts forms at least a portion of at least one of a very-low-insertion force and a zero-insertion-force receiving-type electrical interconnect component comprising a plurality of electrically conductive beams, with each of the electrically conductive beams extending through at least first and second insulative substrates of the semiconductor die carrier;

means for moving the first substrate to spread the beams prior to receipt of a corresponding projection-type electrical interconnect component therein;

a semiconductor die; and electrically conductive material providing electrical interconnection between the semiconductor die and at least one of the electrically conductive contacts.

23. A semiconductor die carrier comprising:

an insulative substrate;

an array of groups of multiple electrically conductive contacts wherein the groups are arranged in rows and columns on a surface of the insulative substrate, wherein the groups from adjacent rows are staggered as are the groups from adjacent columns, a portion of each group overlaps into at least one of an adjacent row and an adjacent column of the groups of the array, and each of the groups of electrically conductive contacts forms at least a portion of at least one of a very-low-insertion force and a zero-insertion-force receiving-type electrical interconnect component comprising a plurality of electrically conductive beams, with each of the electrically conductive beams extending through at least first and second insulative substrates of the semiconductor die carrier;

means for moving the second insulative substrate to spread the beams prior to receipt of a corresponding projection-type electrical interconnect component therein;

a semiconductor die; and electrically conductive material providing electrical interconnection between the semiconductor die and at least one of the electrically conductive contacts.

24. A semiconductor die carrier comprising:

a top surface;

a bottom surface;

a plurality of side surfaces coupling the top surface and the bottom surface;

a first plurality of electrically conductive contacts secured to at least one of the top surface and the bottom surface, each of the contacts of the first plurality of contacts having a contact section extending from at least one of the top surface and the bottom surface; and a second plurality of electrically conductive contacts secured to at least one of the side surfaces, each of the contacts of the second plurality of contacts having a contact section extending from the at least one side surface.

25. A semiconductor die carrier configured to be pluggably connected to a first plurality of electrically conductive contacts secured to a first support element, each of the contacts of the first plurality of contacts having a contact section extending from a surface of the first support element, and the contact sections of the first plurality of contacts being arranged in a first array of groups of multiple contact sections positioned on the surface of the first support element, the semiconductor die carrier comprising:

a second support element;

a second plurality of electrically conductive contacts secured to the second support element, each of the contacts of the second plurality of contacts having a contact section extending from a surface of the second support element, the contact sections of the second plurality of contacts being arranged in a second array of groups of multiple contact sections positioned on the surface of the second support element, and each group of contact sections from the second array being configured to be pluggably connected to a corresponding single one of the groups of contact sections from the first array such that, when each group of contact sections from the second array is pluggably connected to a corresponding one of the groups of contact sections from the first array, each group of contact sections from the second array pluggably receives or is pluggably received within a corresponding one of the groups of contact sections from the first array and each contact section of the second array contacts a corresponding one of the contact sections of the first array;

a semiconductor die; and electrically conductive material providing electrical connection between the semiconductor die and at least one of the electrically conductive contacts of the semiconductor die carrier, wherein each of their groups of contact sections of the second array forms of an electrical interconnect component, and each electrical interconnect component is a very-low-insertion force or zero-insertion-force receiving-type electrical interconnect component, and wherein each very-low-insertion-force or zero-insertion-force electrical interconnect component comprises a plurality of contact sections of conductive beams with each of the beams extending through at least first and second insulative substrates and further comprising means for moving the first substrate to spread the contact sections of the beams prior to receipt of a corresponding projection-type electrical interconnect component therein.

26. A semiconductor die carrier configured to be pluggably connected to a first plurality of electrically conductive contacts secured to a first support element, each of the contacts of the first plurality of contacts having a contact section extending from a surface of the first support element, and the contact sections of the first plurality of contacts being arranged in a first array of groups of multiple contact sections positioned on the surface of the first support element, the semiconductor die carrier comprising:

a second support element;

a second plurality of electrically conductive contacts secured to the second support element, each of the contacts of the second plurality of contacts having a contact section extending from a surface of the second support element, the contact sections of the second plurality of contacts being arranged in a second array of groups of multiple contact sections positioned on the surface of the second support element, and each group of contact sections from the second array being configured to be pluggably connected to a corresponding single one of the groups of contact sections from the first array such that, when each group of contact sections from the second array is pluggably connected to a corresponding one of the groups of contact sections from the first array, each group of contact sections from the second array pluggably receives or is pluggably received within a corresponding one of the groups of contact sections from the first array and each contact section of the second array contacts a corresponding one of the contact sections of the first array;

a semiconductor die; and electrically conductive material providing electrical connection between the semiconductor die and at least one of the electrically conductive contacts of the semiconductor die carrier, wherein each of the groups of contact sections of the second array forms of an electrical interconnect component, and each electrical interconnect component is a very-low-insertion-force or zero-insertion-force receiving-type electrical interconnect component, and wherein each very-low-insertion-force or zero-insertion-force electrical interconnect component comprises a plurality of contact sections of conductive beams with each of the beams extending through at least first and second insulative substrates, and further comprising means for moving the second insulative substrate to spread the contact sections of the beams prior to receipt of a corresponding projection-type electrical interconnect component therein.

\* \* \* \* \*

UNITED STATES PATENT AND TRADEMARK OFFICE
CERTIFICATE OF CORRECTION

PATENT NO. : 5,541,449
DATED : July 30, 1996
INVENTOR(S) : Stanford W. Crane, Jr.
Maria M. Portuondo It is certified that error appears in the above-indentified patent and that said Letters Patent is hereby corrected as shown below:

Column 40
Claim 3: line 46; change "Sections" to --sections--; and
line 51; change "When" to --when--.

Column 43
Claim 8: line 35; change "Of" (third occurrence) to --of--.

Column 45
Claim 12: line 51; change "When" to --when--.

Column 45
Claim 25: line 63; change "their" to --the--.

Signed and Sealed this

Fifteenth Day of April, 1997

Attest:

BRUCE LEHMAN

Attesting Officer          Commissioner of Patents and Trademarks